(12) United States Patent
Momo et al.

(10) Patent No.: US 9,840,151 B2
(45) Date of Patent: Dec. 12, 2017

(54) POWER STORAGE DEVICE AND CHARGING METHOD THEREOF

(71) Applicant: SEMICONDUCTOR ENERGY LABORATORY CO., LTD., Atsugi-shi, Kanagawa-ken (JP)

(72) Inventors: Junpei Momo, Kanagawa (JP); Hiroyuki Miyake, Kanagawa (JP); Kei Takahashi, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 15/387,077

(22) Filed: Dec. 21, 2016

(65) Prior Publication Data

US 2017/0101021 A1    Apr. 13, 2017

Related U.S. Application Data

(62) Division of application No. 14/136,503, filed on Dec. 20, 2013, now Pat. No. 9,543,773.

(30) Foreign Application Priority Data

Dec. 28, 2012    (JP) ................. 2012-288565

(51) Int. Cl.
   *H02J 7/00*   (2006.01)
   *H02J 7/14*   (2006.01)
   (Continued)

(52) U.S. Cl.
   CPC ......... *B60L 11/1816* (2013.01); *B60L 11/182* (2013.01); *G01R 31/3606* (2013.01); *H02J 7/0052* (2013.01); *H02J 7/0068* (2013.01)

(58) Field of Classification Search
   USPC ....... 320/160, 134, 116, 103, 107, 128, 132, 320/137, 148, 112, 122, 138, 139, 147,
   (Continued)

(56) References Cited

U.S. PATENT DOCUMENTS

| | | | |
|---|---|---|---|
| 5,952,815 A | * | 9/1999 | Rouillard ............. H02J 7/0016 320/116 |
| 7,710,073 B2 | | 5/2010 | Yamauchi et al. |

(Continued)

FOREIGN PATENT DOCUMENTS

| | | |
|---|---|---|
| EP | 1786057 A | 5/2007 |
| EP | 2259376 A | 12/2010 |

(Continued)

OTHER PUBLICATIONS

Ogumi.Z et al., "6.1.6 Influence of Electrolytic Solution and Surface Film Formation", Lithium secondary battery, Mar. 20, 2008, pp. 116-124, OHMSHA.

*Primary Examiner* — Alexis Pacheco
(74) *Attorney, Agent, or Firm* — Nixon Peabody LLP; Jeffrey L. Costellia

(57) ABSTRACT

An object is to inhibit a decrease in the capacity of a power storage device or to compensate the capacity, by adjusting or rectifying an imbalance between a positive electrode and a negative electrode, which is caused by decomposition of an electrolyte solution at the negative electrode. Provided is a charging method of a power storage device including a positive electrode using an active material that exhibits two-phase reaction, a negative electrode, and an electrolyte solution. The method includes the steps of, after constant current charging, performing constant voltage charging with a voltage that does not cause decomposition of the electrolyte solution until a charging current becomes lower than or equal to a lower current value limit; and after the constant voltage charging, performing additional charging with a (Continued)

voltage that causes decomposition of the electrolyte solution until a resistance of the power storage device reaches a predetermined resistance.

9 Claims, 24 Drawing Sheets

(51) Int. Cl.
  *B60L 11/18* (2006.01)
  *G01R 31/36* (2006.01)
(58) Field of Classification Search
  USPC .............................. 320/155; 429/90, 160, 16
  See application file for complete search history.

(56) References Cited

U.S. PATENT DOCUMENTS

| | | | |
|---|---|---|---|
| 7,876,071 B2 | 1/2011 | Chen et al. | |
| 8,299,757 B2 | 10/2012 | Yamauchi et al. | |
| 8,742,725 B2 | 6/2014 | Tsujiko et al. | |
| 9,397,374 B2 | 7/2016 | Yamauchi et al. | |
| 2002/0001745 A1 | 1/2002 | Gartstein et al. | |
| 2003/0006735 A1 | 1/2003 | Kawakami et al. | |
| 2003/0044689 A1* | 3/2003 | Miyazaki | H02J 7/0026 429/320 |
| 2008/0203974 A1* | 8/2008 | Manai | H02J 7/0073 320/160 |
| 2008/0224667 A1 | 9/2008 | Tanaka et al. | |
| 2010/0066379 A1* | 3/2010 | Iida | H02J 7/0021 324/434 |
| 2011/0031939 A1* | 2/2011 | Funaba | B60K 6/445 320/166 |
| 2011/0148426 A1* | 6/2011 | Yokotani | G01R 19/16542 324/434 |
| 2011/0199055 A1 | 8/2011 | Burchardt et al. | |
| 2012/0091966 A1* | 4/2012 | Mori | H01M 10/44 320/134 |
| 2012/0212186 A1 | 8/2012 | Fujii et al. | |
| 2012/0242292 A1 | 9/2012 | Ogino | |
| 2013/0162197 A1 | 6/2013 | Takahashi et al. | |
| 2013/0257354 A1 | 10/2013 | Koyama | |
| 2014/0184165 A1 | 7/2014 | Takahashi et al. | |
| 2014/0184314 A1 | 7/2014 | Takahashi et al. | |

FOREIGN PATENT DOCUMENTS

| | | |
|---|---|---|
| EP | 2590253 A | 5/2013 |
| JP | 08-098420 A | 4/1996 |
| JP | 2003-031216 A | 1/2003 |
| JP | 2009-252381 A | 10/2009 |
| JP | 2012-109260 A | 6/2012 |
| JP | 2012-174437 A | 9/2012 |
| JP | 2013-115862 A | 6/2013 |

* cited by examiner

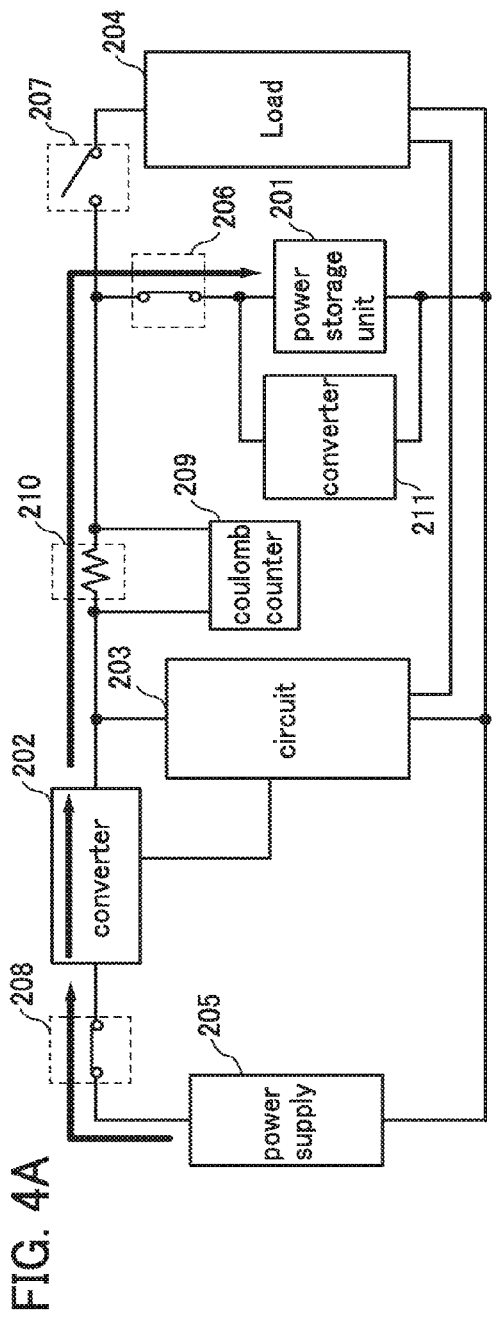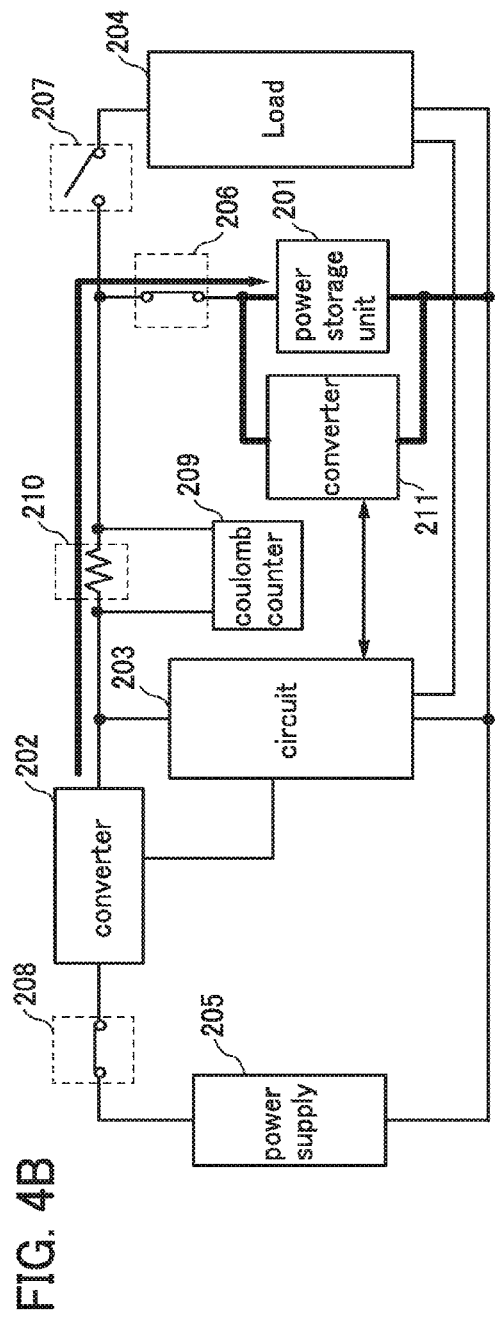

POWER STORAGE DEVICE AND CHARGING METHOD THEREOF

BACKGROUND OF THE INVENTION

1. Field of the Invention

The present invention relates to an object (a product including a machine, a manufacture, and a composition of matter) and a method (a process including a simple method and a production method). In particular, one embodiment of the present invention relates to a power storage device, a power storage system, a semiconductor device, a display device, a light-emitting device, and an electrical appliance, and further to a manufacturing method thereof and a driving method thereof. More specifically, one embodiment of the present invention relates to a power storage device, a power storage system, a semiconductor device, a display device, a light-emitting device, and an electrical appliance which include an oxide semiconductor, and further to a manufacturing method thereof and a driving method thereof. In particular, one embodiment of the present invention relates to a power storage device and a charging method thereof.

2. Description of the Related Art

In recent years, various power storage devices such as non-aqueous secondary batteries including lithium-ion secondary batteries and the like, lithium-ion capacitors, and air cells have been actively developed. In particular, demand for lithium-ion secondary batteries with high output and high energy density has rapidly grown with the development of the semiconductor industry, for electrical appliances, for example, portable information terminals such as mobile phones, smartphones, and laptop computers, portable music players, and digital cameras; medical equipment; next-generation clean energy vehicles such as hybrid electric vehicles (HEVs), electric vehicles (EVs), and plug-in hybrid electric vehicles (PHEVs); and the like. The lithium-ion secondary batteries are essential as rechargeable energy supply sources for today's information society.

A lithium-ion secondary battery, which is one of non-aqueous secondary batteries and widely used due to its high energy density, includes a positive electrode including an active material such as lithium cobalt oxide ($LiCoO_2$) or lithium iron phosphate ($LiFePO_4$), a negative electrode formed of a carbon material such as graphite capable of occlusion and release of lithium ions, a non-aqueous electrolyte solution in which an electrolyte formed of a lithium salt such as $LiBF_4$ or $LiPF_6$ is dissolved in an organic solvent such as ethylene carbonate or diethyl carbonate, and the like. A lithium-ion secondary battery is charged and discharged in such a way that lithium ions in the secondary battery move between the positive electrode and the negative electrode through the non-aqueous electrolyte solution and inserted into or extracted from the active materials of the positive electrode and the negative electrode.

The capacity of such a lithium-ion secondary battery or the like is determined by the amount of lithium inserted and extracted into/from the positive electrode. On the other hand, since decomposition reaction of the electrolyte solution occurs at the negative electrode, lithium is used in formation of a film called a solid electrolyte interphase (SEI), which may lead to a decrease in the capacity of the battery.

If decomposition reaction of the electrolyte solution similar to that at the negative electrode occurs also at the positive electrode, the decomposition reaction can cancel out the decomposition reaction at the negative electrode. However, since the potential of the positive electrode is not sufficiently higher than the oxidation potential of the electrolyte solution, the amount of reduction reaction at the negative electrode is larger than the amount of oxidation reaction at the positive electrode.

REFERENCE

[Non-Patent Document 1] Zempachi Ogumi, "Lithium Secondary Battery", Ohmsha, Ltd., the first impression of the first edition published on Mar. 20, 2008, pp. 116-118

SUMMARY OF THE INVENTION

For this reason, in a conventional power storage device, the amount of lithium inserted and extracted into/from a negative electrode is smaller than the amount of lithium inserted and extracted into/from a positive electrode because the decomposition of an electrolyte solution also occurs at the negative electrode. Therefore, there is an imbalance in the amount of inserted and extracted lithium between the positive electrode and the negative electrode, resulting in a decrease in the capacity of the power storage device.

In view of the above, an object of one embodiment of the present invention is to inhibit a decrease in the capacity of a power storage device or to compensate the capacity, by adjusting or rectifying an imbalance in the amount of inserted and extracted carrier ions between a positive electrode and a negative electrode, which is caused by decomposition of an electrolyte solution at the negative electrode.

An object of one embodiment of the present invention is to restore the capacity of a power storage device.

An object of one embodiment of the present invention is to control a power storage device with low power.

An object of one embodiment of the present invention is to improve the reliability of a power storage device.

An object of one embodiment of the present invention is to provide a novel power storage device.

An object of one embodiment of the present invention is to provide a highly reliable semiconductor device including a semiconductor layer.

In particular, one embodiment of the present invention can achieve at least one of the objects set forth above, in some cases. Note that one embodiment of the present invention does not necessarily achieve all the objects set forth above. If an object is not described above but apparent from the description of the specification, drawings, the scope of claims, and the like, the object can be regarded as it is.

As described above, an imbalance in the amount of inserted and extracted lithium between a positive electrode and a negative electrode can be redressed when decomposition of an electrolyte solution occurs also at the positive electrode. For example, in the case of using lithium iron phosphate ($LiFePO_4$) as a positive electrode active material, a potential at which lithium is inserted and extracted is approximately 3.5 V and therefore an end of charge voltage of 4 V is sufficient. However, by intentionally raising the end of charge voltage to 4.5 V, the decomposition of the electrolyte solution occurs at the positive electrode. In such a manner, the amount of decomposed electrolyte solution at the positive electrode becomes equal to the amount of decomposed electrolyte solution at the negative electrode; thus, the capacity of the positive electrode and the capacity of the negative electrode are balanced with each other, which makes it possible to inhibit a decrease in the capacity of the battery.

However, the decomposition of the electrolyte solution at the positive electrode might increase the resistance of the positive electrode.

In view of the above, the present inventors and the like have hit upon an idea of raising the charge voltage and performing a charge operation for charging to a certain degree to increase the battery capacity, only when the battery capacity becomes below a certain value. In the case of using lithium iron phosphate (LiFePO$_4$) as a positive electrode active material, for example, a charge voltage of 4.0 V or lower is enough for charging a general battery. When the battery capacity stored by normal charging becomes smaller than the capacity before shipping by a predetermined amount, additional charging with a high voltage that causes decomposition of an electrolyte solution is performed to compensate the decreased amount of charges. Thus, an increase in the resistance of the positive electrode can be prevented, and the restoration of the battery capacity can be achieved.

One embodiment of the present invention is a charging method of a power storage device including a positive electrode using an active material that exhibits two-phase reaction, a negative electrode, and an electrolyte solution. The charging method includes the steps of: after constant current charging, performing constant voltage charging with a first voltage that does not cause decomposition of the electrolyte solution (voltage that hardly causes decomposition of a predetermined amount of the electrolyte solution) until a charging current becomes lower than or equal to a predetermined lower current value limit; and after the constant voltage charging, performing additional charging with a second voltage that causes decomposition of the electrolyte solution until a resistance of the power storage device reaches a predetermined resistance. The second voltage is higher than the first voltage and specifically higher than the first voltage by at least 1 V.

One embodiment of the present invention is a charging method of a power storage device including a positive electrode using an active material that exhibits two-phase reaction, a negative electrode, an electrolyte solution, and a memory. The charging method includes the steps of: after constant current charging, performing constant voltage charging with a voltage that does not cause decomposition of the electrolyte solution (first voltage) until a charging current becomes lower than or equal to a predetermined lower current value limit; and if a capacity of the power storage device after the constant voltage charging is lower than a capacity before shipping of the power storage device, which is stored in the memory, by a predetermined capacity, performing additional charging with a voltage that causes decomposition of the electrolyte solution until a resistance of the power storage device reaches a predetermined resistance.

One embodiment of the present invention is a power storage device including: a power storage unit including a positive electrode using an active material that exhibits two-phase reaction, a negative electrode, and an electrolyte solution; a memory in which a capacity before shipping of the power storage unit is stored; and a circuit. In the power storage device, the circuit has functions of: comparing a capacity of the power storage unit after charging with the capacity before shipping of the power storage unit, which is stored in the memory, and if the capacity of the power storage unit after charging is lower than the capacity before shipping of the power storage unit, controlling operation so that additional charging with a voltage that causes decomposition of the electrolyte solution is performed until a resistance of the power storage unit reaches a predetermined resistance.

In particular, the positive electrode preferably includes graphene. The graphene is preferably multilayer graphene with an interlayer distance of greater than or equal to 0.34 nm and less than or equal to 0.5 nm.

Further, the memory preferably includes a transistor including an oxide semiconductor film in a channel formation region and having a function of controlling writing and retention of data. The circuit preferably includes a transistor including an oxide semiconductor film in a channel formation region. In particular, the transistor including the oxide semiconductor film in the channel formation region has an off-state current per micrometer of a channel width of less than or equal to 100 zA.

A decrease in the capacity of the power storage device can be inhibited.

The capacity of the power storage device can be restored.

The power storage device can be controlled with low power.

Moreover, the reliability of the power storage device can be improved.

A novel power storage device can be provided.

Further, a semiconductor device with low off-state current can be provided. A semiconductor device with low power consumption can be provided. Further, a semiconductor device including a transparent semiconductor layer can be provided. A highly-reliable semiconductor device including a semiconductor layer can be provided.

BRIEF DESCRIPTION OF THE DRAWINGS

In the accompanying drawings:

FIGS. 4A and 4B illustrate a power storage device that charges and discharges a power storage unit;

DETAILED DESCRIPTION OF THE INVENTION

Figure 1:
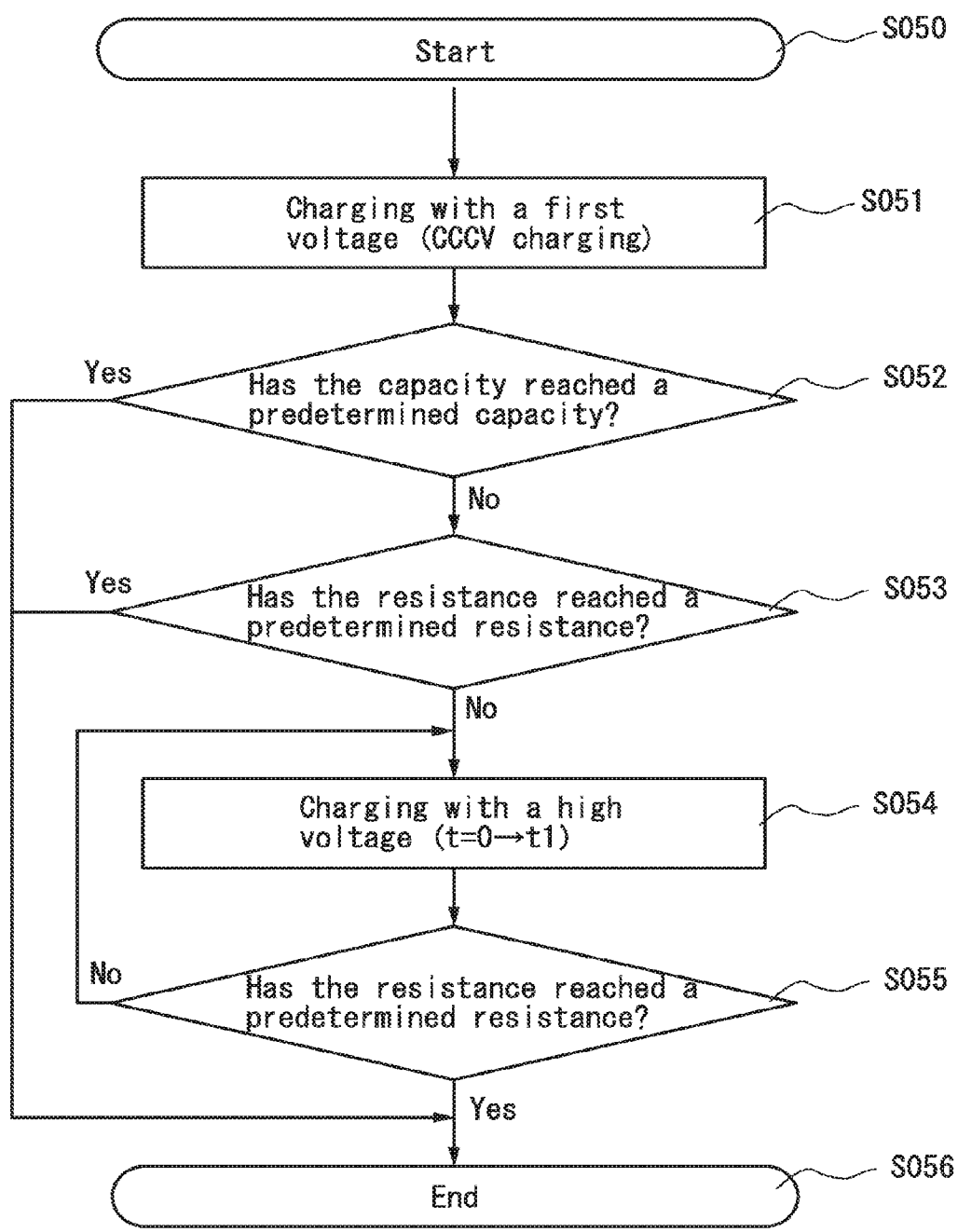
FIG. 1 is a flow chart showing a charging method.

Embodiments of the present invention will be described in detail below with reference to the drawings.

However, the present invention is not limited to the description of the embodiments, and it is easily understood by those skilled in the art that the modes can be modified in various ways. Therefore, the invention should not be construed as being limited to the description in the following embodiments.

Note that in drawings used in this specification, the thicknesses of films, layers, and substrates and the sizes of components (e.g., the sizes of regions) are exaggerated for simplicity in some cases. Therefore, the sizes of the components are not limited to those in the drawings and relative sizes between the components in the drawings.

Note that the ordinal numbers such as "first" and "second" in this specification and the like are used for convenience and do not denote the order of steps, the stacking order of layers, or the like. In addition, the ordinal numbers in this specification and the like do not denote particular names which specify the present invention.

Note that in the structures of the present invention described in this specification and the like, the same portions or portions having similar functions in different drawings are denoted by the same reference numerals, and description of such portions is not repeated. Further, the same hatching pattern is applied to portions having similar functions, and the portions are not especially denoted by reference numerals in some cases.

Note that a resist mask or the like might be reduced in size unintentionally owing to treatment such as etching in an actual manufacturing process; however, the reduction is not shown in the drawings in some cases for easy understanding.

Note that the term such as "over" or "below" in this specification and the like does not necessarily mean that a component is placed "directly on" or "directly under" another component. For example, the expression "a gate electrode over a gate insulating layer" can mean the case where there is an additional component between the gate insulating layer and the gate electrode.

Note that a voltage refers to a potential difference between a certain potential and a reference potential (e.g., a ground potential (GND) or a source potential) in many cases. Accordingly, a voltage can also be called a potential.

In addition, in this specification and the like, the term such as "electrode" or "wiring" does not limit the function of the component itself. For example, an "electrode" is sometimes a part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, even when such portions are not specified, one embodiment of the invention can be clear and it can be determined that one embodiment of the invention is disclosed in this specification and the like, in some cases. In particular, in the case where there are several possible portions to which a terminal can be connected, it is not necessary to specify all the portions to which the terminal is connected. Thus, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least connection portions of a circuit are specified. Alternatively, it might be possible for those skilled in the art to specify the invention when at least a function of a circuit is specified. In other words, when a function of a circuit is specified, one embodiment of the present invention can be clear and it can be determined that one embodiment of the invention is disclosed in this specification and the like, in some cases. Thus, when not a function but connection portions of a circuit are specified, the circuit is disclosed as one embodiment of the invention, and one embodiment of the invention can be constituted. Alternatively, when not connection portions but a function of a circuit is specified, the circuit is disclosed as one embodiment of the invention, and one embodiment of the invention can be constituted.

Note that in this specification and the like, a positive electrode and a negative electrode for a secondary battery may be collectively referred to as electrodes; the electrode in this case refers to at least one of the positive electrode and the negative electrode.

Note that in this specification and the like, a charging rate C refers to the rate at which a secondary battery is charged. For example, the charging rate in the case of charging a battery having a capacity of 1 Ah with 1 A is 1 C. In addition, a discharging rate C refers to the rate at which a secondary battery is discharged. For example, the discharging rate in the case of discharging a battery having a capacity of 1 Ah with 1 A is 1 C.

Structures or methods described in Detailed Description of the Invention can be combined as appropriate.

[1. Power Storage Device and Charging Method]

A charging and discharging method of a power storage device and the charging system in one embodiment of the present invention will be described with reference to FIG. 1 and FIG. 2.

[1.1. Active Material Exhibiting Two-Phase Reaction]

A power storage device of one embodiment of the present invention includes a power storage unit that includes a positive electrode, a negative electrode, and an electrolyte solution. In particular, an active material that exhibits two-phase reaction is preferably used in the positive electrode.

The two-phase reaction is a reaction that proceeds in a state where two phases that are a crystal phase in a charge state and a crystal phase in a discharge state coexist in a positive electrode. This two-phase reaction causes a flat potential region (plateau region).

In the case of using an active material that exhibits two-phase reaction, an abrupt voltage change at the end of charging as well as the flat potential ness in charging occurs.

As the active material that exhibits two-phase reaction, an olivine lithium iron phosphate (LiFePO$_4$) or a spinel lithium manganese oxide (LiMn$_2$O$_4$) can be used, for example.

Figure 23:
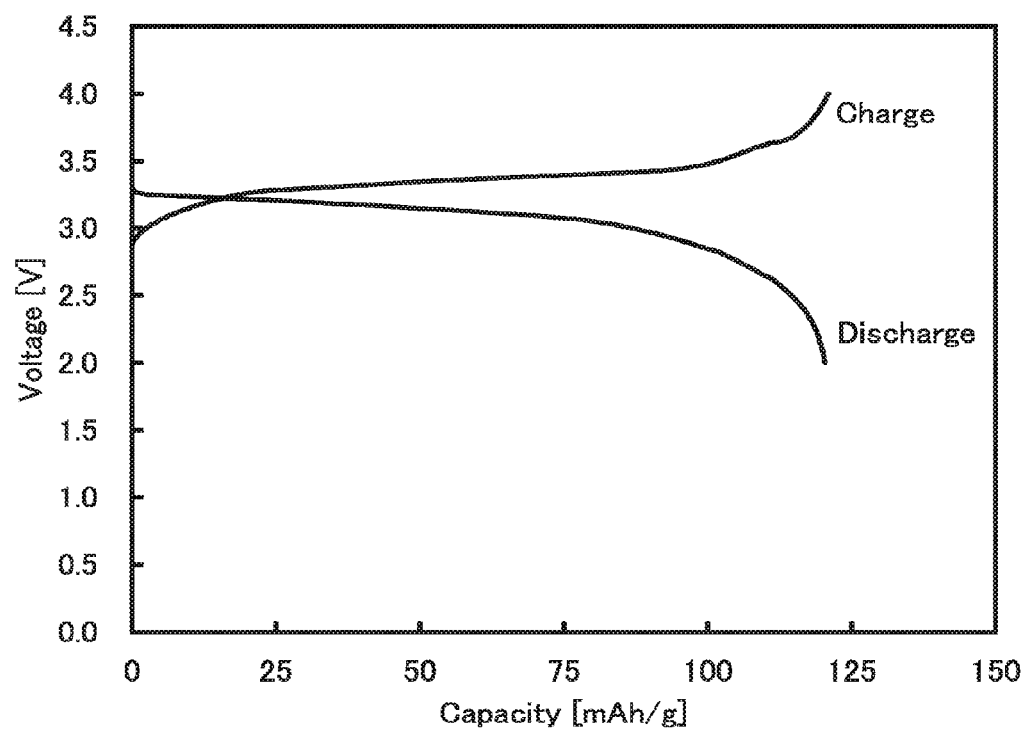
FIG. 23 shows charge-discharge characteristics of a power storage device.

FIG. 23 shows charge-discharge characteristics of a battery using lithium iron phosphate, which is an active material that exhibits two-phase reaction, as the positive electrode active material. The charge and discharge curves both have a flat potential region (plateau region).

Note that "flat" in the above sentences is a qualitative expression used to indicate part of charge-discharge characteristics of the battery that uses an active material that exhibits two-phase reaction, and thus should not be quantitatively discussed.

However, if the phrase "the charge and discharge curves have a flat potential region (plateau region)" is quantitatively expressed, it means that the voltage is constant or substantially constant irrelevant to charge-discharge capacity (mAh/g). The substantially constant voltage means that the absolute value of variations in voltage is within 5 mV for variations in charge-discharge capacity of 10 mAh/g.

In one embodiment of the present invention, it is preferable to use an active material that exhibits two-phase reaction, particularly because an abrupt voltage change occurs at the end of charging.

Note that the components of the power storage unit such as the positive electrode, the negative electrode, and the electrolyte solution are described later.

[1.2. Charging Method of Power Storage Device]

Next, a charging method of a power storage device, which is one embodiment of the present invention, will be described with reference to FIG. 1 and FIG. 2.

FIG. 1 is a flow chart showing the charging method of the power storage device of one embodiment of the present invention. First, when charging of the power storage device starts (Step S050), the power storage device is charged with a first voltage (Step S051). The first voltage is a voltage that does not substantially cause decomposition of the electrolyte solution, although minimal decomposition can be caused by a reaction between impurities in the electrolyte solution, a thermal variation, and the like in a first voltage range. With a voltage that causes decomposition of the electrolyte solution, which is higher than a decomposition potential, the current value increases logarithmically. In this sense, the voltage that does not cause decomposition of the electrolyte solution does not only strictly mean the voltage that does not cause decomposition but also means the voltage that hardly causes current flow as compared to the potential that causes decomposition of the electrolyte solution.

As the charging method in Step S051, constant current constant voltage (CCCV) charging is preferably performed. This is because CCCV charging enables charging to a high capacity, which is for example higher than the capacity achieved by constant current (CC) charging. However, the charging method is not limited to this method, and constant current charging, constant voltage charging, pulse charging, or other charging methods may be employed.

For example, in the case of CCCV charging, the finish of charging can be determined by judging whether the value of current flowing through the power storage device is lower than or equal to a lower current value limit that is appropriately set. For example, the charging finishes when the current value becomes lower than or equal to 0.01 C.

Next, it is judged whether the capacity of the power storage device has reached a predetermined capacity by the above charging (Step S052).

To make this judgement, the capacity of the power storage device before shipping is preferably stored in the power storage device.

In this specification, the capacity of the power storage device before shipping means the capacity of the power storage device after production and before shipping, in other words, the capacity before the user starts using it. Note that in the case where the power storage device is subjected to aging treatment after being produced, the capacity of the power storage device before shipping means the capacity after the aging treatment.

Further, the capacity of the power storage device before shipping is the capacity (maximum capacity) to which the power storage device can be maximally charged by a normal charging method at the shipping stage. The capacity may include a capacity corresponding to an irreversible capacity of the negative electrode caused by charging before the shipping of the power storage device. Note that it is preferable to charge the power storage device in advance to compensate for the amount of the capacity corresponding to the irreversible capacity of the negative electrode caused before the shipping, by additional charging of one embodiment of the present invention.

To store the capacity before the shipping in the power storage device, a memory is preferably incorporated in the power storage device. The memory that is described later is preferably a nonvolatile RAM. Alternatively, a read only memory such as a mask ROM may be used. The memory may be provided inside a circuit having a function of controlling the charging method of one embodiment of the present invention.

The judgement on whether the capacity of the power storage device has reached the predetermined capacity is made by obtaining a difference from the capacity of the power storage device before the shipping (maximum capacity). For example, it is determined whether the capacity of the power storage device after charging at Step S051 is lower than the capacity of the power storage device before the shipping by a predetermined capacity.

If the difference between the capacity of the power storage device after charging at Step S051 and the capacity of the power storage device before the shipping does not exceed the predetermined capacity, charging of the power storage device is finished (Step S056).

On the other hand, if the difference between the capacity of the power storage device after charging at Step S051 and the capacity of the power storage device before the shipping exceeds the predetermined capacity, the power storage device goes to Step S053 for additional charging.

For this judgement, a circuit that can make this judgement is preferably provided in the power storage device.

Next, it is judged whether the resistance of the power storage device has reached a predetermined resistance (Step S053). If the resistance of the power storage device, that is, the resistance of the positive electrode, is high enough, the positive electrode deteriorates and further charging is difficult; therefore, the charging process is finished without additional charging (Step S056).

On the other hand, if the resistance of the power storage device has not reached the predetermined resistance, the power storage device goes to Step S054 for additional charging with the use of a high voltage.

Here, the resistance of the power storage device can be calculated by supplying a predetermined discharge current to the power storage device and measuring a voltage drop of the power storage device.

The additional charging at Step S054 is performed using the voltage that causes decomposition of the electrolyte solution of the power storage device. In the case where lithium iron phosphate is used as the active material that exhibits two-phase reaction in the positive electrode, the voltage that causes decomposition of the electrolyte solution is preferably higher than 4.0 V (vs. Li/Li+), further preferably higher than or equal to 4.3 V (vs. Li/Li+), and further preferably higher than or equal to 4.6 V (vs. Li/Li+). If the high voltage is used, however, the resistance of the positive electrode increases; accordingly, the voltage for additional charging is set as appropriate within the range of voltages that cause decomposition of the electrolyte solution in accordance with the purpose.

Further, the additional charging at Step S054 is performed only for a predetermined period of time (e.g., a period from time 0 to time $t_1$). Accordingly, the power storage device is preferably provided with a period measurement unit such as a timer/counter.

After the predetermined period of time, the additional charging is stopped, and it is judged whether the resistance of the power storage device has reached the predetermined resistance (Step S055). If the resistance of the power storage device has not reached the predetermined resistance, the power storage device returns to Step S054 for another additional charging with the use of the high voltage. On the other hand, if the resistance of the power storage device has reached the predetermined resistance, charging is finished (Step S056).

The judgement of the resistance at Step S055 is made in the same way as that at Step S053.

By dividing the charging operation and judging the resistance of the power storage device at regular time intervals in this manner, a significant increase of the resistance of the power storage device can be prevented and additional charging can be performed.

Figure 2:
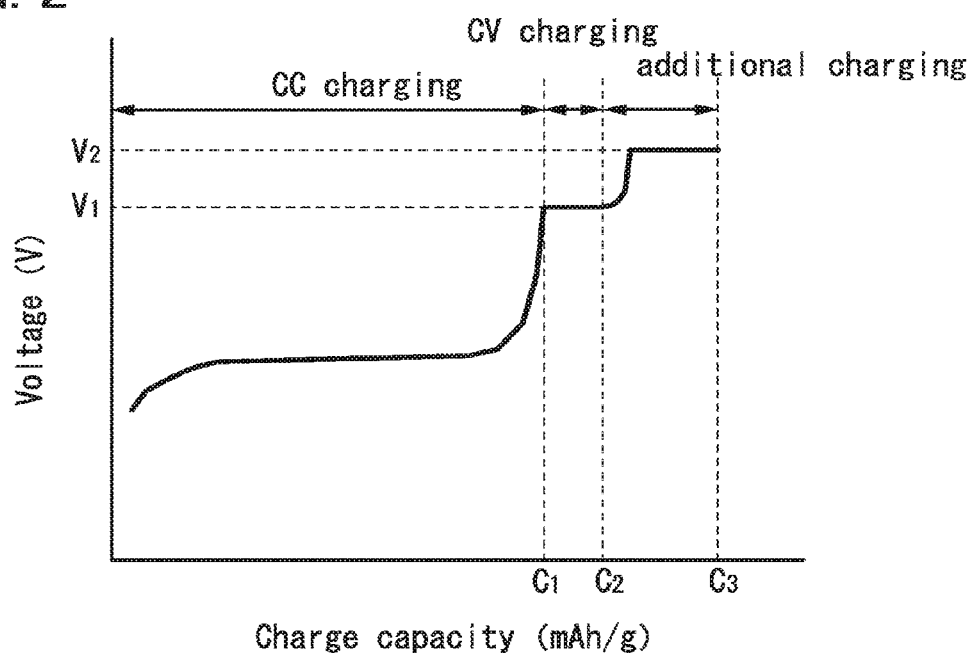
FIG. 2 is a schematic diagram showing changes in charge capacity with respect to voltage.

FIG. 2 is a schematic diagram showing changes in charge capacity with respect to voltage during CCCV charging and additional charging after the CCCV charging. A power storage device used in this measurement includes an active material that exhibits two-phase reaction in a positive electrode. The horizontal axis represents charge capacity, and the vertical axis represents voltage.

A plateau region with small voltage variations spreads in most period of CC charging. At the end of CC charging, voltage abruptly increases. In the case where the end voltage of CC charging is set at $V_1$, after the voltage reaches $V_1$, charging is switched to CV charging with a constant voltage of $V_1$. When the charge capacity at this time is $C_1$, the charge capacity is further increased to $C_2$ by this CV charging.

The voltage used in CCCV charging is $V_1$ at the maximum as shown in FIG. 2 and is within the range of voltages that do not cause decomposition of an electrolyte solution of the power storage device.

Then, in the case of performing additional charging, the additional charging is performed using the voltage $V_2$ that causes decomposition of the electrolyte solution of the power storage device. By this additional charging, the charge capacity of the power storage device can increase to $C_3$ that is higher than $C_2$. Here, the upper limit of the capacity $C_3$ obtained by additional charging is the capacity before the shipping of the power storage device (maximum capacity).

[1.3. Power Storage Device that Charges and Discharges Power Storage Unit]

An example of a power storage device that charges and discharges a power storage unit of one embodiment of the present invention will be described with reference to FIG. 3, FIGS. 4A and 4B, and FIG. 5.

Figure 3:
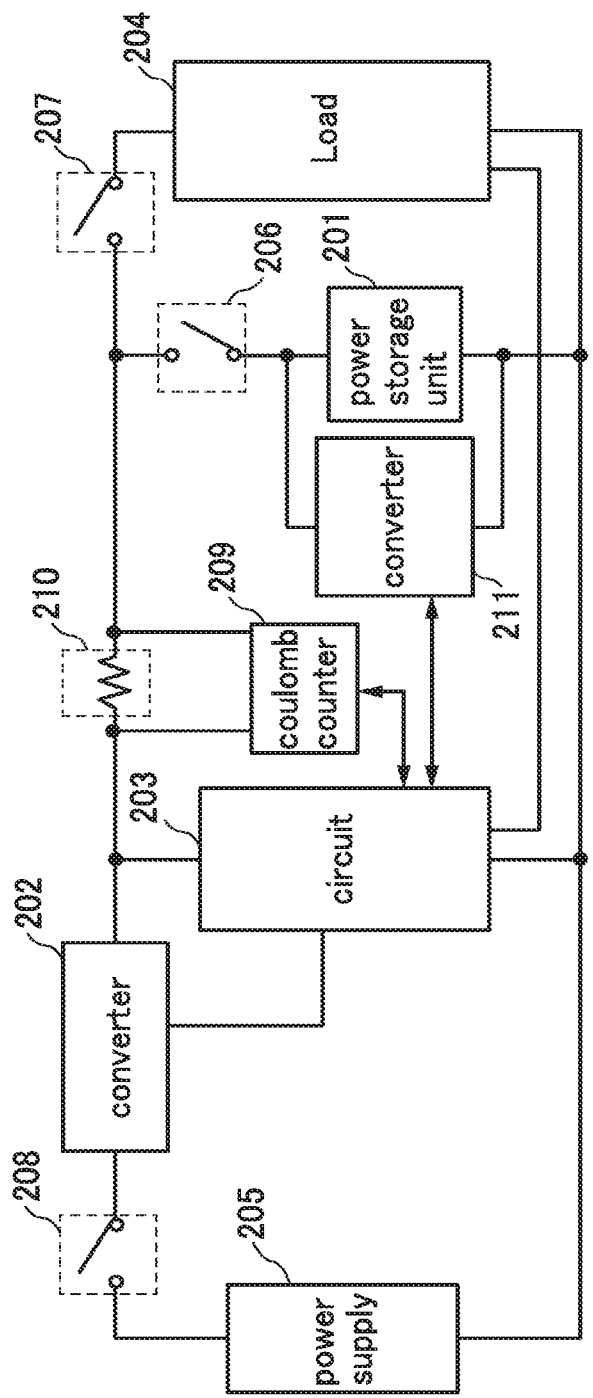
FIG. 3 illustrates a power storage device that charges and discharges a power storage unit.

A power storage device that charges and discharges a power storage unit illustrated in FIG. 3 includes a power storage unit 201, a converter 202, a circuit 203, a load 204, a power supply 205, a switch 206, a switch 207, a switch 208, a coulomb counter 209, a resistor 210, and a converter 211. Note that when the components are incorporated in the same device, the number of connection points or the like can be reduced. For example, the power storage unit 201 and the circuit 203 may be incorporated in the same device. Alternatively, the power storage unit 201, the converter 202, and the circuit 203 may be incorporated in the same device.

It is preferable, as described above, to use an active material that exhibits two-phase reaction in a positive electrode of the power storage unit 201. The power storage device having the power storage unit 201 will be described later.

The converter 202 is connected to the power storage unit 201 and the circuit 203.

For example, the converter 202 has a function of controlling the current value at the time of charge and discharge of the power storage unit 201 by converting voltage supplied from the power supply 205.

As the converter 202, a step-up/down converter can be used, for example. The step-up/down converter includes a switching regulator and a control circuit, for example. The switching regulator includes an inductor and a switch, for example. The step-up/down converter can switch between step-up and step-down of an input voltage by the control of the switch with the control circuit, for example, and thus can control the value of the stepped-up or stepped-down voltage. In this manner, the step-up/down converter can output a certain constant voltage to the power storage unit 201, and enables constant current charging or constant voltage charging. Note that one embodiment of the present invention is not limited to this example, and the switch of the switching regulator may be controlled by the circuit 203 instead of by the control circuit. As the step-up/down converter, a single ended primary inductor converter (SEPIC), a zeta converter, or the like can be used, for example.

The circuit 203 is connected to the power storage unit 201. Power is supplied to the circuit 203 from the power storage unit 201 or the power supply 205.

The circuit 203 has a function of controlling the value of the output voltage from the converter 202 by generating and outputting an instruction signal that instructs the state of the converter 202. Note that the circuit 203 may serve as a control circuit. Alternatively, the circuit 203 may serve as a microcomputer, a microprocessor (also referred to as an MPU), a microcontroller unit (also referred to as an MCU) a field programmable gate array (also referred to as an FPGA), a central processing unit (also referred to as a CPU), or a battery management unit (also referred to as a BMU).

The circuit 203 preferably includes a memory for storing capacity before the shipping of the power storage unit 201 (maximum capacity). However, the memory is not necessarily provided inside the circuit 203 and may be included separately in the power storage device.

The load 204 is connected to the power storage unit 201, the converter 202, and the circuit 203. Power is supplied to the load 204 from the power storage unit 201 or the power supply 205. Note that a control signal from the load 204 may be input to the circuit 203. A power gate may be provided in the load 204 to control power supply to a circuit included in the load 204. Note that the circuit 203 is not necessarily connected to the load 204.

As the power supply 205, a power supply circuit using a system power supply can be used, for example. Without limitation to this example, a device capable of supplying electric power in a contactless manner, such as a power feeding device, may be used.

The switch 206 is connected to the positive electrode of the power storage unit 201 and has a function of controlling conduction between the power storage unit 201 and the converter 202, for example. The switch 206 may be controlled by the control circuit of the converter 202 or the circuit 203.

The switch 207 has a function of controlling conduction between the power storage unit 201 and the load 204. The switch 207 may be controlled by the control circuit of the converter 202 or the circuit 203.

The switch 208 has a function of controlling conduction between the power supply 205 and the converter 202. The switch 208 may be controlled by the control circuit of the converter 202 or the circuit 203.

As the switches 206 to 208, a transistor, a diode, or the like can be used, for example.

The resistor 210 is electrically connected to the power storage unit 201 through the switch 206.

The coulomb counter 209 is electrically connected to both terminals of the resistor 210. The coulomb counter 209 detects the value of current flowing through the resistor 210 and determines the capacity (the amount of charges) of the power storage unit 201. The determined capacity of the power storage unit 201 can be used as data for judging whether to perform the above-described additional charging of the power storage unit 201. The coulomb counter 209 is described later.

The coulomb counter 209 is electrically connected to the circuit 203 and controlled by the circuit 203. The coulomb counter 209 transmits the data on the determined capacity of the power storage unit 201 to the circuit 203.

Although the coulomb counter 209 and the circuit 203 are illustrated separately in FIG. 3, the coulomb counter 209 may be provided inside the circuit 203. Further, the resistor 210 and the coulomb counter 209 are not necessarily provided in the power storage device and may be provided in a charging device for charging the power storage device or the like.

Next, a method for charging and discharging the power storage device that charges and discharges the power storage unit 201, which is illustrated in FIG. 3, will be described with reference to FIGS. 4A and 4B.

As illustrated in FIG. 4A, in the period of CCCV charging and the period of additional charging for the power storage unit 201, the switch 207 is turned off and the switches 206 and 208 are turned on by being controlled by the circuit 203 or the like. Thus, the positive electrode of the power storage unit 201 is electrically connected to the power supply 205 through the converter 202. This allows current to flow to the power storage unit 201 from the power supply 205 through the converter 202, whereby the power storage unit 201 is charged. The voltage and current input to the power storage device can be adjusted as appropriate using the converter 202 or the like.

Here, to judge whether to perform additional charging, the resistance of the power storage unit 201 is checked at regular time intervals. The resistance can be calculated by making a predetermined current flow to the power storage unit 201 using the converter 202 and measuring a voltage drop of the power storage unit 201 at this time using the converter 211, as shown in FIG. 4B.

For example, a predetermined current $I_1$ is made to flow to the power storage unit 201 by the converter 202 and a voltage $V_{1a}$ at this time is measured by the converter 211. Further, a predetermined current $I_2$ is made to flow to the power storage unit 201 by the converter 202 and a voltage $V_{2a}$ at this time is measured by the converter 211. When the resistance of the power storage unit 201 is R, the resistance can be calculated by the following equation: $R=(V_{1a}-V_{2a})/(I_1-I_2)$.

For this measurement, the converter 202 and the converter 211 are controlled in synchronization with each other by using the circuit 203. The calculation of the resistance of the power storage unit 201 may be performed using the circuit 203.

Note that the above-described method for measuring the resistance of the power storage unit 201 is merely an example, and other methods for measuring the resistance may be used as well.

Figure 5:
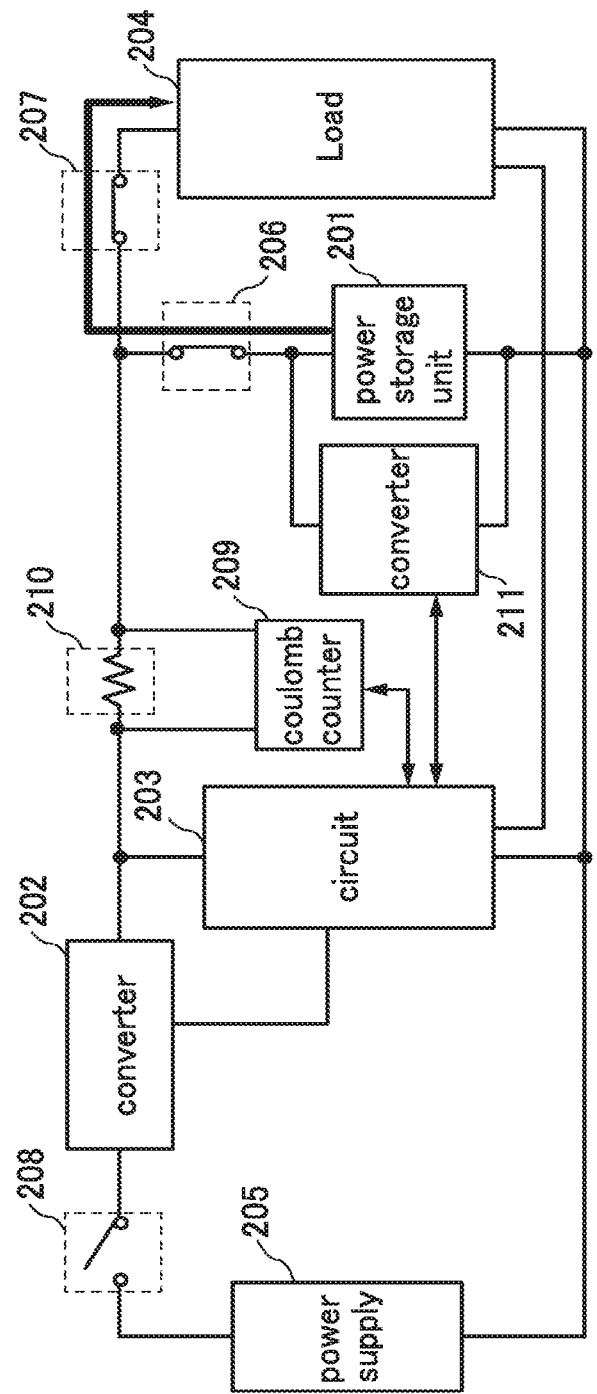
FIG. 5 illustrates a power storage device that charges and discharges a power storage unit.

In the discharging period of the power storage unit 201, as shown in FIG. 5, the switch 208 is turned off and the switches 206 and 207 are turned on by being controlled by the circuit 203 or the like. Thus, the positive electrode and the negative electrode of the power storage unit 201 and the load 204 are electrically connected to one another, and a current flows from the power storage unit 201 to the load 204.

To supply power to the load 204, the power storage unit 201 is not necessarily used under the state where the power supply 205 is connected to the load 204. Power may be supplied to the load 204 from the power supply 205. In this case, power supply to the load 204 and charging of the power storage unit 201 can be performed at the same time.

[2. Control Circuit]

An example of the circuit 203 is described with reference to FIG. 6.

[2.1. Circuit Configuration]

A circuit 203 includes a processor 710, a bus bridge 711, a RAM (random access memory) 712, a memory interface 713, a controller 720, an interrupt controller 721, an I/O interface (input-output interface) 722, and a power gate unit 730.

The circuit 203 further includes a crystal oscillation circuit 741, a timer circuit 745, an I/O interface 746, an I/O port 750, a comparator 751, an I/O interface 752, a bus line 761, a bus line 762, a bus line 763, and a data bus line 764. Further, the circuit 203 includes at least connection terminals 770 to 776 for connection to an external device. Note that each of the connection terminals 770 to 776 represents one terminal or a terminal group including a plurality of terminals. An oscillation unit 742 including a quartz crystal oscillator 743 is connected to the circuit 203 through the connection terminal 772 and the connection terminal 773.

The processor 710 includes a register 785 and is connected to the bus lines 761 to 763 and the data bus line 764 through the bus bridge 711.

The memory 712 is a memory device capable of functioning as a main memory of the processor 710, and a random access memory is used, for example. The memory 712 stores an instruction executed by the processor 710, data necessary for execution of an instruction, and data on processing of the processor 710. In accordance with the instruction processed by the processor 710, writing and reading of data to/from the memory 712 are carried out.

In the circuit 203, power supply to the memory 712 is blocked in a low power consumption mode. Therefore, a memory capable of storing data when power is not supplied to the memory is preferably used as the memory 712.

The memory interface 713 is an input-output interface with an external memory device. Under the instruction executed by the processor 710, data is written into and read out from the external memory device connected to the connection terminal 776 via the memory interface 713.

A clock generation circuit 715 is a circuit that generates a clock signal MCLK (hereinafter, also simply referred to as "MCLK") to be used in the processor 710, and includes an RC oscillator and the like. MCLK is also output to the controller 720 and the interrupt controller 721.

The controller 720 is a circuit that controls the circuit 203, and can carry out control of a power supply of the circuit 203, control of the clock generation circuit 715 and the crystal oscillation circuit 741, and the like.

The connection terminal 770 is a terminal for inputting an external interrupt signal. A non-maskable interrupt signal NMI is input to the controller 720 through the connection terminal 770. As soon as the non-maskable interrupt signal NMI is input to the controller 720, the controller 720 outputs the non-maskable interrupt signal NMI2 to the processor 710, so that the processor 710 executes interrupt processing.

The interrupt signal INT is input to the interrupt controller 721 through the connection terminal 770. Interrupt signals (T0IRQ, P0IRQ, and C0IRQ) from the peripheral circuits are input to the interrupt controller 721 without passing through the buses (761 to 764).

The interrupt controller 721 has a function of assigning priorities to interrupt requests. When the interrupt controller 721 detects the interrupt signal, the interrupt controller 721 determines whether the interrupt request is valid or not. If the interrupt request is valid, the interrupt controller 721 outputs an interrupt signal IRQ to the controller 720.

The interrupt controller 721 is connected to the bus line 761 and the data bus line 764 through an I/O interface 722.

When the interrupt signal INT is input, the controller 720 outputs the interrupt signal INT2 to the processor 710 and makes the processor 710 execute interrupt processing.

The interrupt signal T0IRQ is directly input to the controller 720 without passing through the interrupt controller 721 in some cases. When the controller 720 receives the interrupt signal T0IRQ, the controller 720 outputs the non-maskable interrupt signal NMI2 to the processor 710, so that the processor 710 executes interrupt processing.

A register 780 of the controller 720 is provided in the controller 720. A register 786 of the interrupt controller 721 is provided in the I/O interface 722.

Next, a peripheral circuit included in the circuit 203 will be described. The circuit 203 includes the timer circuit 745, the I/O port 750, and the comparator 751 as peripheral circuits. These are examples of the peripheral circuits, and a circuit needed for an electrical appliance using the circuit 203 can be provided as appropriate.

The timer circuit 745 has a function of measuring time in response to a clock signal TCLK (hereinafter, also simply referred to as "TCLK") output from a clock generation circuit 740. In addition, the timer circuit 745 outputs the interrupt signal T0IRQ to the controller 720 and the interrupt controller 721 at a set time interval. The timer circuit 745 is connected to the bus line 761 and the data bus line 764 through the I/O interface 746.

TCLK is a clock signal having a frequency lower than that of MCLK. For example, the frequency of MCLK is about several megahertz (MHz) (e.g., 8 MHz) and the frequency of TCLK is about several tens of kilohertz (kHz) (e.g., 32 kHz). The clock generation circuit 740 includes the crystal oscillation circuit 741 incorporated in the circuit 203, and the oscillation unit 742 which is connected to the connection terminal 772 and the connection terminal 773. The quartz crystal oscillator 743 is used as an oscillator of the oscillation unit 742. In addition, the clock generation circuit 740 is made up of a CR oscillator and the like, and thereby, all modules in the clock generation circuit 740 can be incorporated in the circuit 203.

The I/O port 750 is an interface that inputs and outputs information to and from an external device connected to the I/O port 750 through the connection terminal 774 and is an input-output interface for a digital signal. Accordingly, a data signal can be input to the circuit 203. For example, the I/O port 750 outputs the interrupt signal P0IRQ to the interrupt controller 721 in accordance with an input digital signal. Note that a plurality of connection terminals 774 may be provided.

The comparator 751 can compare a potential (or current) of the analog signal inputted from the connection terminal 775 with a potential (or current) of a reference signal and generate a digital signal having a level of 0 or 1. Further, the comparator 751 can generate the interrupt signal C0IRQ depending on the level of this digital signal. The interrupt signal C0IRQ is output to the interrupt controller 721.

The I/O port 750 and the comparator 751 are connected to the bus line 761 and the data bus line 764 through the I/O interface 752 common to the both. Here, one I/O interface 752 is used because the I/O interfaces of the I/O port 750 and the comparator 751 can share a circuit; however, the T/O port 750 and the comparator 751 can each have an I/O interface separately.

In addition, a register of each peripheral circuit is placed in the input/output interface corresponding to the peripheral circuit. A register 787 of the timer circuit 745 is placed in the I/O interface 746, and a register 783 of the I/O port 750 and a register 784 of the comparator 751 are placed in the I/O interface 752.

The circuit 203 includes the power gate unit 730 that can block power supply to the internal circuits. Power is supplied only to a circuit necessary for operation by the power gate unit 730, so that power consumption of the circuit 203 can be lowered as a whole.

Figure 6:
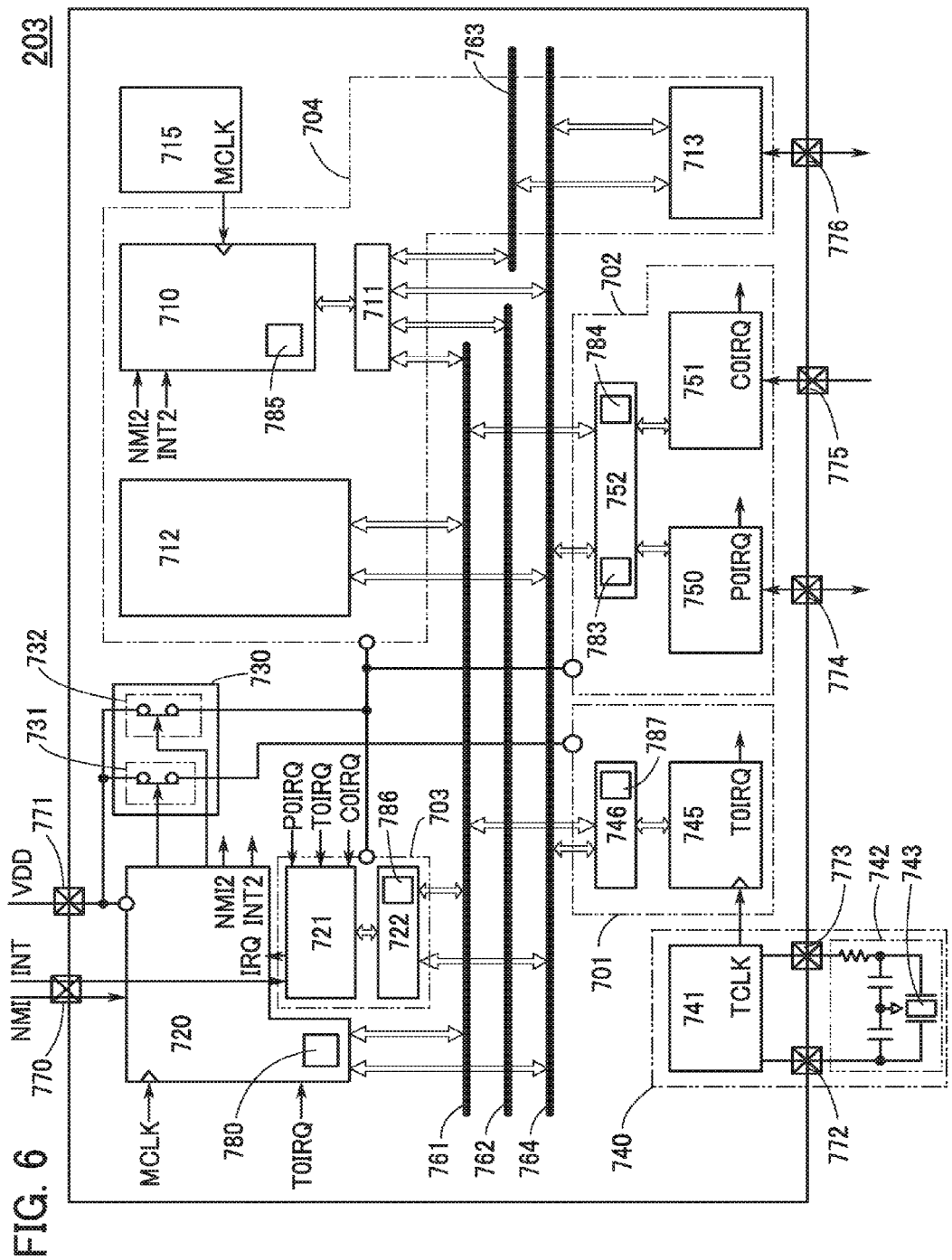
FIG. 6 illustrates a control circuit.

As shown in FIG. 6, circuits in a unit 701, a unit 702, a unit 703, and a unit 704 in the circuit 203 which are surrounded by dashed lines are connected to the connection terminal 771 through the power gate unit 730. For example, the connection terminal 771 is connected to the power storage unit 201 illustrated in FIG. 3. Note that a converter may be provided between the connection terminal 771 and the power storage unit 201.

In one embodiment of the present invention, the unit 701 includes the timer circuit 745, and the I/O interface 746. The unit 702 includes the I/O port 750, the comparator 751, and the I/O interface 752. The unit 703 includes the interrupt controller 721, and the I/O interface 722. The unit 704 includes the processor 710, the memory 712, the bus bridge 711, and the memory interface 713.

The power gate unit 730 is controlled by the controller 720. The power gate unit 730 includes a switch circuit 731 and a switch circuit 732 for blocking supply of power supply voltage to the units 701 to 704. As the power supply voltage at this time, a power supply voltage of the power storage unit 201 or the like can be used, for example.

The switching of the switch circuits 731 and 732 is controlled by the controller 720. Specifically, the controller 720 outputs a signal to turn off some or all of the switches included in the power gate unit 730, depending on the request by the processor 710 (power supply stop). In addition, the controller 720 outputs a signal to turn on the switches included in the power gate unit 730 with, as a trigger, the non-maskable interrupt signal NMI or the interrupt signal T0IRQ from the timer circuit 745 (start of power supply).

FIG. 6 illustrates a structure where two switches (the switches 731 and 732) are provided in the power gate unit 730; however, the structure is not limited thereto. Switches may be provided as much as needed to block supply of power.

Here, the switch 731 is provided to individually control supply of power to the unit 701 and the switch circuit 732 is provided to individually control supply of power to the units 702 to 704. However, this embodiment of the present invention is not limited to such a power supply path. For example, another switch which is not the switch circuit 732 may be provided to individually control supply of power to the memory 712. Further, a plurality of switches may be provided for one circuit.

In addition, a power supply voltage is constantly supplied from the connection terminal 771 to the controller 720 without passing through the power gate unit 730. In order to reduce noise, a power supply potential from an external power supply circuit, which is different from the power supply circuit for the power supply voltage, is given to both the oscillation circuit of the clock generation circuit 715 and the crystal oscillation circuit 741.

[2.2. Example of Driving Method]

By provision of the controller 720, the power gate unit 730, and the like, the circuit 203 can operate in three kinds of operation modes. The first operation mode is a normal operation mode where all circuits included in the circuit 203 are active. Here, the first operation mode is referred to as "Active mode".

The second and third operation modes are low power consumption modes where some of the circuits are active. In the second operation mode, the controller 720, the timer circuit 745, and circuits (the crystal oscillation circuit 741 and the I/O interface 746) associated thereto are active. In the third operation mode, only the controller 720 is active. Here, the second operation mode is referred to as "the Noff1 mode" and the third operation mode is referred to as "the Noff2 mode". Only the controller 720 and some of the peripheral circuits (circuits necessary for timer operation) operate in the Noff1 mode and only the controller 720 operates in the Noff2 mode.

Note that power is constantly supplied to the oscillator of the clock generation circuit 715 and the crystal oscillation circuit 741 regardless of the operation modes. In order to bring the clock generation circuit 715 and the crystal oscillation circuit 741 into non-Active modes, an enable signal is inputted from the controller 720 or an external circuit to stop oscillation of the clock generation circuit 715 and the crystal oscillation circuit 741.

In addition, in Noff1 and Noff2 modes, power supply is blocked by the power gate unit 730, so that the I/O port 750 and the I/O interface 752 are non-active, but power is supplied to parts of the I/O port 750 and the I/O interface 752 in order to allow the external device connected to the connection terminal 774 to operate normally. Specifically, power is supplied to an output buffer of the I/O port 750 and the register 783 of the I/O port 750.

Note that in this specification, the phrase "a circuit is non-active" includes a state where major functions in Active mode (normal operation mode) are stopped and an operation state with power consumption lower than that of Active mode, as well as a state that a circuit is stopped by blocking of power supply.

With the above-described structure, when the charge operation of a power storage device is forcibly terminated by a user, for example, a signal to turn off some or all of the switches included in the power gate unit 730 can be output depending on the request by the processor 710, and the mode can be switched to the Noff1 or Noff2 mode to stop power supply to an unnecessary circuit block.

[2.3. Register]

Further, an example of a structure of the register which can be used in each circuit block will be described with reference to FIGS. 7A and 7B.

[2.3.1. Example of Circuit Configuration]

Figure 7A:
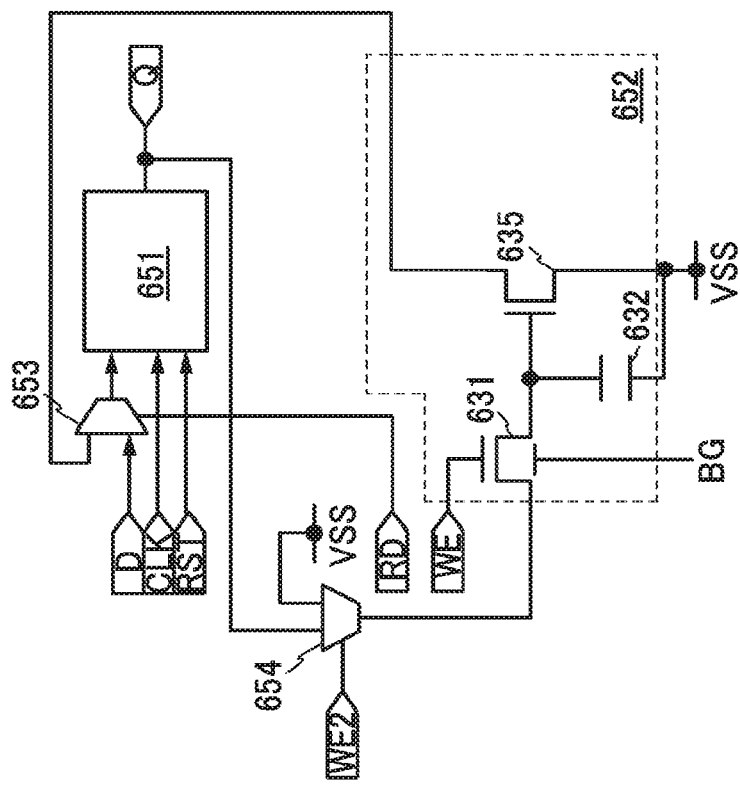
FIGS. 7A and 7B each illustrate a control circuit.

The register illustrated in FIG. 7A includes a memory circuit 651, a memory circuit 652, and a selector 653.

The memory circuit 651 is supplied with a reset signal RST, a clock signal CLK, and a data signal D. The memory circuit 651 has a function of storing data of the data signal D that is input in response to the clock signal CLK and outputting the data as a data signal Q. For example, a register such as a buffer register or a general-purpose register can be used as the memory circuit 651. As the memory circuit 651, a cache memory including a static random access memory (SRAM) or the like can be provided. Data of such a register or a cache memory can be stored in the memory circuit 652.

The memory circuit 652 is supplied with a write control signal WE, a read control signal RD, and a data signal. For example, the write control signal WE, a read control signal RD, and the like may be input through a terminal.

The memory circuit 652 has a function of storing data of an input data signal in accordance with the write control signal WE and outputting the stored data as a data signal in accordance with the read control signal RD.

In the selector 653, the data signal D or the data signal output from the memory circuit 652 is selected in accordance with the read control signal RD, and input to the memory circuit 651.

The memory circuit 652 includes a transistor 631 and a capacitor 632.

The transistor 631, which is an n-channel transistor, functions as a selection transistor. One of a source and a drain of the transistor 631 is connected to an output terminal of the memory circuit 651. Further, a power supply potential is supplied to a back gate of the transistor 631. The transistor 631 has a function of controlling the retention of a data signal output from the memory circuit 651 in accordance with the write control signal WE.

A transistor with low off-state current may be used as the transistor 631, for example. As the transistors with low off-state current, a transistor including a channel formation region that includes an oxide semiconductor with a wider bandgap than that of silicon and is substantially i-type can be used, for example.

The transistor including the oxide semiconductor can be fabricated in such a manner that, for example, impurities such as hydrogen or water are reduced as much as possible and oxygen vacancies are reduced as much as possible by supply of oxygen. At this time, the amount of hydrogen that is regarded as a donor impurity in the channel formation region is preferably reduced to lower than or equal to $1\times10^{19}/cm^3$, further preferably lower than or equal to $1\times10^{18}/cm^3$ by secondary ion mass spectrometry (SIMS). The off-state current per micrometer of the channel width of the transistor 631 at 25° C. is lower than or equal to $1\times10^{-19}$ A (100 zA), preferably lower than or equal to $1\times10^{-22}$ A (100 yA). It is preferable that the off-state current of the transistor be as low as possible; the lowest value of the off-state current of the transistor is estimated to be about $1 \times 10^{-30}$ A/μm.

The oxide semiconductor can be, for example, an In-based metal oxide, a Zn-based metal oxide, an In—Zn-based metal oxide, or an In—Ga—Zn-based metal oxide.

One of a pair of electrodes of the capacitor 632 is connected to the other of the source and the drain of the transistor 631, and the other of the pair of electrodes is supplied with a low power source potential VSS. The capacitor 632 has a function of holding charge based on data of a stored data signal. Since the off-state current of the transistor 631 is extremely low, the charge in the capacitor 632 is held and thus the data is stored even when the supply of the power source voltage is stopped.

A transistor 633 is a p-channel transistor. The high power source potential VDD is supplied to one of a source and a drain of the transistor 633, and the read control signal RD is input to a gate of the transistor 633.

A transistor 634 is an n-channel transistor. One of a source and a drain of the transistor 634 is connected to the other of the source and the drain of the transistor 633, and the read control signal RD is input to a gate of the transistor 634.

A transistor 635 is an n-channel transistor. One of a source and a drain of the transistor 635 is connected to the other of the source and the drain of the transistor 634, and the low power source potential VSS is input to the other of the source and the drain of the transistor 635.

An input terminal of an inverter 636 is connected to the other of the source and the drain of the transistor 633. An output terminal of the inverter 636 is connected to the input terminal of the selector 653.

One of a pair of electrodes of a capacitor 637 is connected to the input terminal of the inverter 636, and the other of the pair of electrodes is supplied with the low power source potential VSS. The capacitor 637 has a function of holding charge based on data of a data signal input to the inverter 636.

Note that without limitation to the above, the memory circuit 652 may include a phase-change RAM (PRAM), a phase change memory (PCM), a resistive RAM (ReRAM), a magnetoresistive RAM (MRAM), or the like. For the MRAM, a magnetic tunnel junction element (MTJ element) can be used for example.

[2.3.2. Example of Driving Method]

Next, an example of a method for driving the register illustrated in FIG. 7A will be described.

First, in a normal operation period, the register is supplied with the power supply voltage that is power for the register, the reset signal RST, and the clock signal CLK. At this time, the selector 653 outputs data of the data signal D to the memory circuit 651. The memory circuit 651 stores the data of the data signal D that is input in accordance with the clock signal CLK. At this time, in response to the read control signal RD, the transistor 633 is turned on while the transistor 634 is turned off.

Then, in a backup period provided immediately before the supply of the power supply voltage is stopped, in accordance with a pulse of the write control signal WE, the transistor 631 is turned on, the data of the data signal D is stored in the memory circuit 652, and the transistor 631 is turned off. After that, the supply of the clock signal CLK to the register is stopped, and then, the supply of the reset signal RST to the register is stopped. Note that when the transistor 631 is on, the back gate of the transistor 631 may be supplied with a positive power supply potential. At this time, in response to the read control signal RD, the transistor 633 is turned on while the transistor 634 is turned off.

Next, in a power stop period, the supply of the power supply voltage to the register is stopped. During this period, the stored data is held because the off-state current of the transistor 631 is low in the memory circuit 652. Note that the supply of the power supply voltage may be stopped by supplying the ground potential GND instead of the high power supply potential VDD. For example, the ground potential is supplied through a terminal shown in FIG. 7A. Note that when the transistor 631 is off, the back gate of the transistor 631 may be supplied with a negative power supply potential, so that the transistor 631 is kept off.

Then, in a recovery period immediately before a normal operation period, the supply of the power supply voltage to the register is restarted; then, the supply of the clock signal CLK is restarted, and after that, the supply of the reset signal RST is restarted. At this time, before the supply of the clock signal CLK is restarted, the wiring which is to be supplied with the clock signal CLK is set to the high power supply potential VDD. Moreover, in accordance with a pulse of the read control signal RD, the transistor 633 is turned off, the transistor 634 is turned on, and the data signal stored in the memory circuit 652 is output to the selector 653. The selector 653 outputs the data signal to the memory circuit 651 in accordance with a pulse of the read control signal RD. Thus, the memory circuit 651 can be returned to a state just before the power stop period.

Then, in a normal operation period, normal operation of the memory circuit 651 is performed again.

The above is an example of the method for driving the register illustrated in FIG. 7A.

Note that the structure of the register is not limited to that illustrated in FIG. 7A.

Figure 7B:
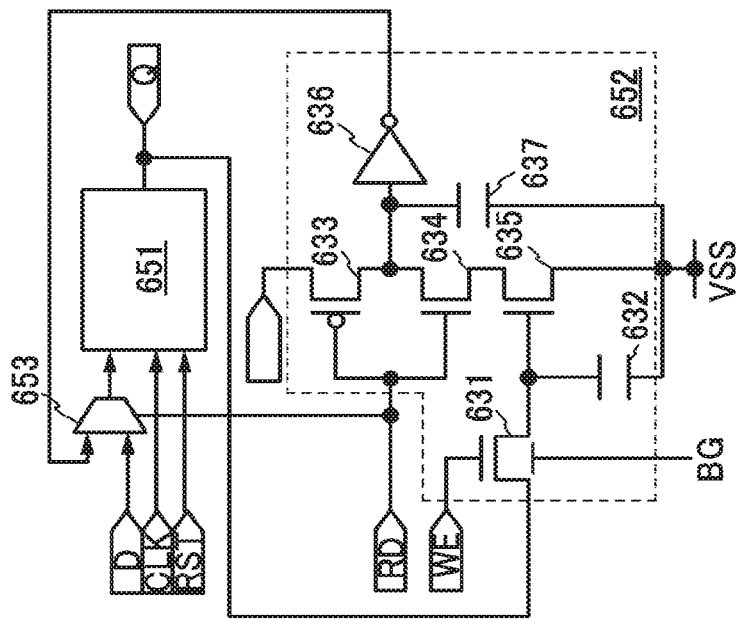

For example, the register illustrated in FIG. 7B has a structure in which the transistors 633 and 634, the inverter 636, and the capacitor 637 are removed from the register illustrated in FIG. 7A and a selector 654 is added to the register illustrated in FIG. 7A. For the same components as those in the register illustrated in FIG. 7A, the description of the register in FIG. 7A is referred to as appropriate.

One of the source and the drain of the transistor 635 is connected to the input terminal of the selector 653.

In the selector 654, the low power supply potential VSS to be data or the data signal output from the memory circuit 651 is selected in accordance with the write control signal WE2, and input to the memory circuit 652.

Next, an example of a method for driving the register illustrated in FIG. 7B will be described.

First, in a normal operation period, the register is supplied with the power supply voltage, the reset signal RST, and the clock signal CLK. At this time, the selector 653 outputs data of the data signal D to the memory circuit 651. The memory circuit 651 stores the data of the data signal D that is input in accordance with the clock signal CLK. In addition, the selector 654 outputs the low power supply potential VSS to the memory circuit 652 in accordance with the write control signal WE2. In the memory circuit 652, the transistor 631 is turned on in response to a pulse of the write control signal WE, and the low power supply potential VSS is stored as data in the memory circuit 652.

Then, in a backup period provided immediately before the supply of the power source voltage is stopped, the selector 654 does not supply the low power supply potential VSS but provides electrical conduction between the output terminal of the volatile memory circuit 651 and one of the source and the drain of the transistor 631 in accordance with the write control signal WE2. Further, in accordance with a pulse of the write control signal WE, the transistor 631 is turned on, the data of the data signal D is stored in the memory circuit 652, and the transistor 631 is turned off. At this time, the data of the memory circuit 652 is rewritten only when the potential of the data signal D is equal to the high power supply potential VDD. Furthermore, the supply of the clock signal CLK to the register is stopped, and then, the supply of the reset signal RST to the register is stopped. Note that when the transistor 631 is on, the back gate of the transistor 631 may be supplied with a positive power supply potential.

Next, in a power stop period, the supply of the power supply voltage to the register is stopped. During this period, the stored data is held in the memory circuit 652 because the off-state current of the transistor 631 is low. Note that the supply of the power supply voltage may be stopped by supplying the ground potential GND instead of the high power supply potential VDD. Note that when the transistor 631 is off, the back gate of the transistor 631 may be supplied with a negative power supply potential from a multiplexer, so that the transistor 631 is kept off.

Then, in a recovery period immediately before a normal operation period, the supply of the power supply voltage to the register is restarted; then, the supply of the clock signal CLK is restarted, and after that, the supply of the reset signal RST is restarted. At this time, before the supply of the clock signal CLK is restarted, the wiring which is to be supplied with the clock signal CLK is set to the high power supply potential VDD. In accordance with a pulse of the read control signal RD, the selector 653 outputs to the memory circuit 651 the data signal corresponding to the data stored in the memory circuit 652. Thus, the memory circuit 651 can be returned to a state just before the power stop period.

Then, in a normal operation period, normal operation of the memory circuit 651 is performed again.

The above is an example of the method for driving the register illustrated in FIG. 7B.

By using the structure illustrated in FIG. 7B, the data of the low power supply potential VSS does not need to be written in the backup period, resulting in an increase in operation speed.

In the case of using the above-described register in the registers 784 to 787, when Active mode shifts to Noff1 or Noff2 mode, prior to the block of power supply, data stored in the memory circuit 651 of the registers 784 to 787 is written to the memory circuit 652, so that data in the memory circuit 651 is reset to initial values; as a result, supply of power is blocked.

In the case where Noff1 or Noff2 mode is returned to Active mode, when power supply to the registers 784 to 787 is restarted, data in the memory circuit 651 is reset to initial values. Then, data in the memory circuit 652 is written to the memory circuit 651.

Accordingly, even in the low power consumption mode, data needed for processing of the circuit 203 is stored in the registers 784 to 787, and thus, the circuit 203 can return from the low power consumption mode to Active mode immediately. Accordingly, power consumption of the circuit 203 can be reduced.

[3. Memory]

An example of a memory available in one embodiment of the present invention will be described. The memory can be used in the memory 712 in FIG. 6, for example. A memory including a transistor that uses an oxide film can be used as the memory for storing capacity before the shipping of a power storage device (maximum capacity).

[3.1. SRAM]

Here, a static random access memory (SRAM), which is a memory including a flip-flop to which a circuit of an inverter is applied, will be described.

An SRAM retains data by using a flip-flop. Thus, unlike a dynamic random access memory (DRAM), an SRAM does not require refresh operation. Therefore, power consumption during data retention can be reduced. In addition, an SRAM does not require a capacitor and is therefore suitable for applications where high speed operation is required.

Figure 8:
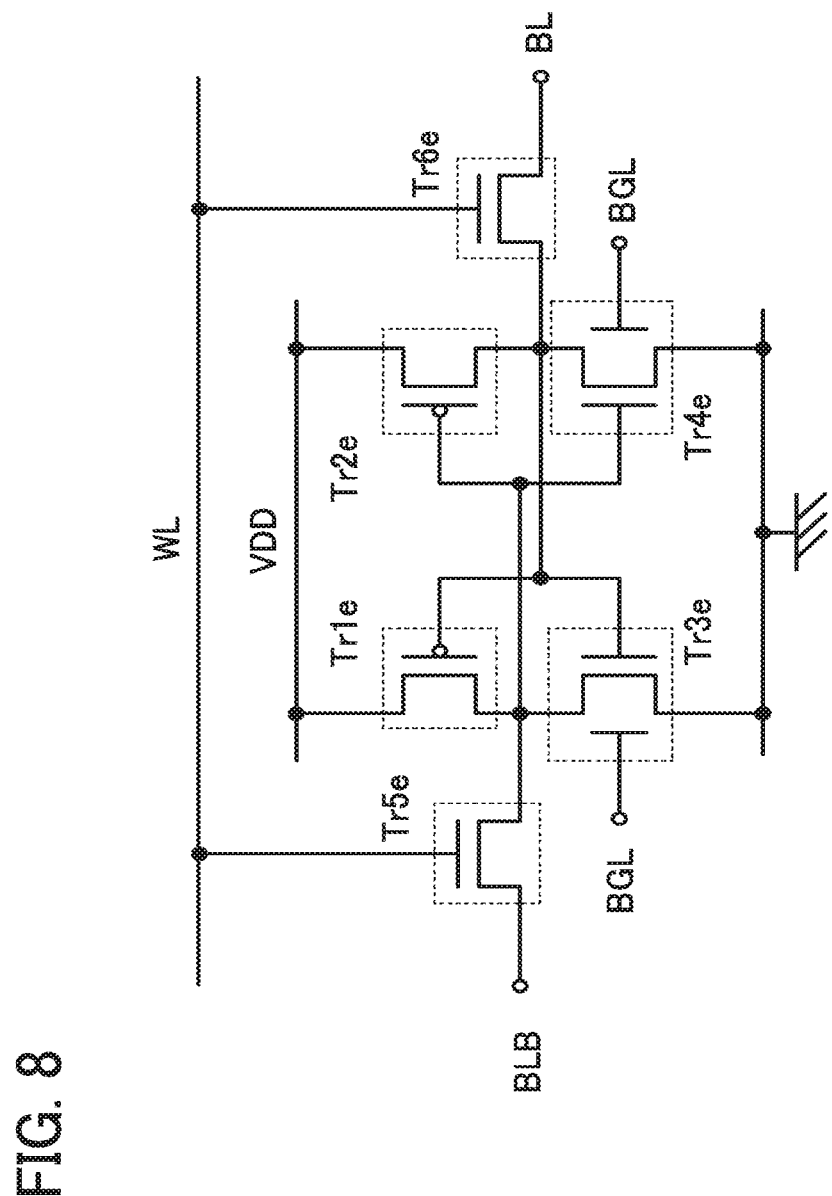
FIG. 8 illustrates a memory.

FIG. 8 is a circuit diagram corresponding to a memory cell of an SRAM in one embodiment of the present invention. Note that FIG. 8 illustrates only one memory cell; one embodiment of the present invention can also be applied to a memory cell array in which a plurality of such memory cells is arranged.

The memory cell illustrated in FIG. 8 includes a transistor Tr1e, a transistor Tr2e, a transistor Tr3e, a transistor Tr4e, a transistor Tr5e, and a transistor Tr6e. The transistors Tr1e and Tr2e are p-channel transistors. The transistors Tr3e and Tr4e are n-channel transistors. A gate of the transistor Tr1e is electrically connected to a drain of the transistor Tr2e, a gate of the transistor Tr3e, a drain of the transistor Tr4e, and one of a source and a drain of the transistor Tr6e. VDD is supplied to a source of the transistor Tr1e. A drain of the transistor Tr1e is electrically connected to a gate of the transistor Tr2e, a drain of the transistor Tr3e, and one of a source and a drain of the transistor Tr5e. VDD is supplied to a source of the transistor Tr2e. GND is supplied to a source of the transistor Tr3e. A back gate of the transistor Tr3e is electrically connected to a back gate line BGL. GND is supplied to a source of the transistor Tr4e. A back gate of the transistor Tr4e is electrically connected to the back gate line BGL. A gate of the transistor Tr5e is electrically connected to a word line WL. The other of the source and the drain of the transistor Tr5e is electrically connected to a bit line BLB. A gate of the transistor Tr6e is electrically connected to the word line WL. The other of the source and the drain of the transistor Tr6c is electrically connected to a bit line BL.

Here, shown is an example where n-channel transistors are used as the transistors Tr5e and Tr6e. However, the transistors Tr5e and Tr6e are not limited to n-channel transistors and may be p-channel transistors. In that case, writing, retaining, and reading methods described below may be changed as appropriate.

Thus, a flip-flop has a structure in which an inverter including the transistors Tr1e and Tr3e and an inverter including the transistors Tr2e and Tr4e are connected in a ring.

The p-channel transistors may be, but are not limited to, transistors including silicon, for example. The n-channel transistors may each be the transistor including an oxide film described later.

Here, the transistors Tr3e and Tr4e may each be the transistor including an oxide film. In addition, with an extremely low off-state current, the transistor has an extremely low flow-through current.

Note that instead of the p-channel transistors, n-channel transistors may be applied to the transistors Tr1e and Tr2e. In the case where n-channel transistors are used as the transistors Tr1e and Tr2e, depletion transistors may be employed.

Writing, retaining, and reading operation of the memory cell illustrated in FIG. 8 will be described below.

In writing, first, a potential corresponding to data 0 or data 1 is applied to the bit line BL and the bit line BLB.

For example, in the case where data 1 is to be written, the high power supply potential VDD is applied to the bit line BL and the ground potential GND is applied to the bit line BLB. Then, a potential (VH) higher than or equal to the sum of the high power supply potential VDD and the threshold voltage of the transistors Tr5e and Tr6e is applied to the word line WL.

Next, the potential of the word line WL is set to be lower than the threshold voltage of the transistors Tr5e and Tr6e, whereby the data 1 written to the flip-flop is retained. In the case of the SRAM, a current flowing during retention of data is only the leakage current of the transistors. Here, when the above-described transistor with low off-state current is applied to some of the transistors in the SRAM, stand-by power for retaining data is reduced.

In reading, the high power supply potential VDD is applied to the bit line BL and the bit line BLB in advance. Then, the VH is applied to the word line WL, so that the bit line BLB is discharged through the transistors Tr5e and Tr3e to be equal to the ground potential GND, while the potential of the bit line BL is kept at the high power supply potential VDD. The potential difference between the bit line BL and the bit line BLB is amplified by a sense amplifier (not illustrated), whereby the retained data 1 can be read.

In the case where data 0 is to be written, the ground potential GND is applied to the bit line BL and the high power supply potential VDD is applied to the bit line BLB; then, the VH is applied to the word line WL. Next, the potential of the word line WL is set to be lower than the threshold voltage of the transistors Tr5e and Tr6c, whereby the data 0 written to the flip-flop is retained. In reading, the high power supply potential VDD is applied to the bit line BL and the bit line BLB in advance. Then, the VH is applied to the word line WL, so that the bit line BL is discharged through the transistors Tr6e and Tr4c to be equal to the ground potential GND, while the potential of the bit line BLB is kept at the high power supply potential VDD. The potential difference between the bit line BL and the bit line BLB is amplified by the sense amplifier, whereby the retained data 0 can be read.

In the above-described manner, an SRAM with low stand-by power can be provided.

[3.2. DOSRAM]

A transistor including an oxide film in one embodiment of the present invention can have extremely low off-state current. That is, the transistor has electrical characteristics in which leakage of charge through the transistor is unlikely to occur. As a memory to which a transistor having such electrical characteristics is applied and which includes a memory element that is superior in function to a known memory element, a dynamic oxide semiconductor random access memory (DOSRAM) will be described below. DOSRAM is a memory that uses the above-described transistor with low off-state current as a selection transistor (a transistor serving as a switching element) of a memory cell.

Figure 9A:
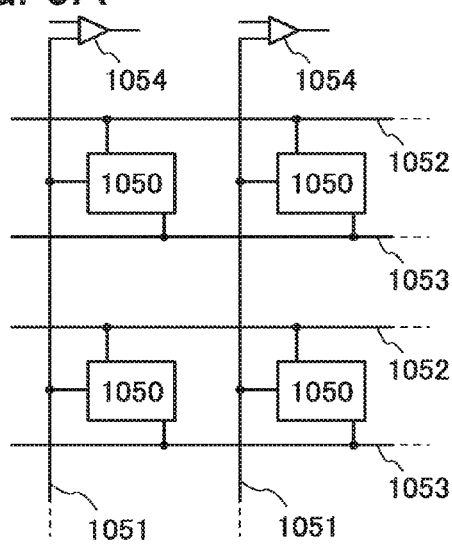
FIGS. 9A and 9B illustrate a memory.
Figure 9B:
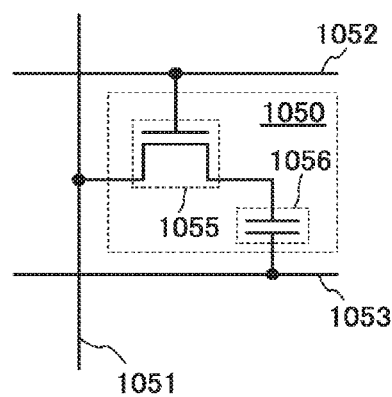

First, the memory will be specifically described with reference to FIGS. 9A and 9B. FIG. 9A is a circuit diagram showing a memory cell array of the memory. FIG. 9B is a circuit diagram of a memory cell.

The memory cell array in FIG. 9A includes a plurality of memory cells 1050, a plurality of bit lines 1051, a plurality of word lines 1052, a plurality of capacitor lines 1053, and a plurality of sense amplifiers 1054.

Note that the bit lines 1051 and the word lines 1052 are provided in a grid pattern, and the memory cell 1050 is provided for each intersection of the bit line 1051 and the word line 1052. The bit lines 1051 are connected to the sense amplifiers 1054, which have a function of reading the potentials of the bit lines 1051 as data.

As shown in FIG. 9B, the memory cell 1050 includes a transistor 1055 and a capacitor 1056. A gate of the transistor 1055 is electrically connected to the word line 1052. A source of the transistor 1055 is electrically connected to the bit line 1051. A drain of the transistor 1055 is electrically connected to one terminal of the capacitor 1056. The other terminal of the capacitor 1056 is electrically connected to the capacitor line 1053.

Figure 10:
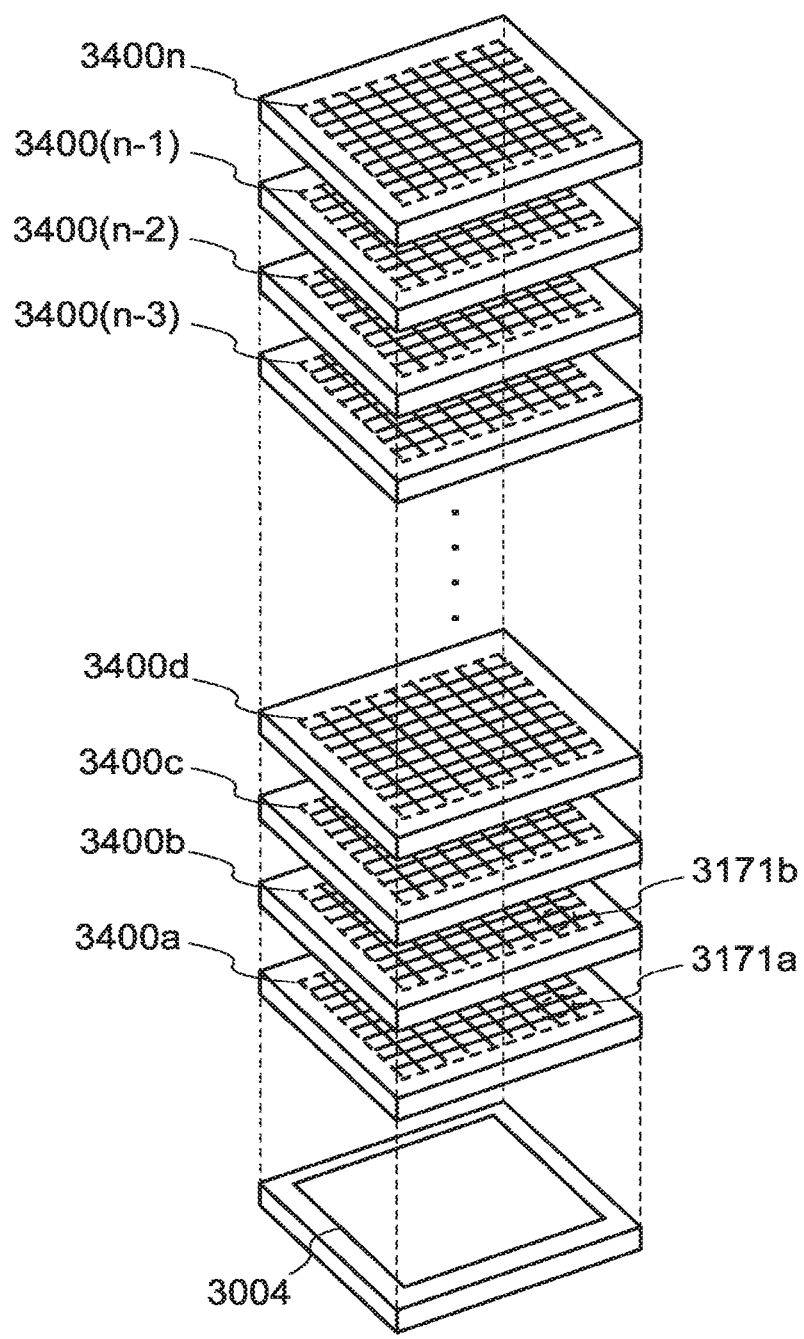
FIG. 10 illustrates a memory.

FIG. 10 is a perspective view of a memory. The memory illustrated in FIG. 10 includes a plurality of layers of memory cell arrays (memory cell arrays 3400a to 3400n (n is an integer greater than or equal to 2)) each including a plurality of memory cells as memory circuits in the upper portion, and a logic circuit 3004 which is necessary for operating the memory cell arrays 3400a to 3400n, in the lower portion.

A voltage retained in the capacitor 1056 gradually decreases with time due to leakage through the transistor 1055. A voltage originally charged from V0 to V1 is decreased with time to VA that is a limit for reading out data 1. This period is called a retention period T_1. In the case of a two-level memory cell, refresh operation needs to be performed within the retention period T_1.

For example, in the case where the off-state current of the transistor 1055 is not sufficiently small, the retention period T_1 becomes short because the voltage retained in the capacitor 1056 significantly changes with time. Accordingly, refresh operation needs to be frequently performed. An increase in frequency of refresh operation increases power consumption of the memory.

Since the off-state current of the transistor 1055 is extremely small in this embodiment, the retention period T_1 can be made extremely long. In other words, the frequency of refresh operation can be reduced; thus, power consumption can be reduced. For example, in the case where a memory cell is formed using the transistor 1055 having an off-state current of $1 \times 10^{-21}$ A to $1 \times 10^{-25}$ A, data can be retained for several days to several decades without supply of electric power.

As described above, according to one embodiment of the present invention, a memory with high degree of integration and low power consumption can be provided.

[3.3. NOSRAM]

Next, a non-volatile oxide semiconductor random access memory (NOSRAM) is described as a memory that is different from the memories shown in FIG. 8 and FIG. 10. NOSRAM is a memory that uses the transistor with low off-state current as a selection transistor of a memory cell (a transistor serving as a switching element) and a transistor including a silicon material or the like as an output transistor of the memory cell.

Figure 11A:
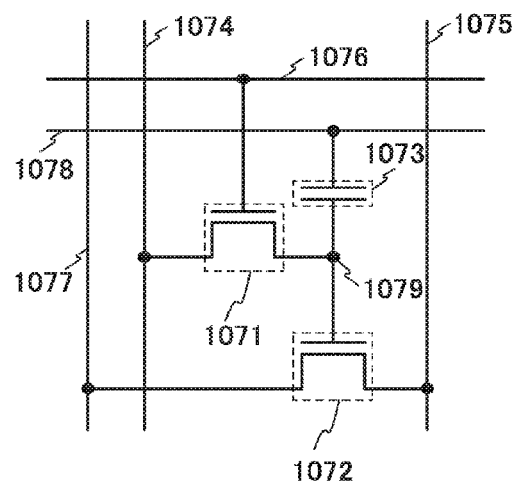
FIGS. 11A and 11B are diagrams for explaining a memory.
Figure 11B:
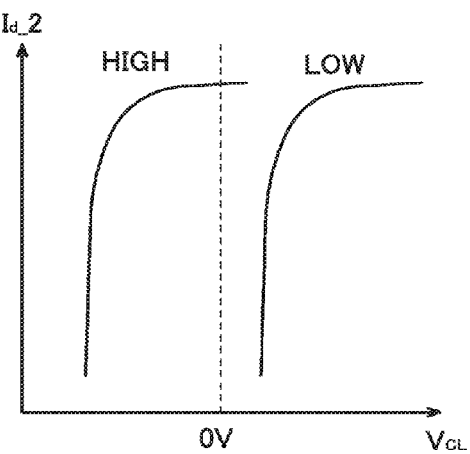

FIG. 11A is a circuit diagram showing a memory cell and wirings included in the memory. FIG. 11B is a graph showing the electrical characteristics of the memory cell in FIG. 11A.

As shown in FIG. 11A, the memory cell includes a transistor 1071, a transistor 1072, and a capacitor 1073. Here, a gate of the transistor 1071 is electrically connected to a word line 1076. A source of the transistor 1071 is electrically connected to a source line 1074. A drain of the transistor 1071 is electrically connected to a gate of the transistor 1072 and one terminal of the capacitor 1073, and this portion is referred to as a node 1079. A source of the transistor 1072 is electrically connected to a source line 1075. A drain of the transistor 1072 is electrically connected to a drain line 1077. The other terminal of the capacitor 1073 is electrically connected to a capacitor line 1078.

The memory illustrated in FIGS. 11A and 11B utilizes variation in the apparent threshold voltage of the transistor 1072, which depends on the potential of the node 1079. For example, FIG. 11B shows a relation between a voltage $V_{CL}$ of the capacitor line 1078 and a drain current $I_d\_2$ flowing through the transistor 1072.

Note that the potential of the node 1079 can be controlled through the transistor 1071. For example, the potential of the source line 1074 is set to a high power supply potential VDD. In this case, when the potential of the word line 1076 is set to be higher than or equal to the sum of the high power supply potential VDD and the threshold voltage Vth of the transistor 1071, the potential of the node 1079 can be HIGH. Further, when the potential of the word line 1076 is set to be lower than or equal to the threshold voltage Vth of the transistor 1071, the potential of the node 1079 can be LOW.

Thus, the transistor 1072 has electrical characteristics shown with either a $V_{CL}$-$I_d\_2$ curve denoted as LOW or a $V_{CL}$-$I_d\_2$ curve denoted as HIGH. That is, when the potential of the node 1079 is LOW, I_2 is small at a $V_{CL}$ of 0 V; accordingly, data 0 is stored. Further, when the potential of the node 1079 is HIGH, $I_d\_2$ is large at a $V_{CL}$ of 0 V; accordingly, data 1 is stored. In this manner, data can be stored.

By using the transistor with low off-state current as the transistor 1071, data retention time can be lengthened. The transistor 1072 prevents loss of data in data reading and thereby enables repetitive data reading.

[4. Coulomb Counter]

Here, a coulomb counter that measures and outputs charge-discharge capacity of a power storage device in the unit of coulomb will be described.

Figure 12:
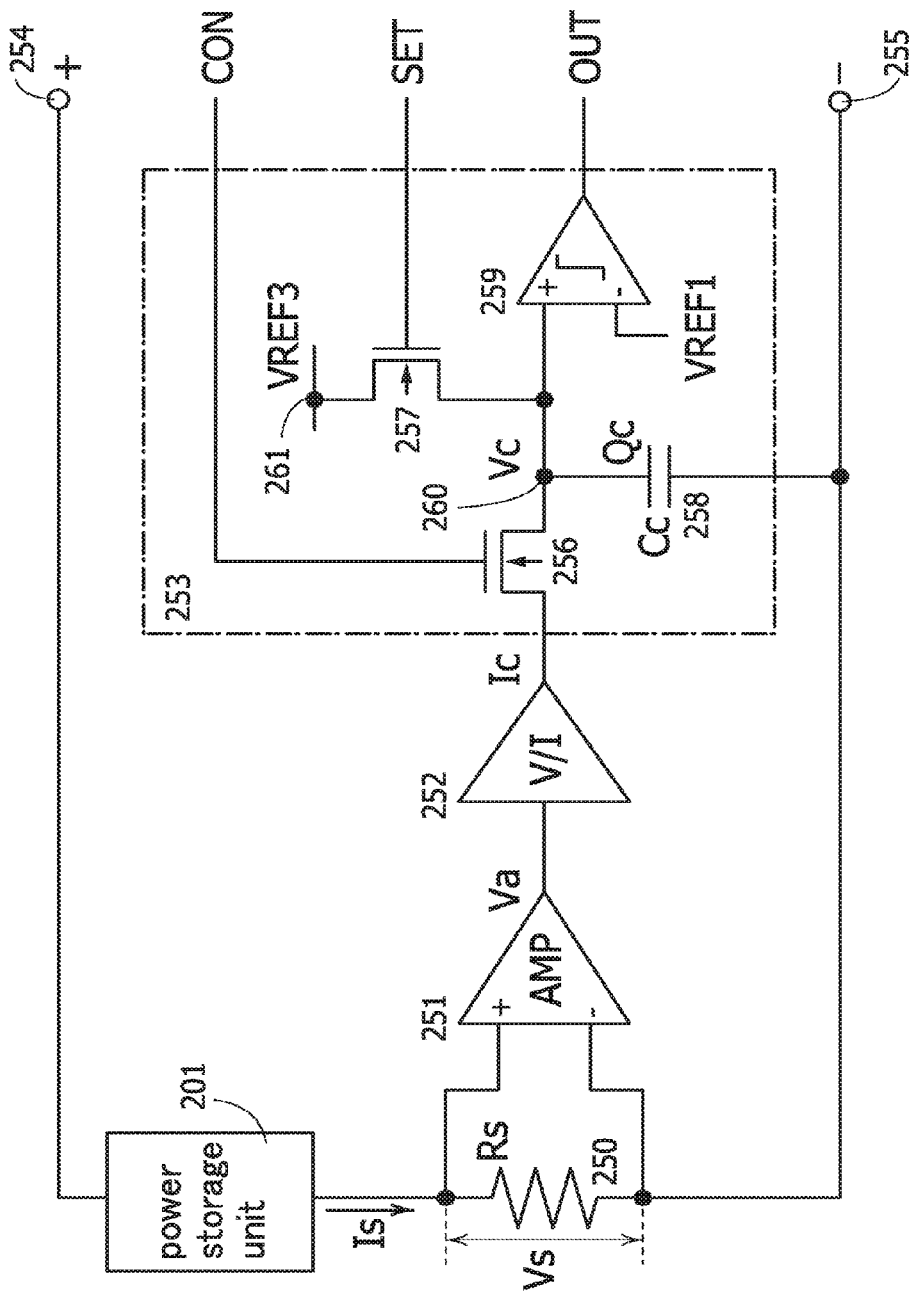
FIG. 12 illustrates a coulomb counter.

FIG. 12 is a circuit diagram of a configuration example of a coulomb counter. The coulomb counter includes a resistor 250, an amplifier circuit 251, a voltage-current converter circuit 252, and an integrating circuit 253. The coulomb counter has a function of determining the amount of electric charges output from the power storage unit 201 that is a measurement target, on the basis of a current Is flowing through the resistor 250. The power storage unit 201 is connected to a high-potential terminal 254 and a low-potential terminal 255.

The amplifier circuit 251 has functions of amplifying a voltage between two input terminals and outputting the amplified voltage. When the current Is flows, a voltage Vs (=Is×Rs) is generated across the resistor 250. The voltage Vs is applied between a non-inverting input terminal and an inverting input terminal of the amplifier circuit 251. The amplifier circuit 251 has a function of amplifying the voltage Vs to generate a voltage Va. The voltage Va is proportional to the voltage Vs.

The voltage-current converter circuit 252 (V/I) has functions of converting an input voltage into a current and outputting the current. Here, the voltage-current converter circuit 252 converts the voltage Va into a current Ic. The current Ic is proportional to the voltage Va.

The integrating circuit 253 has a function of generating a signal in accordance with electric charges Qc supplied by the input current Ic. The integrating circuit 253 includes a transistor 256, a transistor 257, a capacitor 258, and a comparator 259.

The transistor 256 functions as a switch to control connection between a terminal of the capacitor 258 (a node 260) and an output of the voltage-current converter circuit 252. On/off of the transistor 256 is controlled by a signal CON input to a gate of the transistor 256.

The transistor 257 functions as a switch to connect the node 260 and a node 261 to which a reference voltage VREF3 is input. Thus, the transistor 257 can function as a reset circuit that resets a voltage Vc at the node 260. On/off of the transistor 257 is controlled by a signal SET input to a gate of the transistor 257. While the transistor 257 is on, the node 260 is connected to the node 261, and thus the voltage Vc is constant and is equal to the reference voltage VREF3 if voltage drop due to the transistor 257 or the like is ignored.

A circuit for resetting the potential of the node 260 (the transistor 257) is provided as needed.

The transistor 256 and the capacitor 258 have a function of a sample-and-hold circuit. When the transistor 256 is turned on, the current Ic is input to the node 260 from the voltage-current converter circuit 252, so that the capacitor 258 is charged (sampling operation). When the transistor 257 is turned off, the node 260 is brought into an electrically floating state so that electric charges Qc are held in the capacitor 258 (holding operation).

The voltage Vc at the node 260 is proportional to the electric charges Qc held in the capacitor 258 and the electric charges Qc are proportional to the current Ic; thus, data corresponding to the amount of electric charges flowing through the resistor 250 can be obtained from the output signal from the node 260 (the voltage Vc) or a signal corresponding to the voltage Vc. Thus, the charge capacity or remaining capacity of the power storage unit 201 can be obtained from such a signal.

The voltage Vc is output as an output signal OUT from the coulomb counter through the comparator 259. A non-inverting input terminal of the comparator 259 is connected to the node 260 (the terminal of the capacitor 258), and a potential VREF1 is input to an inverting input terminal of the comparator 259. The comparator 259 outputs a signal OUT at a high level when the voltage Vc is higher than a reference voltage, and outputs the signal OUT at a low level when the voltage Vc is lower than the reference voltage.

As the comparator 259, a hysteresis comparator with high noise immunity is preferably used. The use of a hysteresis comparator allows prevention of frequent switching of the potential of the output signal OUT due to an influence of noise.

Although in the integrating circuit 253, the comparator 259 is used as an analog circuit that generates a signal corresponding to the voltage Vc, such an analog circuit is not limited to the comparator 259. For example, an analog-digital converter circuit, an amplifier circuit, or the like can be used as such an analog circuit.

An output signal of the coulomb counter is not limited to the output signal OUT from the comparator 259. For example, the voltage Vc at the node 260 can be output as a signal. In this case, an amplifier circuit is connected to the node 260 so that an amplified voltage of the amplifier circuit can be output as the output signal.

With the use of this coulomb counter, the capacity of the power storage unit in the power storage device can be determined. In particular, in the case of using an active material that exhibits two-phase reaction in a positive electrode of the power storage unit, owing to the plateau region in the potential variations, the capacity of the power storage unit cannot be obtained by measurement of the voltage of the power storage unit. Therefore, the above-described coulomb counter capable of measuring the charge capacity is appropriate, for that case.

[5. Structural Example of Semiconductor Device]

Structural examples of a semiconductor device used in the above-described control circuit, the memory, the coulomb counter, and the like will be described.

[5.1. Structure of Transistor]

First, examples of the structure of a transistor that can be used in the semiconductor device are described.

Note that the structure of the transistor is not particularly limited and can be selected as appropriate. As the structure of the transistor, a staggered type or a planar type having a bottom gate structure which is described below can be employed. The transistor may have a single-gate structure in which one channel formation region is formed or a multi-gate structure such as a double-gate structure in which two channel formation regions are formed or a triple-gate structure in which three channel formation regions are formed. In addition, the transistor may have a structure in which two gate electrodes are provided above and below a channel formation region with gate insulating films provided therebetween (in this specification, this structure is referred to as a dual-gate structure).

[5.1.1. Bottom-Gate Structure]

Figure 13A:
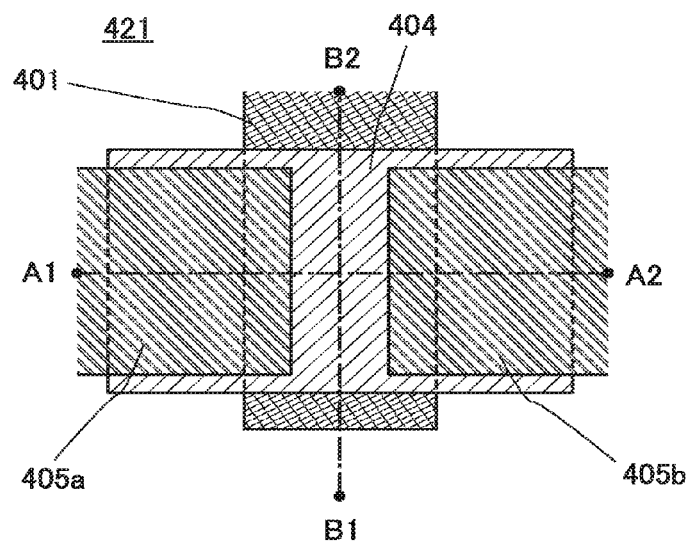
FIGS. 13A to 13C illustrate a structural example of a transistor.
Figure 13C:
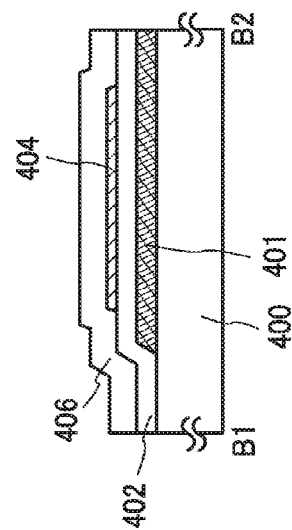
Figure 13B:
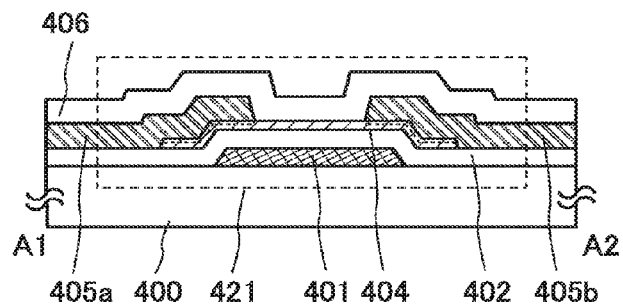

FIGS. 13A to 13C illustrate a structural example of a transistor 421 having a bottom-gate top-contact structure, which is one kind of bottom-gate transistor. FIG. 13A is a plan view of the transistor 421. FIG. 13B is a cross-sectional view taken along the long dashed short dashed line A1-A2 in FIG. 13A. FIG. 13C is a cross-sectional view taken along the long dashed short dashed line B1-B2 in FIG. 13A.

The transistor 421 includes a gate electrode 401 provided over a substrate 400 having an insulating surface, a gate insulating film 402 provided over the gate electrode 401, an oxide film 404 overlapping with the gate electrode 401 with the gate insulating film 402 provided therebetween, and a source electrode 405a and a drain electrode 405b provided in contact with the oxide film 404. In addition, an insulating film 406 is provided so as to cover the source electrode 405a and the drain electrode 405b and be in contact with the oxide film 404. Note that the substrate 400 may be a substrate over which another element is formed.

Note that in the oxide film 404, a region in contact with the source electrode 405a and a region in contact with the drain electrode 405b may include an n-type region 403.

[5.1.2. Top-Gate Structure]

Figure 14A:
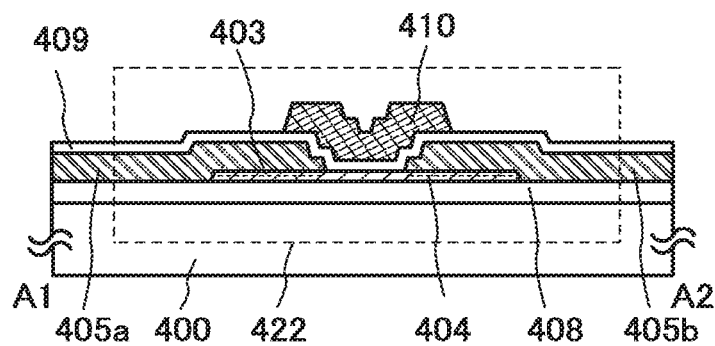
FIGS. 14A and 14B illustrate structural examples of a transistor.

FIG. 14A illustrates a transistor 422 having a top-gate structure.

The transistor 422 includes an insulating film 408 provided over a substrate 400 having an insulating surface, an oxide film 404 provided over the insulating film 408, a source electrode 405a and a drain electrode 405b provided in contact with the oxide film 404, a gate insulating film 409 provided over the oxide film 404, the source electrode 405a, and the drain electrode 405b, and a gate electrode 410 overlapping with the oxide film 404 with the gate insulating film 409 provided therebetween.

Note that in the oxide film 404, a region in contact with the source electrode 405a and a region in contact with the drain electrode 405b may include an n-type region 403.

[5.1.3. Dual-Gate Structure]

Figure 14B:
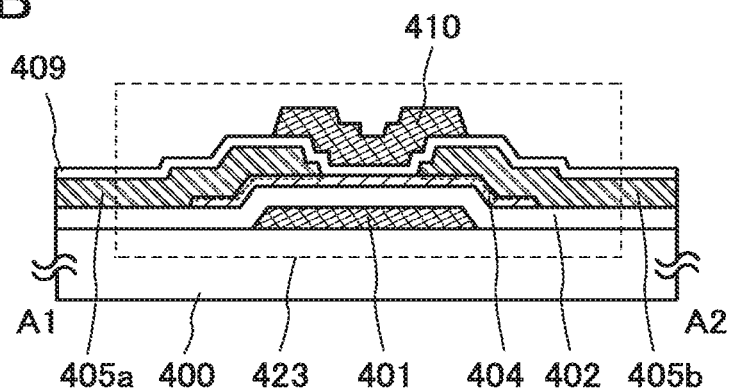

FIG. 14B illustrates a transistor 423 having a dual-gate structure, which includes two gate electrodes above and below a channel formation region with gate insulating films provided therebetween.

The transistor 423 includes a gate electrode 401 provided over a substrate 400 having an insulating surface, a gate insulating film 402 provided over the gate electrode 401, an oxide film 404 overlapping with the gate electrode 401 with the gate insulating film 402 provided therebetween, a source electrode 405a and a drain electrode 405b provided in contact with the oxide film 404, a gate insulating film 409 covering the source electrode 405a and the drain electrode 405b and in contact with the oxide film 404, and a gate electrode 410 overlapping with the oxide film 404 with the gate insulating film 409 provided therebetween.

Note that in the oxide film 404, a region in contact with the source electrode 405a and a region in contact with the drain electrode 405b may include an n-type region 403.

[5.2. Components of Transistor]

Components of the transistors will be described.

[5.1.2. Conductive Layer]

As the gate electrode 401 and the gate electrode 410, a layer including Al, Cr, Cu, Ta, Ti, Mo, W, or the like can be used, for example.

As the source electrode 405a and the drain electrode 405b, a layer including Al, Cr, Cu, Ta, Ti, Mo, W, or the like can be used, for example.

[5.2.2. Insulating Layer]

As the gate insulating film 402, the insulating film 406, and the gate insulating film 409, a silicon oxide film, a silicon oxynitride film, a silicon nitride oxide film, a silicon nitride film, a gallium oxide film, an aluminum oxide film, an aluminum nitride film, or an aluminum oxynitride film can be used.

[5.2.3. Oxide Film]

Next, a material that can be used as the oxide film 404 is described.

[5.2.3.1. Single-Layer Film]

The oxide film 404 can be an In-based metal oxide film, a Zn-based metal oxide film, an In—Zn-based metal oxide film, an In—Ga—Zn-based metal oxide film, or the like, for example.

Alternatively, a metal oxide including another metal element instead of part or all of Ga in the In—Ga—Zn-based metal oxide may be used. As the aforementioned another metal element, a metal element that is capable of being bonded to oxygen atoms more than gallium is can be used, for example, and specifically one or more elements of titanium, zirconium, hafnium, germanium, and tin can be used, for instance. Alternatively, as the aforementioned another metal element, one or more elements of lanthanum, cerium, praseodymium, neodymium, samarium, europium, gadolinium, terbium, dysprosium, holmium, erbium, thulium, ytterbium, and lutetium may be used. These metal elements have a function as a stabilizer. Note that the amount of such a metal element added is determined so that the metal oxide can function as a semiconductor. When a metal element that is capable of being bonded to oxygen atoms more than gallium is used and oxygen is supplied to a metal oxide, oxygen defects in the metal oxide can be reduced.

Specifically, the concentration of hydrogen in the oxide film can be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$ in secondary ion mass spectrometry (SIMS).

The concentration of nitrogen in the oxide film can be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

The concentration of carbon in the oxide film can be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

The concentration of silicon in the oxide film can be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The amount of each of the following gas molecules (atoms) released from the oxide film is preferably less than or equal to $1\times10^{19}$/cm$^3$, and further preferably less than or equal to $1\times10^{18}$/cm$^3$, by thermal desorption spectroscopy (TDS) analysis: a gas molecule (atom) having a mass-to-charge ratio (m/z) of 2 (e.g., hydrogen molecule), a gas molecule (atom) having a m/z of 18, a gas molecule (atom) having a m/z of 28, and a gas molecule (atom) having a m/z of 44.

For example, an oxide semiconductor film can be used as the oxide film 404.

As described in this embodiment, an oxide is provided in contact with an oxide semiconductor to form an oxide stack including the oxide semiconductor and the oxide, whereby it is possible to prevent an impurity such as hydrogen or moisture or an impurity contained in an insulating film in contact with the oxide semiconductor film and forming a carrier.

The use of the oxide stack in the transistor makes it possible to decrease the off-state current of the transistor. This transistor including the oxide stack can be used as the transistor with low off-state current.

As described above, according to one embodiment of the present invention, a memory with high degree of integration and low power consumption can be provided.

[6. Power Storage Device]

As an example of a power storage device, a nonaqueous secondary battery typified by a lithium-ion secondary battery is described.

[6.1. Positive Electrode]

Figure 15A:
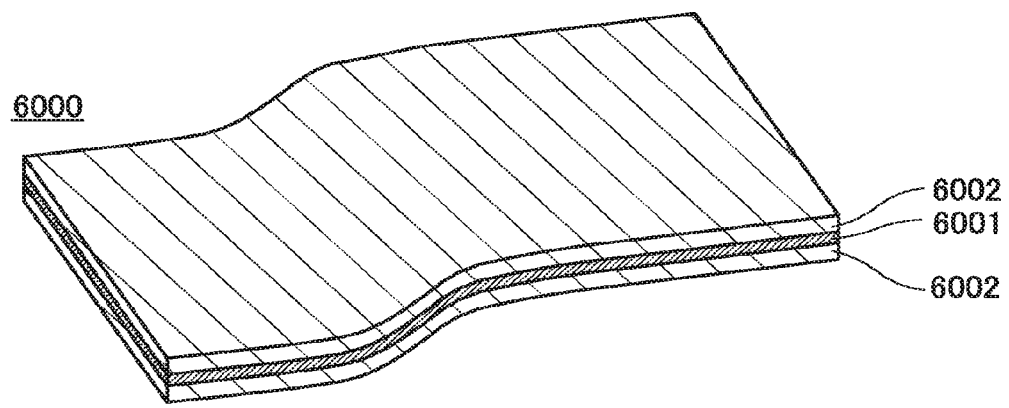
FIGS. 15A and 15B illustrate a positive electrode.

First, a positive electrode of the power storage device is described with reference to FIGS. 15A and 15B.

A positive electrode 6000 includes a positive electrode current collector 6001 and a positive electrode active material layer 6002 formed over the positive electrode current collector 6001 by a coating method, a CVD method, a sputtering method, or the like, for example. Although an example of providing the positive electrode active material layer 6002 on both surfaces of the positive electrode current collector 6001 with a sheet shape (or a strip-like shape) is illustrated in FIG. 15A, one embodiment of the present invention is not limited to this example. The positive electrode active material layer 6002 may be provided on one of the surfaces of the positive electrode current collector 6001. Further, although the positive electrode active material layer 6002 is provided entirely over the positive electrode current collector 6001 in FIG. 15A, one embodiment of the present invention is not limited thereto. The positive electrode active material layer 6002 may be provided over part of the positive electrode current collector 6001. For example, a structure may be employed in which the positive electrode active material layer 6002 is not provided in a portion where the positive electrode current collector 6001 is connected to a positive electrode tab.

The positive electrode current collector 6001 can be formed using a material that has high conductivity and is not alloyed with a carrier ion of lithium or the like, such as stainless steel, gold, platinum, zinc, iron, copper, aluminum, or titanium, an alloy thereof, or the like. Alternatively the positive electrode current collector 6001 can be formed using an aluminum alloy to which an element which improves heat resistance, such as silicon, titanium, neodymium, scandium, or molybdenum, is added. Further alternatively, the positive electrode current collector 6001 may be formed using a metal element which forms silicide by reacting with silicon. Examples of the metal element which forms silicide by reacting with silicon are zirconium, titanium, hafnium, vanadium, niobium, tantalum, chromium, molybdenum, tungsten, cobalt, and nickel. The positive electrode current collector 6001 can have a foil shape, a plate (sheet) shape, a net shape, a punching-metal shape, an expanded-metal shape, or the like as appropriate. The positive electrode current collector 6001 preferably has a thickness of greater than or equal to 10 μm and less than or equal to 30 μm.

Figure 15B:
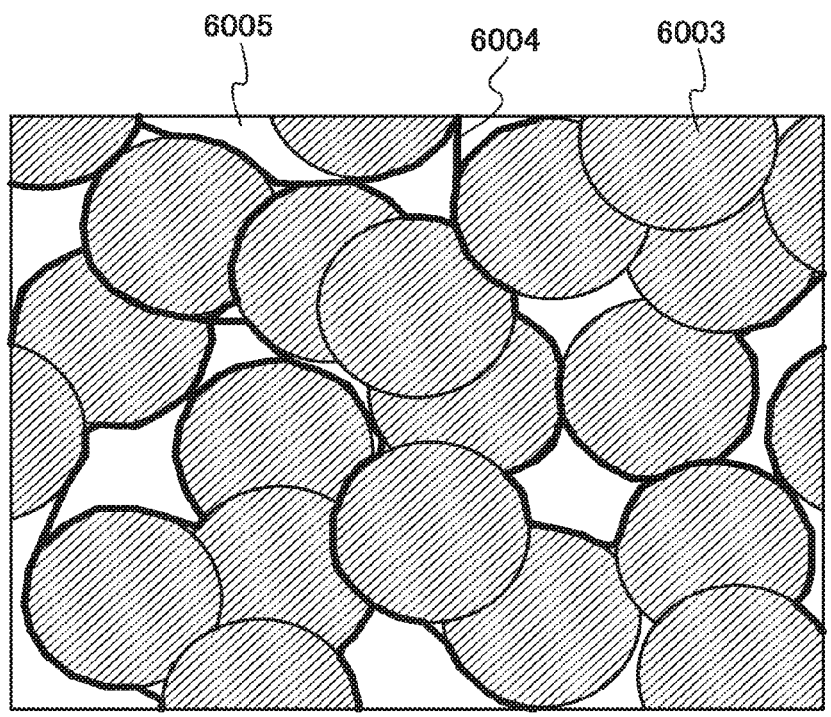

FIG. 15B is a schematic view illustrating the longitudinal cross-sectional view of the positive electrode active material layer 6002. The positive electrode active material layer 6002 includes particles of the positive electrode active material 6003, graphene 6004 as a conductive additive, and a binder 6005.

Examples of the conductive additive are acetylene black (AB), ketjen black, graphite (black lead) particles, and carbon nanotubes in addition to graphene described later. Here, the positive electrode active material layer 6002 using the graphene 6004 is described as an example.

The positive electrode active material 6003 is in the form of particles made of secondary particles having average particle diameter and particle diameter distribution, which is obtained in such a way that material compounds are mixed at a predetermined ratio and baked and the resulting baked product is crushed, granulated, and classified by an appropriate means. For this reason, the positive electrode active material 6003 is schematically illustrated as spheres in FIG. 15B; however, the shape of the positive electrode active material 6003 is not limited to this shape.

As the positive electrode active material 6003, a material into/from which carrier ions such as lithium ions can be inserted and extracted is used.

For example, an olivine-type material (General formula: LiMPO$_4$; M is one or more of Fe(II), Mn(II), Co(II), and Ni(II)) can be used. Typical examples of the general formula LiMPO$_4$ which can be used as a positive electrode active material are lithium compounds such as LiFePO$_4$, LiNiPO$_4$, LiCoPO$_4$, LiMnPO$_4$, LiFe$_a$Ni$_b$PO$_4$, LiFe$_a$Co$_b$PO$_4$, LiFe$_a$Mn$_b$PO$_4$, LiNi$_a$Co$_b$PO$_4$, LiNi$_a$Mn$_b$PO$_4$ (a+b≤1, 0<a<1, and 0<b<1), LiFe$_c$Ni$_d$Co$_e$PO$_4$, LiFe$_c$Ni$_d$Mn$_e$PO$_4$, LiNi$_c$Co$_d$Mn$_e$PO$_4$ (c+d+e≤1, 0<c<1, 0<d<1, and 0<e<1), and LiFe$_f$Ni$_g$Co$_h$Mn$_i$PO$_4$ (f+g+h+i≤1, 0<f<1, 0<g<1, 0<h<1, and 0<i<1).

Alternatively, a composite oxide such as Li$_{(2-j)}$MSiO$_4$ (general formula) (M is one or more of Fe(I), Mn(II), Co(II), and Ni(II); 0≤j≤2)) can be used. Typical examples of the general formula Li$_{(2-j)}$MSiO$_4$ which can be used as a positive electrode active material are compounds such as Li$_{(2-j)}$FeSiO$_4$, Li$_{(2-j)}$NiSiO$_4$, Li$_{(2-j)}$CoSiO$_4$, Li$_{(2-j)}$MnSiO$_4$, Li$_{(2-j)}$Fe$_k$Ni$_l$SiO$_4$, Li$_{(2-j)}$Fe$_k$Co$_l$SiO$_4$, Li$_{(2-j)}$Fe$_k$Mn$_l$SiO$_4$, Li$_{(2-j)}$Ni$_k$Co$_l$SiO$_4$, Li$_{(2-j)}$Ni$_k$Mn$_l$SiO$_4$ (k+l≤1, 0<k<1, and 0<l<1), Li$_{(2-j)}$Fe$_m$Ni$_n$Co$_q$SiO$_4$, Li$_{(2-j)}$Fe$_m$Ni$_n$Mn$_q$SiO$_4$, Li$_{(2-j)}$Ni$_m$Co$_n$Mn$_q$SiO$_4$ (m+n+q≤1, 0<m<1, 0<n<1, and 0<q<1), and Li$_{(2-j)}$Fe$_r$Ni$_s$Co$_t$Mn$_u$SiO$_4$ (r+s+t+u≤1, 0<r<1, 0<s<1, 0<t<1, and 0<u<1).

Further alternatively, any of the following lithium-containing materials with a layered rock-salt crystal structure can be used: lithium cobalt oxide (LiCoO$_2$); LiNiO$_2$; LiMnO$_2$; Li$_2$MnO$_3$; a NiCo-containing material (general formula: LiNi$_x$Co$_{1-x}$O$_2$ (0<x<1)) such as LiNi$_{0.8}$Co$_{0.2}$O$_2$; a NiMn-containing material (general formula: LiNi$_x$Mn$_{1-x}$O$_2$ ($0<x<1$)) such as $LiNi_{0.5}Mn_{0.5}O_2$; and a NiMnCo-containing material (also referred to as NMC) (general formula: $LiNi_xMn_yCo_{1-x-y}O_2$ ($x>0$, $y>0$, and $x+y<1$)) such as $LiNi_{1/3}Mn_{1/3}Co_{1/3}O_2$.

Still further alternatively, for the positive electrode active material 6003, any of other various compounds, such as an active material having a spinel crystal structure (e.g., $LiMn_2O_4$) and an active material having an inverse spinel crystal structure (e.g., $LiMVO_4$) can be used.

In the case where carrier ions are alkali metal ions other than lithium ions or alkaline-earth metal ions, the following may be used as the positive electrode active material 6003: a compound or oxide which is obtained by substituting an alkali metal (e.g., sodium or potassium) or an alkaline-earth metal (e.g., calcium, strontium, barium, beryllium, or magnesium) for lithium in any of the above-described compounds or oxides.

Note that although not illustrated, a carbon layer may be provided on a surface of the positive electrode active material 6003. With a carbon layer, conductivity of an electrode can be increased. The positive electrode active material 6003 can be coated with the carbon layer by mixing a carbohydrate such as glucose at the time of baking the positive electrode active material.

In addition, the graphene 6004 which is added to the positive electrode active material layer 6002 as a conductive additive can be formed by performing reduction treatment on graphene oxide.

Here, graphene in this specification includes single-layer graphene or multilayer graphene including two to a hundred layers. The single-layer graphene refers to a sheet of one atomic layer of carbon molecules having a bonds. Further, graphene oxide in this specification refers to a compound formed by oxidation of graphene. When graphene oxide is reduced to form graphene, oxygen contained in the graphene oxide is not entirely extracted and part of the oxygen remains in the graphene in some cases. When the graphene contains oxygen, the ratio of the oxygen measured by X-ray photoelectron spectroscopy (XPS) in the graphene is higher than or equal to 2 atomic % and lower than or equal to 20 atomic %, preferably higher than or equal to 3 atomic % and lower than or equal to 15 atomic %.

In the case of multilayer graphene including graphene obtained by reducing graphene oxide, the interlayer distance of the graphene is greater than or equal to 0.34 nm and less than or equal to 0.5 nm, preferably greater than or equal to 0.38 nm and less than or equal to 0.42 nm, further preferably greater than or equal to 0.39 nm and less than or equal to 0.41 nm. In general graphite, the interlayer distance of single-layer graphene is 0.34 nm. Since the interlayer distance in the graphene used for the power storage device of one embodiment of the present invention is longer than that in the general graphite, carrier ions can easily transfer between layers of the graphene in the multilayer graphene.

Graphene oxide can be formed by an oxidation method called a Hummers method, for example.

The Hummers method is as follows: a sulfuric acid solution of potassium permanganate, a hydrogen peroxide solution, and the like are mixed into a graphite powder to cause oxidation reaction; thus, a dispersion liquid including graphite oxide is formed. Through the oxidation of carbon in graphite, functional groups such as an epoxy group, a carbonyl group, a carboxyl group, or a hydroxyl group are bonded in the graphite oxide. Accordingly, the interlayer distance between a plurality of pieces of graphene in the graphite oxide is longer than that in the graphite, so that the graphite oxide can be easily separated into thin pieces by interlayer separation. Then, ultrasonic vibration is applied to the mixed solution containing the graphite oxide, so that the graphite oxide whose interlayer distance is long can be cleaved to separate graphene oxide and to form a dispersion liquid containing graphene oxide. The solvent is removed from the dispersion liquid containing the graphene oxide, so that powdery graphene oxide can be obtained.

Note that the method for forming graphene oxide is not limited to the Hummers method using a sulfuric acid solution of potassium permanganate; for example, the Hummers method using nitric acid, potassium chlorate, nitric acid sodium, potassium permanganate, or the like or a method for forming graphene oxide that does not use the Hummers method may be employed as appropriate.

Graphite oxide may be separated into thin pieces by application of ultrasonic vibration, by irradiation with microwaves, radio waves, or thermal plasma, or by application of physical stress.

The formed graphene oxide includes an epoxy group, a carbonyl group, a carboxyl group, a hydroxyl group, or the like. Oxygen in a functional group of graphene oxide is negatively charged in a polar solvent typified by NMP (also referred to as N-methylpyrrolidone, 1-methyl-2-pyrrolidone, N-methyl-2-pyrrolidone, or the like); therefore, while interacting with NMP, the graphene oxide repels other graphene oxide and is hardly aggregated. For this reason, in a polar solvent, graphene oxide can be easily dispersed uniformly.

The length of one side (also referred to as a flake size) of the graphene oxide is greater than or equal to 50 nm and less than or equal to 100 μm, preferably greater than or equal to 800 nm and less than or equal to 20 μm.

As illustrated in the cross-sectional view of the positive electrode active material layer 6002 in FIG. 15B, the plurality of particles of the positive electrode active material 6003 is coated with a plurality of pieces of the graphene 6004. The sheet-like graphene 6004 is connected to the plurality of particles of the positive electrode active material 6003. In particular, since the graphene 6004 has the sheet shape, surface contact can be made in such a way that part of surfaces of the particles of the positive electrode active material 6003 are wrapped with the graphene 6004. Unlike a conductive additive in the form of particles such as acetylene black, which makes point contact with a positive electrode active material, the graphene 6004 is capable of surface contact with low contact resistance; accordingly, the electric conductivity between the particles of the positive electrode active material 6003 and the graphene 6004 can be improved without an increase in the amount of a conductive additive.

Further, surface contact is made between the plurality of pieces of the graphene 6004. This is because graphene oxide with extremely high dispersibility in a polar solvent is used for the formation of the graphene 6004. The solvent is removed by volatilization from a dispersion medium in which the graphene oxide is uniformly dispersed, and the graphene oxide is reduced to give graphene; hence, pieces of the graphene 6004 remaining in the positive electrode active material layer 6002 are partly overlapped with each other and dispersed such that surface contact is made, thereby forming a path for electric conduction.

Further, some pieces of the graphene 6004 are arranged three-dimensionally between the particles of the positive electrode active material 6003. Furthermore, the graphene 6004 is an extremely thin film (sheet) made of a single layer of carbon molecules or stacked layers thereof and hence is in contact with part of the surfaces of the particles of the positive electrode active material 6003 in such a way as to cover and fit these surfaces. A portion of the graphene 6004 which is not in contact with the particles of the positive electrode active material 6003 is warped between the plurality of particles of the positive electrode active material 6003 and crimped or stretched.

Consequently, a network for electric conduction is formed in the positive electrode 6000 by the pieces of the graphene 6004. Therefore, a path for electric conduction between the particles of the positive electrode active material 6003 is maintained. As described above, the graphene, which is formed by forming a paste using graphene oxide as a raw material and reducing the paste, is used as a conductive additive, which enables the positive electrode active material layer 6002 to have high electric conductivity.

The ratio of the positive electrode active material 6003 in the positive electrode active material layer 6002 can be increased because it is not necessary to increase the added amount of the conductive additive in order to increase contact points between the positive electrode active material 6003 and the graphene 6004. Accordingly, the discharge capacity of the secondary battery can be increased.

The average particle diameter of the primary particle of the positive electrode active material 6003 is less than or equal to 500 nm, preferably greater than or equal to 50 nm and less than or equal to 500 nm. To make surface contact with the plurality of particles of the positive electrode active material 6003, the length of one side of the graphene 6004 is greater than or equal to 50 nm and less than or equal to 100 μm, preferably greater than or equal to 800 nm and less than or equal to 20 μm.

Examples of the binder included in the positive electrode active material layer 6002 are polyimide, polytetrafluoroethylene, polyvinyl chloride, ethylene-propylene-diene polymer, styrene-butadiene rubber, acrylonitrile-butadiene rubber, fluorine rubber, polyvinyl acetate, polymethyl methacrylate, polyethylene, and nitrocellulose, in addition to polyvinylidene fluoride (PVDF) which is a typical example.

The above-described positive electrode active material layer 6002 preferably includes the positive electrode active material 6003 at greater than or equal to 90 wt % and less than or equal to 94 wt %, the graphene 6004 as the conductive additive at greater than or equal to 1 wt % and less than or equal to 5 wt %, and the binder at greater than or equal to 1 wt % and less than or equal to 5 wt % with respect to the total weight of the positive electrode active material layer 6002.

[6.2. Negative Electrode]

Figure 16A:
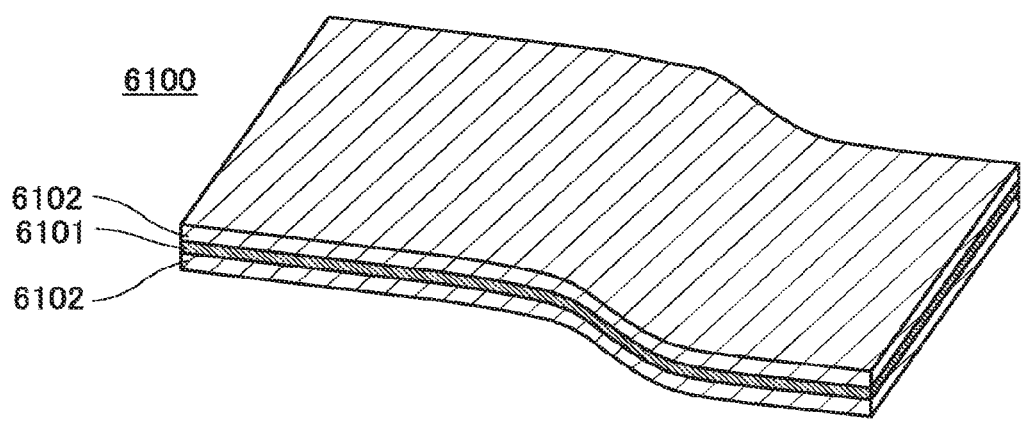
FIGS. 16A and 16B illustrate a negative electrode.

Next, a negative electrode of the power storage device is described with reference to FIGS. 16A and 16B.

A negative electrode 6100 includes a negative electrode current collector 6101 and a negative electrode active material layer 6102 formed over the negative electrode current collector 6101 by a coating method, a CVD method, a sputtering method, or the like, for example. Although an example of providing the negative electrode active material layer 6102 on both surfaces of the negative electrode current collector 6101 with a sheet shape (or a strip-like shape) is illustrated in FIG. 16A, one embodiment of the present invention is not limited to this example. The negative electrode active material layer 6102 may be provided on one of the surfaces of the negative electrode current collector 6101. Further, although the negative electrode active material layer 6102 is provided entirely over the negative electrode current collector 6101 in FIG. 16A, one embodiment of the present invention is not limited thereto. The negative electrode active material layer 6102 may be provided over part of the negative electrode current collector 6101. For example, a structure may be employed in which the negative electrode active material layer 6102 is not provided in a portion where the negative electrode current collector 6101 is connected to a negative electrode tab.

The negative electrode current collector 6101 can be formed using a material which has high conductivity and is not alloyed with carrier ions such as lithium ions, such as stainless steel, gold, platinum, zinc, iron, copper, or titanium, an alloy thereof, or the like. Alternatively, the negative electrode current collector 6101 may be formed using a metal element which forms silicide by reacting with silicon. Examples of the metal element which forms silicide by reacting with silicon are zirconium, titanium, hafnium, vanadium, niobium, tantalum, chromium, molybdenum, tungsten, cobalt, and nickel. The negative electrode current collector 6101 can have a foil shape, a plate (sheet) shape, a net shape, a punching-metal shape, an expanded-metal shape, or the like as appropriate. The negative electrode current collector 6101 preferably has a thickness of greater than or equal to 10 μm and less than or equal to 30 μm.

Figure 16B:
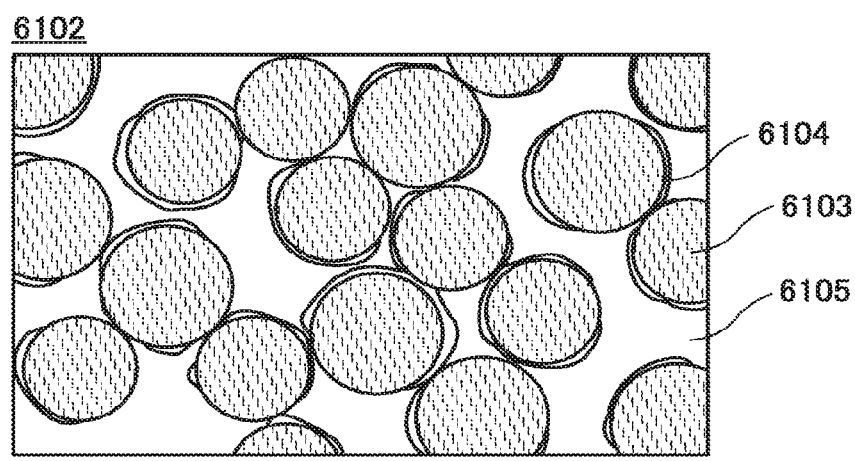

FIG. 16B is a schematic view of part of a cross-section of the negative electrode active material layer 6102. Although an example of the negative electrode active material layer 6102 including the negative electrode active material 6103 and the binder 6105 is shown here, one embodiment of the present invention is not limited to this example. It is sufficient that the negative electrode active material layer 6102 includes at least the negative electrode active material 6103.

There is no particular limitation on the material of the negative electrode active material 6103 as long as it is a material with which a metal can be dissolved and precipitated or a material into/from which metal ions can be inserted and extracted. Other than a lithium metal, graphite, which is a carbon material generally used in the field of power storage, can also be used as the negative electrode active material 6103. Examples of graphite are low crystalline carbon such as soft carbon and hard carbon and high crystalline carbon such as natural graphite, kish graphite, pyrolytic carbon, mesophase pitch based carbon fiber, mesocarbon microbeads (MCMB), mesophase pitches, and petroleum-based or coal-based coke.

As the negative electrode active material 6103, other than the above carbon materials, an alloy-based material which enables charge-discharge reaction by alloying and dealloying reaction with carrier ions can be used. In the case where carrier ions are lithium ions, for example, a material containing at least one of Mg, Ca, Al, Si, Ge, Sn, Pb, As, Sb, Bi, Ag, Au, Zn, Cd, Hg, In, etc. can be used as the alloy-based material. Such metals have higher capacity than graphite. In particular, silicon has a significantly high theoretical capacity of 4200 mAh/g. For this reason, silicon is preferably used as the negative electrode active material 6103.

Although the negative electrode active material 6103 is illustrated as a particulate substance in FIG. 16B, the shape of the negative electrode active material 6103 is not limited thereto. The negative electrode active material 6103 can have a given shape such as a plate shape, a rod shape, a cylindrical shape, a powder shape, or a flake shape. Further, the negative electrode active material 6103 may have a three-dimensional shape such as unevenness on a surface with a plate shape, fine unevenness on a surface, or a porous shape.

The negative electrode active material layer 6102 may be formed by a coating method in such a manner that a conductive additive (not illustrated) and the binder 6105 are added to the negative electrode active material 6103 to form a negative electrode paste and the negative electrode paste is applied onto the negative electrode current collector 6101 and dried.

Note that the negative electrode active material layer 6102 may be predoped with lithium. As a predoping method, a sputtering method may be used to form a lithium layer on a surface of the negative electrode active material layer 6102. Alternatively, the negative electrode active material layer 6102 can be predoped with lithium by providing lithium foil on the surface thereof.

Further, graphene (not illustrated) is preferably formed on a surface of the negative electrode active material 6103. In the case of using silicon as the negative electrode active material 6103, the volume of silicon is greatly changed due to occlusion and release of carrier ions in charge-discharge cycles. Therefore, adhesion between the negative electrode current collector 6101 and the negative electrode active material layer 6102 is decreased, resulting in degradation of battery characteristics caused by charging and discharging. In view of this, graphene is preferably formed on a surface of the negative electrode active material 6103 containing silicon because even when the volume of silicon is changed in charge-discharge cycles, decrease in adhesion between the negative electrode current collector 6101 and the negative electrode active material layer 6102 can be regulated, which makes it possible to reduce degradation of battery characteristics.

Graphene formed on the surface of the negative electrode active material 6103 can be formed by reducing graphene oxide in a similar manner to that of the method for forming the positive electrode. As the graphene oxide, the above-described graphene oxide can be used.

Further, a coating film 6104 of oxide or the like may be formed on the surface of the negative electrode active material 6103. A coating film (solid electrolyte interphase (SET)) formed by decomposition of an electrolyte solution in charging cannot release electric charges used at the time of forming the coating film, and therefore forms irreversible capacity. In contrast, the coating film 6104 of oxide or the like provided on the surface of the negative electrode active material 6103 in advance can reduce or prevent generation of irreversible capacity.

As the coating film 6104 coating the negative electrode active material 6103, an oxide film of any one of niobium, titanium, vanadium, tantalum, tungsten, zirconium, molybdenum, hafnium, chromium, aluminum, and silicon or an oxide film containing any one of these elements and lithium can be used. The coating film 6104 is denser than a conventional coating film formed on a surface of a negative electrode due to a decomposition product of an electrolyte solution.

For example, niobium oxide ($Nb_2O_5$) has a low electron conductivity of $10^{-9}$ S/cm and a high insulating property. For this reason, a niobium oxide film inhibits electrochemical decomposition reaction between the negative electrode active material and the electrolyte solution. On the other hand, niobium oxide has a lithium diffusion coefficient of $10^{-9}$ cm$^2$/sec and high lithium ion conductivity. Therefore, niobium oxide can transmit lithium ions.

A sol-gel method can be used to coat the negative electrode active material 6103 with the coating film 6104, for example. The sol-gel method is a method for forming a thin film in such a manner that a solution of metal alkoxide, a metal salt, or the like is changed into a gel, which has lost its fluidity, by hydrolysis reaction and polycondensation reaction and the gel is baked. Since a thin film is formed from a liquid phase in the sol-gel method, raw materials can be mixed uniformly on the molecular scale. For this reason, by adding a negative electrode active material such as graphite to a raw material of the metal oxide film which is a solvent, the active material can be easily dispersed into the gel. In such a manner, the coating film 6104 can be formed on the surface of the negative electrode active material 6103.

A decrease in the capacity of the power storage device can be prevented by using the coating film 6104 and performing the above-described charging with intermittent discharging.

[6.3. Electrolyte Solution]

As a solvent for the electrolyte solution used in the power storage device, an aprotic organic solvent is preferably used. For example, one of ethylene carbonate (EC), propylene carbonate (PC), butylene carbonate, chloroethylene carbonate, vinylene carbonate, γ-butyrolactone, γ-valerolactone, dimethyl carbonate (DMC), diethyl carbonate (DEC), ethyl methyl carbonate (EMC), methyl formate, methyl acetate, methyl butyrate, 1,3-dioxane, 1,4-dioxane, dimethoxyethane (DME), dimethyl sulfoxide, diethyl ether, methyl diglyme, acetonitrile, benzonitrile, tetrahydrofuran, sulfolane, and sultone can be used, or two or more of these solvents can be used in an appropriate combination in an appropriate ratio.

With the use of a gelled high-molecular material as the solvent for the electrolyte solution, safety against liquid leakage and the like is improved. Further, the power storage device can be thinner and more lightweight. Typical examples of gelled high-molecular materials are a silicone gel, an acrylic gel, an acrylonitrile gel, polyethylene oxide, polypropylene oxide, and a fluorine-based polymer.

Alternatively, the use of one or more of ionic liquids (room temperature molten salts) which are less likely to burn and volatilize as the solvent for the electrolyte solution can prevent the power storage device from exploding or catching fire even when the power storage device internally shorts out or the internal temperature increases due to overcharging or the like.

In the case of using a lithium ion as a carrier ion, examples of an electrolyte dissolved in the above-described solvent are one of lithium salts such as $LiPF_6$, $LiClO_4$, $LiAsF_6$, $LiBF_4$, $LiAlCl_4$, LiSCN, LiBr, LiI, $Li_2SO_4$, $Li_2B_{10}Cl_{10}$, $Li_2B_{12}Cl_{12}$, $LiCF_3SO_3$, $LiC_4F_9SO_3$, $LiC(CF_3SO_2)_3$, $LiC(C_2F_5SO_2)_3$, $LiN(CF_3SO_2)_2$, $LiN(C_4F_9SO_2)(CF_3SO_2)$, and $LiN(C_2F_5SO_2)_2$, or two or more of these lithium salts in an appropriate combination in an appropriate ratio.

[6.4. Separator]

As the separator of the power storage device, a porous insulator such as cellulose, polypropylene (PP), polyethylene (PE), polybutene, nylon, polyester, polysulfone, polyacrylonitrile, polyvinylidene fluoride, or tetrafluoroethylene can be used. Further, nonwoven fabric of a glass fiber or the like, or a diaphragm in which a glass fiber and a polymer fiber are mixed may also be used.

[6.5. Nonaqueous Secondary Battery]

Next, structures of nonaqueous secondary batteries are described with reference to FIGS. 17A to 17C and FIGS. 18A and 18B.

[6.5.1. Coin-Type Secondary Battery]

Figure 17A:
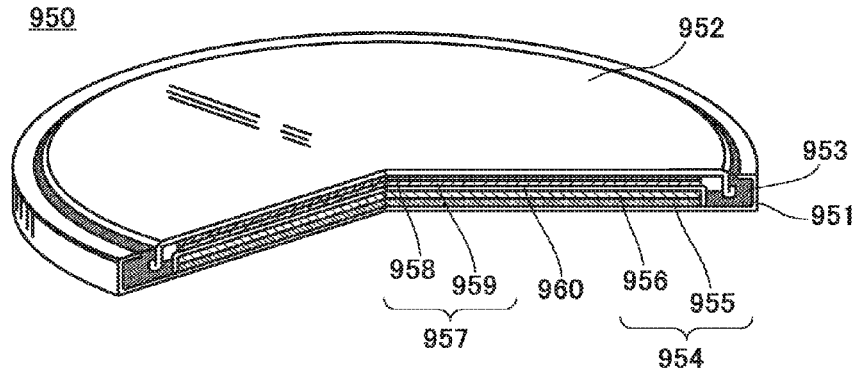
FIGS. 17A to 17C illustrate power storage devices.

FIG. 17A is an external view of a coin-type (single-layer flat type) lithium-ion secondary battery, including a cross-sectional view of the laminated lithium-ion secondary battery.

In a coin-type secondary battery 950, a positive electrode can 951 serving also as a positive electrode terminal and a negative electrode can 952 serving also as a negative electrode terminal are insulated and sealed with a gasket 953 formed of polypropylene or the like. A positive electrode 954 includes a positive electrode current collector 955 and a positive electrode active material layer 956 which is provided to be in contact with the positive electrode current collector 955. A negative electrode 957 includes a negative electrode current collector 958 and a negative electrode active material layer 959 which is provided to be in contact with the negative electrode current collector 958. A separator 960 and an electrolyte solution (not illustrated) are provided between the positive electrode active material layer 956 and the negative electrode active material layer 959.

The negative electrode 957 includes the negative electrode active material layer 959 over the negative electrode current collector 958. The positive electrode 954 includes the positive electrode active material layer 956 over the positive electrode current collector 955.

As the positive electrode 954, the negative electrode 957, the separator 960, and the electrolyte solution, the above-described materials can be used.

For the positive electrode can 951 and the negative electrode can 952, a metal having corrosion resistance to the electrolyte solution, such as nickel, aluminum, or titanium, an alloy of such a metal, or an alloy of such a metal and another metal (e.g., stainless steel) can be used. Alternatively, the positive electrode can 951 and the negative electrode can 952 are preferably covered with nickel, aluminum, or the like in order to prevent corrosion by the electrolyte solution. The positive electrode can 951 and the negative electrode can 952 are electrically connected to the positive electrode 954 and the negative electrode 957, respectively.

The negative electrode 957, the positive electrode 954, and the separator 960 are immersed in the electrolyte solution. Then, as illustrated in FIG. 17A, the positive electrode can 951, the positive electrode 954, the separator 960, the negative electrode 957, and the negative electrode can 952 are stacked in this order with the positive electrode can 951 positioned at the bottom, and the positive electrode can 951 and the negative electrode can 952 are subjected to pressure bonding with the gasket 953 provided therebetween. In such a manner, the coin-type secondary battery 950 is manufactured.

[6.5.2. Thin Secondary Battery]

Figure 17B:
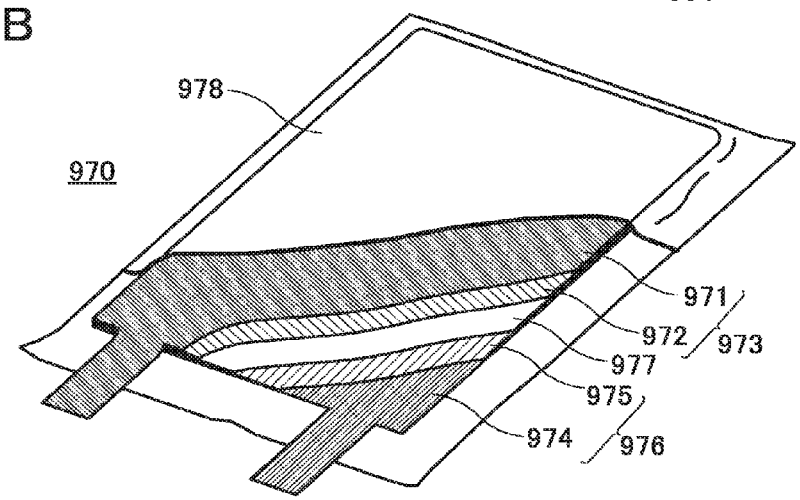

Next, an example of a thin secondary battery will be described with reference to FIG. 17B. In FIG. 17B, a structure inside the laminated secondary battery is partly exposed for convenience.

A thin secondary battery 970 illustrated in FIG. 17B includes a positive electrode 973 including a positive electrode current collector 971 and a positive electrode active material layer 972, a negative electrode 976 including a negative electrode current collector 974 and a negative electrode active material layer 975, a separator 977, an electrolyte solution (not illustrated), and an exterior body 978. The separator 977 is provided between the positive electrode 973 and the negative electrode 976 in the exterior body 978. The exterior body 978 is filled with the electrolyte solution. Although one positive electrode 973, one negative electrode 976, and one separator 977 are used in FIG. 17B, the secondary battery may have a stacked-layer structure in which positive electrodes, negative electrodes, and separators are alternately stacked.

For the positive electrode, the negative electrode, the separator, and the electrolyte solution (an electrolyte and a solvent), the above-described members can be used.

In the thin secondary battery 970 illustrated in FIG. 17B, the positive electrode current collector 971 and the negative electrode current collector 974 also serve as terminals (tabs) for an electrical contact with the outside. For this reason, the positive electrode current collector 971 and the negative electrode current collector 974 each have a part exposed outside the exterior body 978.

As the exterior body 978 in the thin secondary battery 970, for example, a stacked film having a three-layer structure in which a highly flexible metal thin film of aluminum, stainless steel, copper, nickel, or the like is provided over a film formed of a material such as polyethylene, polypropylene, polycarbonate, ionomer, or polyamide, and an insulating synthetic resin film of a polyamide-based resin, a polyester-based resin, or the like is provided as the outer surface of the exterior body over the metal thin film can be used. With such a three-layer structure, permeation of the electrolyte solution and a gas can be blocked and an insulating property and resistance to the electrolyte solution can be obtained.

[6.5.3. Cylindrical Secondary Battery]

Figure 18A:
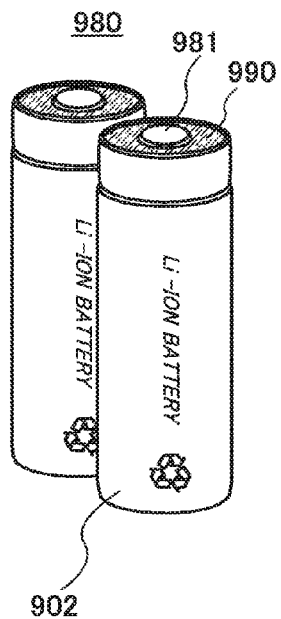
FIGS. 18A and 18B illustrate a power storage device.

Next, an example of a cylindrical secondary battery is described with reference to FIGS. 18A and 18B. As illustrated in FIG. 18A, a cylindrical secondary battery 980 includes a positive electrode cap (battery lid) 981 on the top surface and a battery can (outer can) 982 on the side surface and bottom surface. The positive electrode cap 981 and the battery can (outer can) 982 are insulated by the gasket 990 (insulating packing).

Figure 18B:
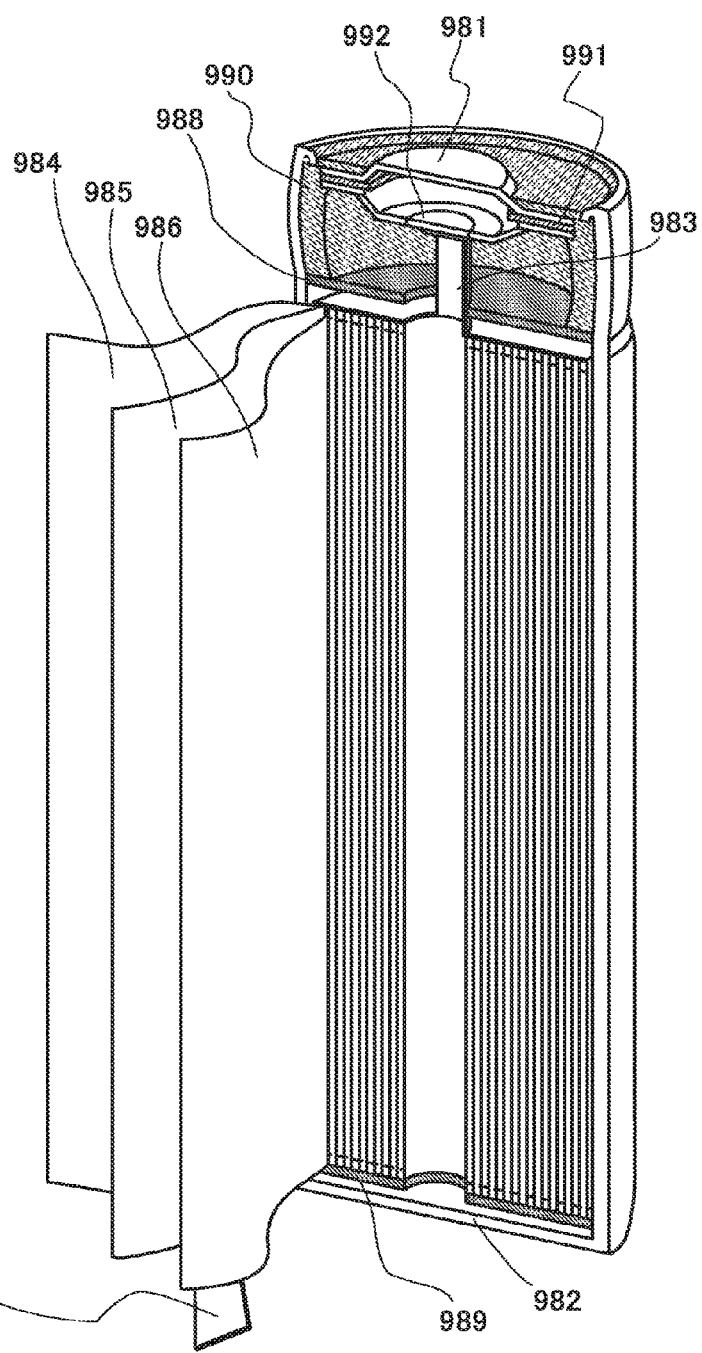

FIG. 18B is a schematic view of a cross-section of the cylindrical secondary battery. Inside the battery can 982 having a hollow cylindrical shape, a battery element in which a strip-like positive electrode 984 and a strip-like negative electrode 986 are wound with a stripe-like separator 985 provided therebetween is provided. Although not illustrated, the battery element is wound around a center pin. The battery can 982 is closed at one end and opened at the other end.

For the positive electrode 984, the negative electrode 986, and the separator 985, the above-described members can be used.

For the battery can 982, a metal having corrosion resistance to an electrolyte solution, such as nickel, aluminum, or titanium, an alloy of such a metal, or an alloy of such a metal and another metal (e.g., stainless steel or the like) can be used. Alternatively, the battery can 982 is preferably covered with nickel, aluminum, or the like in order to prevent corrosion caused by the electrolyte solution. Inside the battery can 982, the battery element in which the positive electrode, the negative electrode, and the separator are wound is provided between a pair of insulating plates 988 and 989 which face each other.

Further, an electrolyte solution (not illustrated) is injected inside the battery can 982 in which the battery element is provided. For the electrolyte solution, the above-described electrolyte and solvent can be used.

Since the positive electrode 984 and the negative electrode 986 of the cylindrical secondary battery are wound, active material layers are formed on both sides of the current collectors. A positive electrode terminal (positive electrode current collecting lead) 983 is connected to the positive electrode 984, and a negative electrode terminal (negative electrode current collecting lead) 987 is connected to the negative electrode 986. Both the positive electrode terminal 983 and the negative electrode terminal 987 can be formed using a metal material such as aluminum. The positive electrode terminal 983 and the negative electrode terminal 987 are resistance-welded to a safety valve mechanism 992 and the bottom of the battery can 982, respectively. The safety valve mechanism 992 is electrically connected to the positive electrode cap 981 through a positive temperature coefficient (PTC) element 991. The safety valve mechanism 992 cuts off electrical connection between the positive electrode cap 981 and the positive electrode 984 when the internal pressure of the battery increases and exceeds a predetermined threshold value. The PTC element 991 is a heat sensitive resistor whose resistance increases as temperature rises, and controls the amount of current by increase in resistance to prevent abnormal heat generation. Barium titanate ($BaTiO_3$)-based semiconductor ceramic or the like can be used for the PTC element.

[6.5.4. Rectangular Secondary Battery]

Figure 17C:
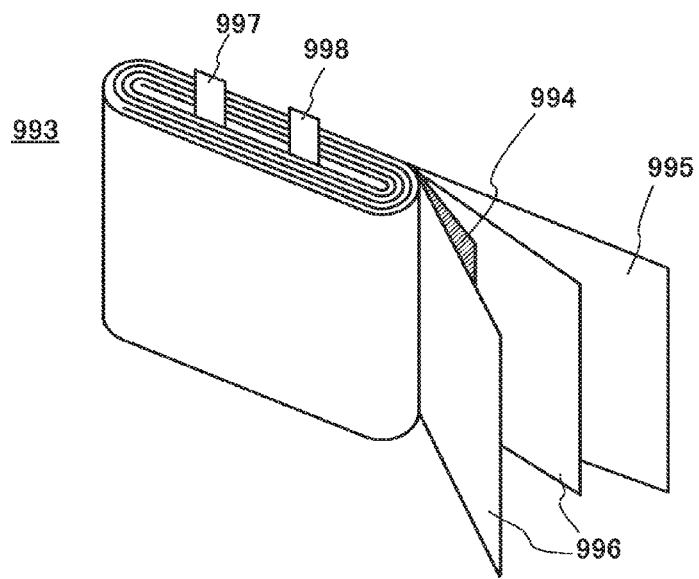

Next, an example of a rectangular secondary battery is described with reference to FIG. 17C. A wound body 993 illustrated in FIG. 17C includes a negative electrode 994, a positive electrode 995, and a separator 996. The wound body 993 is obtained by winding a sheet of a stack in which the negative electrode 994 overlaps with the positive electrode 995 with the separator 996 provided therebetween. The wound body 993 is covered with a rectangular sealed can or the like; thus, a rectangular secondary battery is manufactured. Note that the number of stacks each including the negative electrode 994, the positive electrode 995, and the separator 996 may be determined as appropriate depending on capacity and an element volume which are required.

As in the cylindrical secondary battery, the negative electrode 994 is connected to a negative electrode tab (not illustrated) through one of a terminal 997 and a terminal 998, and the positive electrode 995 is connected to a positive electrode tab (not illustrated) through the other of the terminal 997 and the terminal 998. Surrounding structures such as a safety valve mechanism are similar to those in the cylindrical secondary battery.

As described above, although the coin-type secondary battery, the thin (laminated) secondary battery, the cylindrical secondary battery, and the rectangular secondary battery are described as examples of the secondary battery, secondary batteries having other shapes can be used. Further, a structure in which a plurality of positive electrodes, a plurality of negative electrodes, and a plurality of separators are stacked or wound may be employed.

[6.6. Power Storage Device Including Electric Circuit and the Like]

Next, a power storage device including an electric circuit and the like is described.

FIGS. 19A to 19D illustrate an example of a power storage device in which the above-described rectangular secondary battery is provided with an electric circuit and the like. In a power storage device 6600 illustrated in FIGS. 19A and 19B, a wound body 6601 is stored inside a battery can 6604. The wound body 6601 includes a terminal 6602 and a terminal 6603, and is impregnated with an electrolyte solution inside the battery can 6604. It is preferable that the terminal 6603 be in contact with the battery can 6604, and the terminals 6602 be insulated from the battery can 6604 with the use of an insulating member or the like. A metal material such as aluminum or a resin material can be used for the battery can 6604.

Figure 19A:
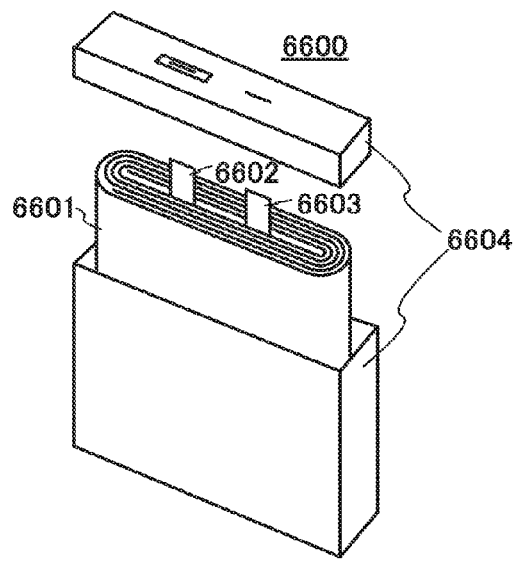
FIGS. 19A to 19D illustrate power storage devices.
Figure 19B:
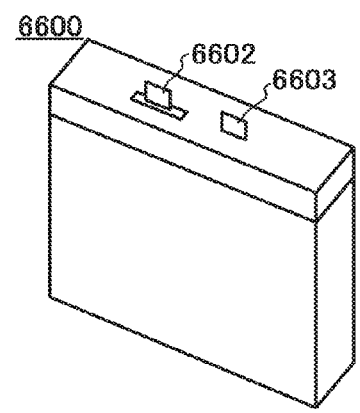
Figure 19C:
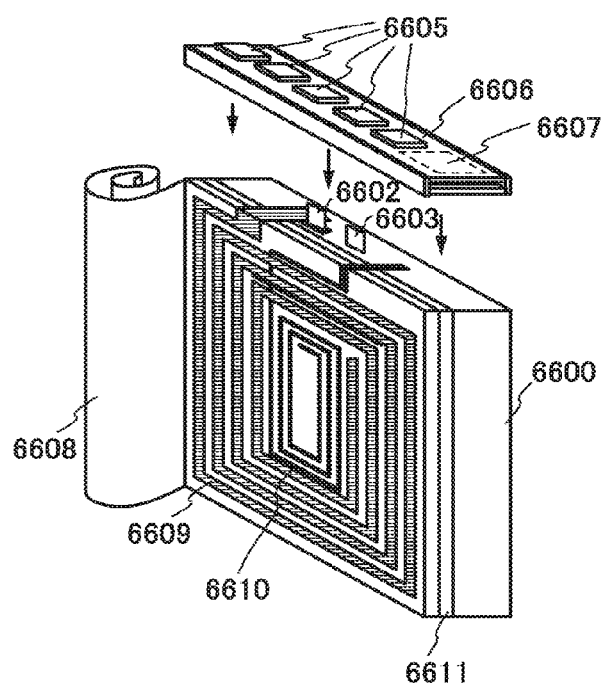
Figure 19D:
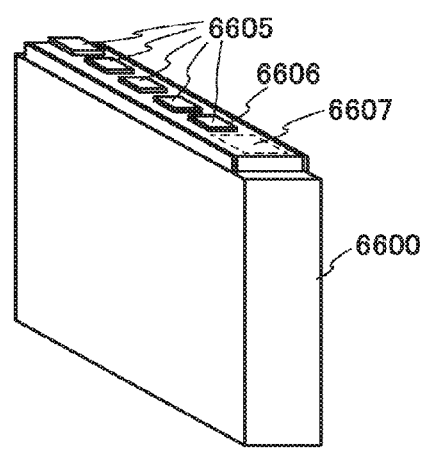

Further, as illustrated in FIG. 19B, the power storage device 6600 can be provided with an electric circuit and the like. FIGS. 19C and 19D illustrate an example of providing the power storage device 6600 with a circuit board 6606 in which an electric circuit and the like are provided, an antenna 6609, an antenna 6610, and a label 6608.

The circuit board 6606 includes an electric circuit 6607, terminals 6605, and the like. As the circuit board 6606, a printed circuit board (PCB) can be used, for example. When the printed circuit board is used as the circuit board 6606, electronic components such as a resistor, a capacitor, a coil (an inductor), and a semiconductor integrated circuit (IC) are mounted over the printed circuit board and connected, whereby the electric circuit 6607 can be formed. As well as the above-described electronic components, a variety of components, for example, a temperature sensing element such as a thermistor, a fuse, a filter, a crystal oscillator, and an electromagnetic compatibility (EMC) component can be mounted.

Here, a circuit including the above-described transistor in which an oxide semiconductor is used in a channel formation region and the like can be used as the semiconductor integrated circuit (IC). Thus, power consumption of the electric circuit 6607 can be greatly reduced.

The electric circuit 6607 including these electronic components can function as a monitoring circuit for preventing overcharge or overdischarge of the power storage device 6600, a protection circuit against overcurrent, or the like. The electric circuit 6607 can be provided with the circuit 203 illustrated in FIG. 3, for example. Note that the converter 202 illustrated in FIG. 3 may be provided in the power storage device 6600.

The terminals 6605 included in the circuit board 6606 are connected to the terminal 6602, the terminal 6603, the antenna 6609, the antenna 6610, and the electric circuit 6607. Although the number of the terminals is five in FIGS. 19C and 19D, the number is not limited thereto, and may be an arbitrary number. With the use of the terminals 6605, the power storage device 6600 can be charged and discharged, and further, a signal can be sent and received to/from an electrical appliance including the power storage device 6600.

The antenna 6609 and the antenna 6610 can be used for transmitting and receiving electric power and a signal to/from the outside of the power storage device, for example. One or both of the antenna 6609 and the antenna 6610 are electrically connected to the electric circuit 6607 to allow the electric circuit 6607 to control the transmission and reception of electric power and a signal to/from the outside. Alternatively, one or both of the antenna 6609 and the antenna 6610 are electrically connected to the terminals 6605 to allow a control circuit of the electrical appliance including the power storage device 6600 to control the transmission and reception of electric power and a signal to/from the outside.

Note that although FIGS. 19C and 19D illustrate an example of the power storage device 6600 provided with two kinds of antennas, a variety of antennas may be provided or a structure where an antenna is not provided may be employed.

In FIGS. 19C and 19D, the antenna 6609 and the antenna 6610 each have a coil shape; however, without limitation thereon, a linear antenna or a flat plate antenna may be used, for example. Further, a planar antenna, an aperture antenna, a traveling-wave antenna, an EH antenna, a magnetic-field antenna, or a dielectric antenna may be used.

Note that an electromagnetic induction method, a magnetic resonance method, an electric wave method, or the like can be used for transmitting and receiving electric power wirelessly (also referred to as contactless power transmission, non-contact power transmission, wireless power supply, or the like).

The line width of the antenna 6609 is preferably larger than that of the antenna 6610. This makes it possible to increase the amount of electric power received by the antenna 6609.

In addition, a layer 6611 is provided between the antennas 6609 and 6610 and the power storage device 6600. The layer 6611 has a function of preventing shielding of an electric field or a magnetic field due to the wound body 6601, for example. In this case, a magnetic substance can be used for the layer 6611, for example. Alternatively, the layer 6611 may be a shielding layer.

Note that the antenna 6609 and the antenna 6610 can be used for a purpose which is different from the purpose of transmitting and receiving electric power or a signal to/from the outside. For example, when the electrical appliance including the power storage device 6600 does not include an antenna, the antenna 6609 and the antenna 6610 enable wireless communication with the electrical appliance.

[7. Electrical Appliance]

The power storage device of one embodiment of the present invention can be used as a power supply in a variety of electrical appliances.

[7.1. Range of Electrical Appliances]

Here, "electrical appliances" refer to all general industrial products including portions which operate by electric power. Electrical appliances are not limited to consumer products such as home electrical products and also include products for various uses such as business use, industrial use, and military use in their category.

[7.2. Examples of Electrical Appliance]

Examples of electrical appliances each using the power storage device of one embodiment of the present invention are as follows: display devices of televisions, monitors, and the like, lighting devices, desktop personal computers, laptop personal computers, word processors, image reproduction devices which reproduce still images or moving images stored in recording media such as digital versatile discs (DVDs), portable or stationary music reproduction devices such as compact disc (CD) players and digital audio players, portable or stationary radio receivers, recording reproduction devices such as tape recorders and IC recorders (voice recorders), headphone stereos, stereos, remote controls, clocks such as table clocks and wall clocks, cordless phone handsets, transceivers, mobile phones, car phones, portable or stationary game machines, pedometers, calculators, portable information terminals, electronic notebooks, e-book readers, electronic translators, audio input devices such as microphones, cameras such as still cameras and video cameras, toys, electric shavers, electric toothbrushes, high-frequency heating appliances such as microwave ovens, electric rice cookers, electric washing machines, electric vacuum cleaners, water heaters, electric fans, hair dryers, air-conditioning systems such as humidifiers, dehumidifiers, and air conditioners, dishwashers, dish dryers, clothes dryers, futon dryers, electric refrigerators, electric freezers, electric refrigerator-freezers, freezers for preserving DNA, flashlights, electric power tools, smoke detectors, and a health equipment and a medical equipment such as hearing aids, cardiac pacemakers, portable X-ray equipments, radiation counters, electric massagers, and dialyzers. The examples also include industrial equipment such as guide lights, traffic lights, meters such as gas meters and water meters, belt conveyors, elevators, escalators, automatic vending machines, automatic ticket machine, cash dispensers (CD), automated teller machines (ATM), digital signage, industrial robots, radio relay stations, mobile phone base stations, power storage systems, and power storage device for leveling the amount of power supply and smart grid. In addition, moving objects (transporters) driven by an electric motor using electric power from a power storage device are also included in the category of the electrical appliances. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, agricultural machines, motorized bicycles including motor-assisted bicycles, motorcycles, electric wheelchairs, electric carts, boats or ships, submarines, aircrafts such as fixed-wing aircraft and rotary-wing aircraft, rockets, artificial satellites, space probes, planetary probes, and spacecrafts.

In the electrical appliances, the power storage device of one embodiment of the present invention can be used as a main power supply for almost the whole power consumption. Alternatively, in the electrical appliances, the power storage device of one embodiment of the present invention can be used as an uninterruptible power source which can supply power to the electrical appliances when the supply of power from the main power power supply or a commercial power supply is stopped. Further alternatively, in the electrical appliances, the power storage device of one embodiment of the present invention can be used as an auxiliary power supply for supplying electric power to the electrical appliances at the same time as the power supply from the main power supply or a commercial power supply.

[7.3. Example of Electric Power Network]

The electrical appliances may each include a power storage device, or may be connected wirelessly or with a wiring to at least one power storage device and a control device that controls the electric power system to form an electric network (electric power network). The electric network controlled by the control device can improve usage efficiency of electric power in the whole network.

Figure 20A:
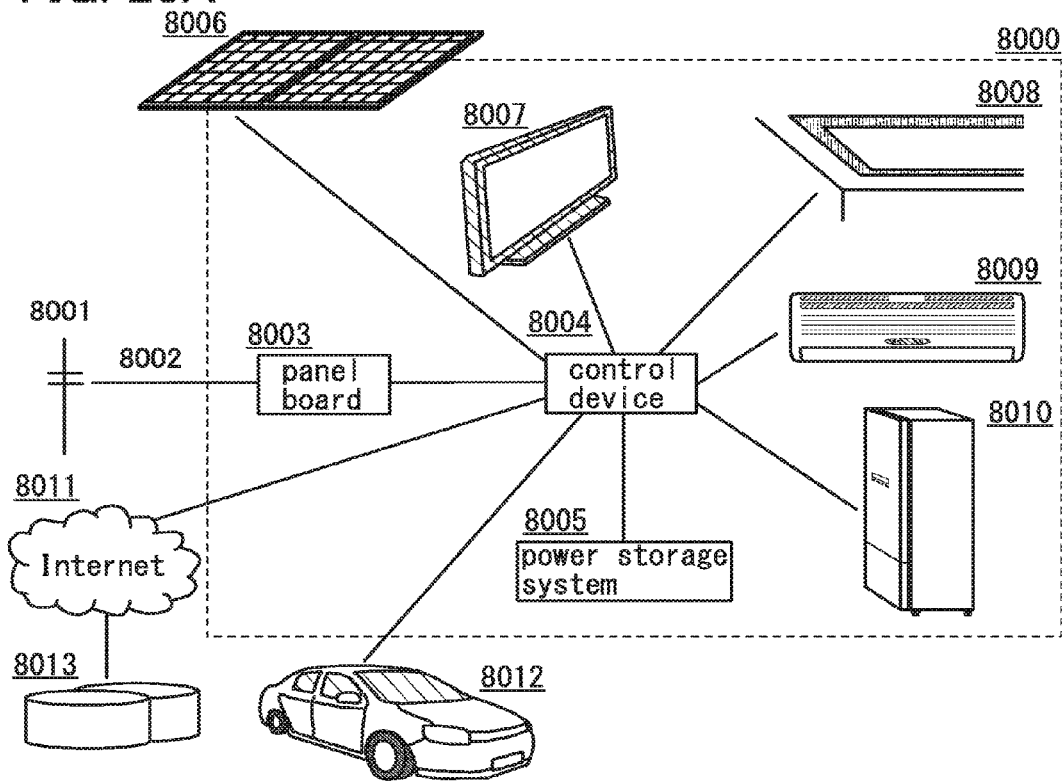
FIGS. 20A to 20C illustrate electrical appliances.

FIG. 20A illustrates an example of a home energy management system (HEMS) in which a plurality of home appliances, a control device, a power storage device, and the like are connected in a house. Such a system makes it possible to check easily the power consumption of the whole house. In addition, the plurality of home appliances can be operated with a remote control. Further, automatic control of the home appliances with a sensor or the control device can also contribute to low power consumption.

A panelboard 8003 set in a house 8000 is connected to an electric power system 8001 through a service wire 8002. The panelboard 8003 supplies AC power which is electric power supplied from a commercial power supply through the service wire 8002 to each of the plurality of home appliances. A control device 8004 is connected to the panelboard 8003 and also connected to the plurality of home appliances, a power storage system 8005, a solar power generation system 8006, and the like. Further, the control device 8004 can also be connected to an electric vehicle 8012 which is parked outside the house 8000 or the like and operates independently of the panelboard 8003.

The control device 8004 connects the panelboard 8003 to the plurality of home appliances to form a network, and controls the plurality of home appliances connected to the network.

In addition, the control device 8004 is connected to Internet 8011 and thus can be connected to a management server 8013 through the Internet 8011. The management server 8013 receives data on the status of electric power usage of users and therefore can create a database and can provide the users with a variety of services based on the database. Further, as needed, the management server 8013 can provide the users with data on electric power charge for a corresponding time zone, for example. On the basis of the data, the control device 8004 can set an optimized usage pattern in the house 8000.

Examples of the plurality of home appliances are a display device 8007, a lighting device 8008, an air-conditioning system 8009, and an electric refrigerator 8010 which are illustrated in FIG. 20A. However, the plurality of home appliances are not limited to these examples, and refer to a variety of electrical appliances which can be set inside a house, such as the above-described electrical appliances.

In a display portion of the display device 8007, a semiconductor display device such as a liquid crystal display device, a light-emitting device including a light-emitting element, e.g., an organic electroluminescent (EL) element, in each pixel, an electrophoretic display device, a digital micromirror device (DMD), a plasma display panel (PDP), or a field emission display (FED) is provided, for example. A display device functioning as a display device for displaying information, such as a display device for TV broadcast reception, a personal computer, advertisement, and the like, is included in the category of the display device 8007.

The lighting device 8008 includes an artificial light source which generates light artificially by utilizing electric power in its category. Examples of the artificial light source are an incandescent lamp, a discharge lamp such as a fluorescent lamp, and a light-emitting element such as a light emitting diode (LED) and an organic EL element. Although being provided on a ceiling in FIG. 20A, the lighting device 8008 may be installation lighting provided on a wall, a floor, a window, or the like or desktop lighting.

The air-conditioning system 8009 has a function of adjusting an indoor environment such as temperature, humidity, and air cleanliness. FIG. 20A illustrates an air conditioner as an example. The air conditioner includes an indoor unit in which a compressor, an evaporator, and the like are integrated and an outdoor unit (not illustrated) in which a condenser is incorporated, or an integral unit thereof.

The electric refrigerator 8010 is an electrical appliance for the storage of food and the like at low temperature and includes a freezer for freezing at 0° C. or lower. A refrigerant in a pipe which is compressed by a compressor absorbs heat when vaporized, and thus inside the electric refrigerator 8010 is cooled.

The plurality of home appliances may each include a power storage device or may use electric power supplied from the power storage system 8005 or the commercial power supply without including the power storage device. By using a power storage device as an uninterruptible power supply, the plurality of home appliances each including the power storage device can be used even when electric power cannot be supplied from the commercial power supply due to power failure or the like.

In the vicinity of a terminal for power supply in each of the above-described home appliances, an electric power sensor such as a current sensor can be provided. Data obtained with the electric power sensor is sent to the control device 8004, which makes it possible for users to check the used amount of electric power of the whole house. In addition, on the basis of the data, the control device 8004 can determine the distribution of electric power supplied to the plurality of home appliances, resulting in the efficient or economical use of electric power in the house 8000.

In a time zone when the usage rate of electric power which can be supplied from the commercial power supply is low, the power storage system 8005 can be charged with electric power from the commercial power supply. Further, with the use of the solar power generation system 8006, the power storage system 8005 can be charged during the daytime. Note that an object to be charged is not limited to the power storage system 8005, and a power storage device included in the electric vehicle 8012 and the power storage devices included in the plurality of home appliances which are connected to the control device 8004 may each be the object to be charged.

Electric power stored in a variety of power storage devices in such a manner is efficiently distributed by the control device 8004, resulting in the efficient or economical use of electric power in the house 8000.

As an example of controlling an electric power network, the example of controlling an electric power network on a house scale is described above; however, the scale of the electric power network is not limited thereto. An electric power network on an urban scale or a national scale (also referred to as a smart grid) can be created by a combination of a control device such as a smart meter and a communication network. Further, a microgrid which is on a scale of a factory or an office and includes an energy supply source and a plant consuming electric power as units can be constructed.

[7.4. Example of Electrical Appliance (Electric Vehicle)]

Next, as an example of the electrical appliances, a moving object is described with reference to FIGS. 20B and 20C. The power storage device of one embodiment of the present invention can be used as a power storage device for controlling the moving object.

Figure 20B:
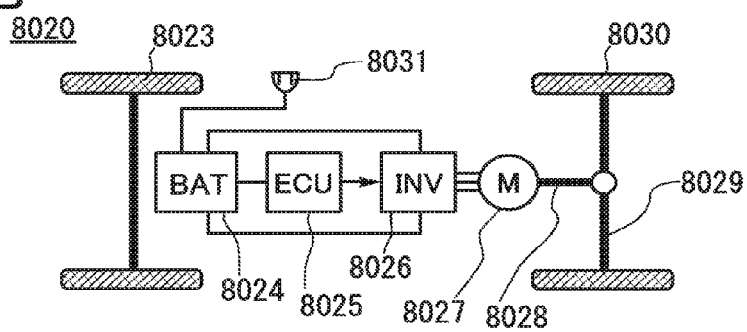
Figure 20C:
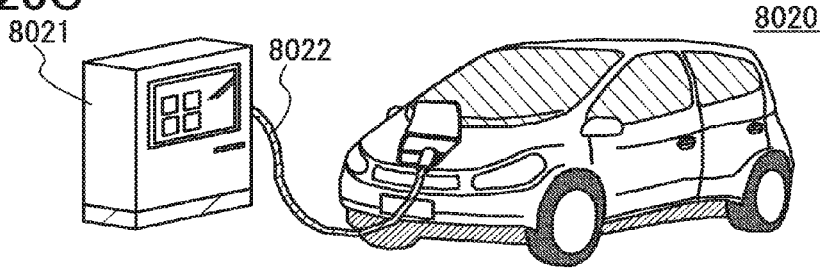

FIG. 20B illustrates an example of a structure inside an electric vehicle. An electric vehicle 8020 includes a power storage device 8024 that can be charged and discharged. Output of electric power of the power storage device 8024 is adjusted by an electronic control unit (ECU) 8025 so that the electric power is supplied to a drive motor unit 8027 through an inverter unit 8026. The inverter unit 8026 can convert DC power input from the power storage device 8024 into three phase AC power, can adjust the voltage, current, and frequency of the converted AC power, and can output the AC power to the drive motor unit 8027.

Thus, when a driver presses an accelerator pedal (not illustrated), the drive motor unit 8027 works, so that torque generated in the drive motor unit 8027 is transferred to rear wheels (drive wheels) 8030 through an output shaft 8028 and a drive shaft 8029. Front wheels 8023 are operated following the rear wheels 8030, whereby the electric vehicle 8020 can be driven.

Sensors such as a voltage sensor, a current sensor, and a temperature sensor are provided in each of the units to monitor physical values of each part of the electric vehicle 8020, as appropriate.

The electronic control unit 8025 is a processing device including a memory such as a RAM or a ROM, and a CPU, which are not illustrated. The electronic control unit 8025 outputs a control signal to the inverter unit 8026, the drive motor unit 8027, or the power storage device 8024 on the basis of operational information of the electric vehicle 8020 (e.g., acceleration, deceleration, or a stop), temperature information of a driving environment or each unit, control information, or input data on the state of charge (SOC) of the power storage device or the like. Various data and programs are stored in the memory.

As the drive motor unit 8027, a DC motor can be used instead of the AC motor, or a combination of either of these motors and an internal-combustion engine can be used.

Note that it is needless to say that one embodiment of the present invention is not limited to the moving object described above as long as the power storage device of one embodiment of the present invention is included.

The power storage device 8024 included in the electric vehicle 8020 can be charged by being supplied with electric power through external charging equipment by a plug-in system, a contactless power supply system, or the like. FIG. 20C illustrates the state where the power storage device 8024 included in the electric vehicle 8020 is charged with the use of a ground-based charging apparatus 8021 through a cable 8022. In charging, a given method such as CHAdeMO (registered trademark) or Combined Charging System may be employed as a charging method, the standard of a connector, or the like as appropriate. The charging apparatus 8021 may be a charging station provided in a commerce facility or a power source in a house. For example, with the use of a plug-in technique in which a connecting plug 8031 illustrated in FIG. 20B and connected to the power storage device 8024 is electrically connected to the charging apparatus 8021, the power storage device 8024 included in the electric vehicle 8020 can be charged by being supplied with electric power from outside. The power storage device 8024 can be charged by converting external electric power into DC constant voltage having a predetermined voltage level through a converter such as an AC-DC converter.

Further, although not illustrated, a power receiving device may be included in the moving object to charge the power storage device by supplying electric power from an above-ground power transmitting device in a contactless manner. In the case of the contactless power supply system, by fitting the power transmitting device in a road or an exterior wall, charging can be performed not only when the electric vehicle is stopped but also when driven. In addition, the contactless power supply system may be utilized to perform transmission/reception between moving objects. Furthermore, a solar cell may be provided in an exterior of the moving object to charge the power storage device 8024 when the electric vehicle is stopped or driven. To supply electric power in such a contactless manner, an electromagnetic induction method or a magnetic resonance method can be used.

Note that in the case where the moving object is an electric railway vehicle, a power storage device included therein can be charged by being supplied with electric power from an overhead cable or a conductor rail.

With the use of the power storage device of one embodiment of the present invention as the power storage device 8024, the power storage device 8024 can have favorable cycle characteristics and improved convenience. When the power storage device 8024 itself can be more compact and more lightweight as a result of improved characteristics of the power storage device 8024, the electric vehicle can be lightweight and fuel efficiency can be increased. Further, the power storage device 8024 included in the moving object has relatively large capacity; therefore, the power storage device 8024 can be used as an electric power supply source for indoor use, for example. In such a case, the use of a commercial power supply can be avoided at peak time of electric power demand.

[7.5. Example of Electrical Appliance (Portable Information Terminal)]

In addition, as another example of the electrical appliances, a portable information terminal is described with reference to FIGS. 21A to 21C.

Figure 21A:
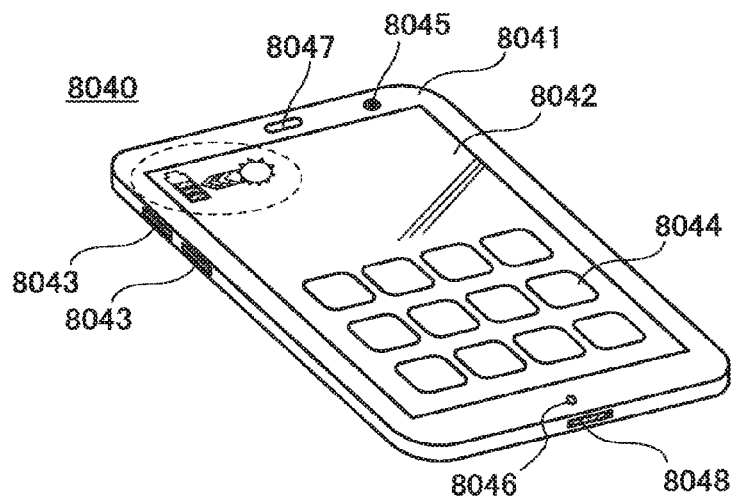
FIGS. 21A to 21C illustrate an electrical appliance.

FIG. 21A is a perspective view illustrating a front surface and a side surface of a portable information terminal 8040. The portable information terminal 8040 is capable of executing a variety of applications such as mobile phone calls, e-mailing, viewing and editing texts, music reproduction, Internet communication, and a computer game. In the portable information terminal 8040, a housing 8041 includes a display portion 8042, a camera lens 8045, a microphone 8046, and a speaker 8047 on its front surface, a button 8043 for operation on its left side, and a connection terminal 8048 on its bottom surface.

A display module or a display panel is used for the display portion 8042. Examples of the display module or the display panel are a light-emitting device in which each pixel includes a light-emitting element typified by an organic light-emitting element (OLED); a liquid crystal display device; an electronic paper performing a display in an electrophoretic mode, an electronic liquid powder (registered trademark) mode, or the like; a digital micromirror device (DMD); a plasma display panel (PDP); a field emission display (FED); a surface conduction electron-emitter display (SED); a light-emitting diode (LED) display; a carbon nanotube display; a nanocrystal display; and a quantum dot display.

The portable information terminal 8040 illustrated in FIG. 21A is an example of providing the one display portion 8042 in the housing 8041; however, one embodiment of the present invention is not limited to this example. The display portion 8042 may be provided on a rear surface of the portable information terminal 8040. Further, the portable information terminal 8040 may be a foldable portable information terminal in which two or more display portions are provided.

A touch panel with which data can be input by an instruction means such as a finger or a stylus is provided as an input means on the display portion 8042. Therefore, icons 8044 displayed on the display portion 8042 can be easily operated by the instruction means. Since the touch panel is provided, a region for a keyboard on the portable information terminal 8040 is not needed and thus the display portion can be provided in a large region. Further, since data can be input with a finger or a stylus, a user-friendly interface can be obtained. Although the touch panel may be of any of various types such as a resistive type, a capacitive type, an infrared ray type, an electromagnetic induction type, and a surface acoustic wave type, the resistive type or the capacitive type is particularly preferable because the display portion 8042 according to the present invention can be curved. Furthermore, such a touch panel may be what is called an in-cell touch panel, in which a touch panel is integral with the display module or the display panel.

The touch panel may also function as an image sensor. In this case, for example, an image of a palm print, a fingerprint, or the like is taken with the display portion 8042 touched with the palm or the finger, whereby personal authentication can be performed. Furthermore, with the use of backlight or a sensing light source emitting near-infrared light for the display portion 8042, an image of a finger vein, a palm vein, or the like can also be taken.

Further, instead of the touch panel, a keyboard may be provided in the display portion 8042. Furthermore, both the touch panel and the keyboard may be provided.

The button 8043 for operation can have various functions in accordance with the intended use. For example, the button 8043 may be used as a home button so that a home screen is displayed on the display portion 8042 by pressing the button 8043. Further, the portable information terminal 8040 may be configured such that main power supply thereof is turned off with a press of the button 8043 for a predetermined time. A structure may also be employed in which a press of the button 8043 brings the portable information terminal 8040 out of a sleep mode. Besides, the button can be used as a switch for starting a variety of functions, for example, depending on the length of time for pressing or by pressing the button together with another button.

Further, the button 8043 may be used as a volume control button or a mute button to have a function of adjusting the volume of the speaker 8047 for outputting sound, for example. The speaker 8047 outputs various kinds of sound, examples of which are sound set for predetermined processing, such as startup sound of an operating system (OS), sound from sound files executed in various applications, such as music from music reproduction application software, and an incoming e-mail alert. Although not illustrated, a connector for outputting sound to a device such as headphones, earphones, or a headset may be provided together with or instead of the speaker 8047 for outputting sound.

As described above, the button 8043 can have various functions. Although the number of the button 8043 is two in the portable information terminal 8040 in FIG. 21A, it is needless to say that the number, arrangement, position, or the like of the buttons is not limited to this example and can be designed as appropriate.

The microphone 8046 can be used for sound input and recording. Images obtained with the use of the camera lens 8045 can be displayed on the display portion 8042.

In addition to the operation with the touch panel provided on the display portion 8042 or the button 8043, the portable information terminal 8040 can be operated by recognition of user's movement (gesture) (also referred to as gesture input) using the camera lens 8045, a sensor provided in the portable information terminal 8040, or the like. Alternatively, with the use of the microphone 8046, the portable information terminal 8040 can be operated by recognition of user's voice (also referred to as voice input). By introducing a natural user interface (NUI) technique which enables data to be input to an electrical appliance by natural behavior of a human, the operational performance of the portable information terminal 8040 can be further improved.

The connection terminal 8048 is a terminal for inputting a signal at the time of communication with an external device or inputting electric power at the time of power supply. For example, the connection terminal 8048 can be used for connecting an external memory drive to the portable information terminal 8040. Examples of the external memory drive are storage medium drives such as an external hard disk drive (HDD), a flash memory drive, a digital versatile disk (DVD) drive, a DVD-recordable (DVD-R) drive, a DVD-rewritable (DVD-RW) drive, a compact disc (CD) drive, a compact disc recordable (CD-R) drive, a compact disc rewritable (CD-RW) drive, a magneto-optical (MO) disc drive, a floppy disk drive (FDD), and other nonvolatile solid state drive (SSD) devices. Although the portable information terminal 8040 has the touch panel on the display portion 8042, a keyboard may be provided on the housing 8041 instead of the touch panel or may be externally added.

Although the number of the connection terminal 8048 is one in the portable information terminal 8040 in FIG. 21A, it is needless to say that the number, arrangement, position, or the like of the connection terminals is not limited to this example and can be designed as appropriate.

Figure 21B:
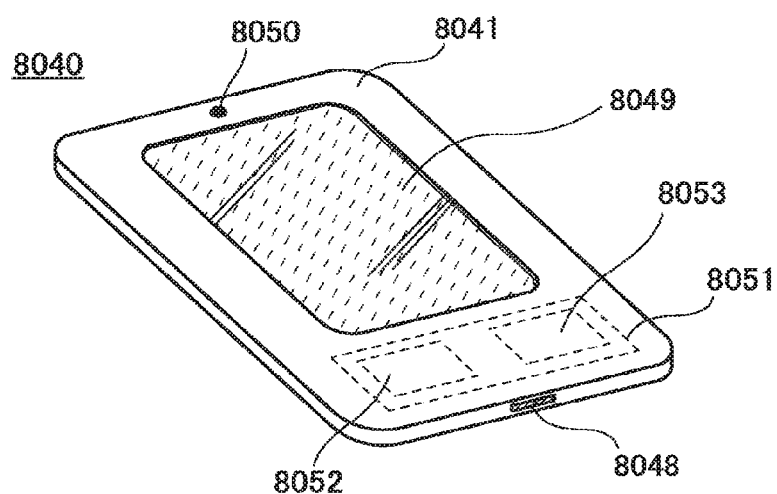

FIG. 21B is a perspective view illustrating the rear surface and the side surface of the portable information terminal 8040. In the portable information terminal 8040, the housing 8041 includes a solar cell 8049 and a camera lens 8050 on its rear surface; the portable information terminal 8040 further includes a charge and discharge control circuit 8051, a power storage device 8052, a DC-DC converter 8053, and the like. FIG. 21B illustrates an example where the charge and discharge control circuit 8051 includes the power storage device 8052 and the DC-DC converter 8053. The power storage device of one embodiment of the present invention, which is described in the above embodiment, is used as the power storage device 8052.

The solar cell 8049 attached on the rear surface of the portable information terminal 8040 can supply power to the display portion, the touch panel, a video signal processor, and the like. Note that the solar cell 8049 can be provided on one or both surfaces of the housing 8041. By including the solar cell 8049 in the portable information terminal 8040, the power storage device 8052 in the portable information terminal 8040 can be charged even in a place where an electric power supply unit is not provided, such as outdoors.

As the solar cell 8049, it is possible to use any of the following: a silicon-based solar cell including a single layer or a stacked layer of single crystal silicon, polycrystalline silicon, microcrystalline silicon, or amorphous silicon; an InGaAs-based, GaAs-based, CIS-based, $Cu_2ZnSnS_4$-based, or CdTe—CdS-based solar cell; a dye-sensitized solar cell including an organic dye; an organic thin film solar cell including a conductive polymer, fullerene, or the like; a quantum dot solar cell having a pin structure in which a quantum dot structure is formed in an i-layer with silicon or the like; and the like.

Here, an example of a structure and operation of the charge and discharge control circuit 8051 illustrated in FIG. 21B is described with reference to a block diagram in FIG. 21C.

Figure 21C:
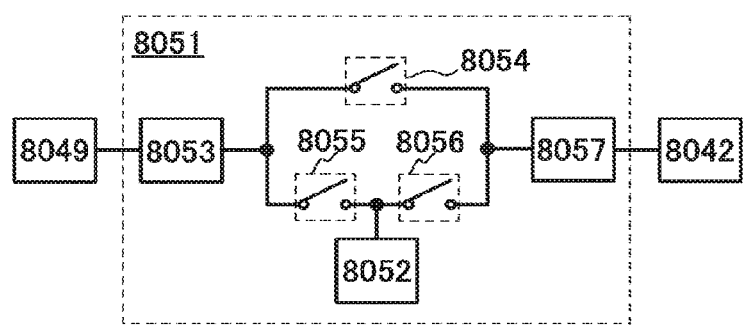

FIG. 21C illustrates the solar cell 8049, the power storage device 8052, the DC-DC converter 8053, a converter 8057, a switch 8054, a switch 8055, a switch 8056, and the display portion 8042. The power storage device 8052, the DC-DC converter 8053, the converter 8057, and the switches 8054 to 8056 correspond to the charge and discharge control circuit 8051 in FIG. 21B.

The voltage of electric power generated by the solar cell 8049 with the use of external light is raised or lowered by the DC-DC converter 8053 to be at a level needed for charging the power storage device 8052. When electric power from the solar cell 8049 is used for the operation of the display portion 8042, the switch 8054 is turned on and the voltage of the electric power is raised or lowered by the converter 8057 to a voltage needed for operating the display portion 8042. In addition, when display on the display portion 8042 is not performed, the switch 8054 is turned off and the switch 8055 is turned on so that the power storage device 8052 may be charged.

Although the solar cell 8049 is described as an example of a power generation means, the power generation means is not particularly limited thereto, and the power storage device 8052 may be charged by another power generation means such as a piezoelectric element or a thermoelectric conversion element (Peltier element). The charging method of the power storage device 8052 in the portable information terminal 8040 is not limited thereto, and the connection terminal 8048 may be connected to a power supply to perform charge, for example. The power storage device 8052 may be charged by a non-contact power transmission module performing charge by transmitting and receiving electric power wirelessly, or any of the above charging methods may be used in combination.

Here, the state of charge (SOC) of the power storage device 8052 is displayed on the upper left corner (in the dashed frame in FIG. 21A) of the display portion 8042. Thus, the user can check the state of charge of the power storage device 8052 and can accordingly select a power saving mode of the portable information terminal 8040. When the user selects the power saving mode, for example, the button 8043 or the icons 8044 can be operated to switch the components of the portable information terminal 8040, e.g., the display module or the display panel, an arithmetic unit such as CPU, and a memory, to the power saving mode. Specifically, in each of the components, the use frequency of a given function is decreased to stop the use. Further, the portable information terminal 8040 can be configured to be automatically switched to the power saving mode depending on the state of charge. Furthermore, by providing a sensor such as an optical sensor in the portable information terminal 8040, the amount of external light at the time of using the portable information terminal 8040 is sensed to optimize display luminance, which makes it possible to reduce the power consumption of the power storage device 8052.

In addition, when charging with the use of the solar cell 8049 or the like is performed, an image or the like showing that the charging is performed with the solar cell may be displayed on the upper left corner (in the dashed frame) of the display portion 8042 as illustrated in FIG. 21A.

It is needless to say that one embodiment of the present invention is not limited to the electrical appliance illustrated in FIGS. 21A to 21C as long as the power storage device of one embodiment of the present invention is included.

[7.6. Example of Electrical Appliance (Power Storage System)]

A power storage system will be described as an example of an electrical appliance, with reference to FIGS. 22A and 22B. A power storage system 8100 to be described here can be used at home as the above-described power storage system 8005. Here, the power storage system 8100 is described as a home-use power storage system as an example; however, it is not limited thereto and can also be used for business use or other uses.

Figure 22A:
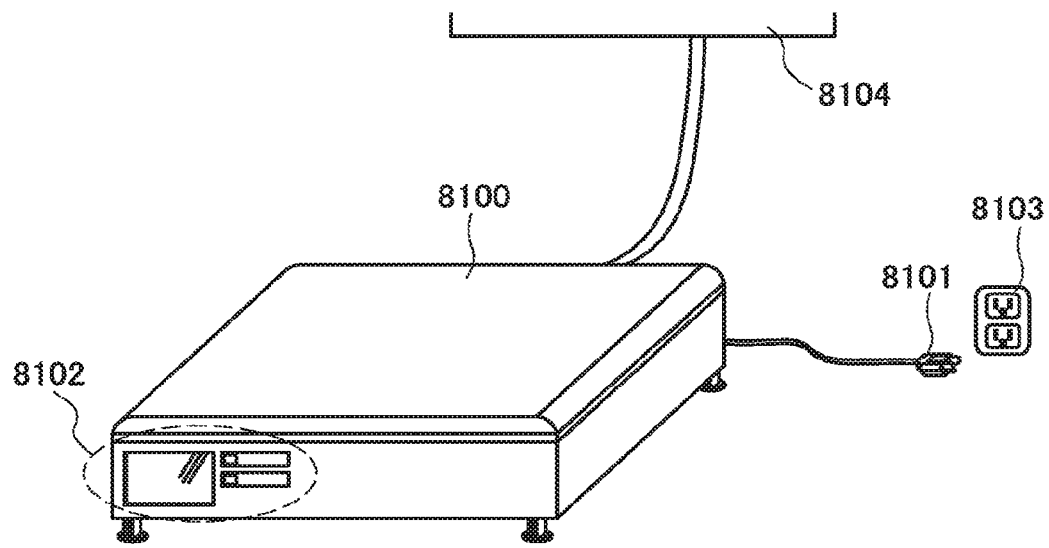
FIGS. 22A and 22B illustrate an electrical appliance.

As illustrated in FIG. 22A, the power storage system 8100 includes a plug 8101 for being electrically connected to a system power supply 8103. Further, the power storage system 8100 is electrically connected to a panelboard 8104 installed in home.

The power storage system 8100 may further include a display panel 8102 for displaying an operation state or the like. The display panel may have a touch screen. In addition, the power storage system 8100 may include a switch for turning on and off a main power supply, a switch to operate the power storage system, and the like as well as the display panel.

Although not illustrated, an operation switch to operate the power storage system 8100 may be provided separately from the power storage system 8100; for example, the operation switch may be provided on a wall in a room. Alternatively, the power storage system 8100 may be connected to a personal computer, a server, or the like provided in home, in order to be operated indirectly. Still alternatively, the power storage system 8100 may be remotely operated using the Internet, an information terminal such as a smartphone, or the like. In such cases, a mechanism that performs wired or wireless communication between the power storage system 8100 and other devices is provided in the power storage system 8100.

Figure 22B:
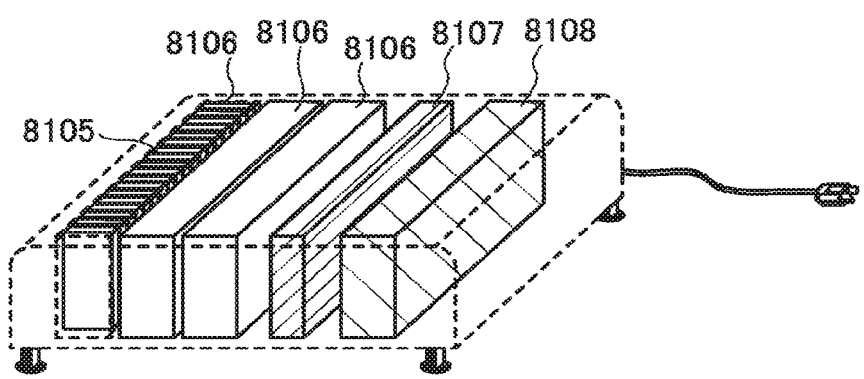

FIG. 22B is a schematic view illustrating the inside of the power storage system 8100. The power storage system 8100 includes a plurality of power storage device groups 8106, a battery management unit (BMU) 8107, and a power conditioning system (PCS) 8108.

In the power storage device group 8106, the plurality of power storage devices 8105 described above are connected to each other. Electric power from the system power supply 8103 can be stored in the power storage device group 8106. The plurality of power storage device groups 8106 are each electrically connected to the BMU 8107.

The BMU 8107 has functions of monitoring and controlling states of the plurality of power storage devices 8105 in the power storage device group 8106 and protecting the power storage devices 8105. Specifically, the BMU 8107 collects data of cell voltages and cell temperatures of the plurality of power storage devices 8105 in the power storage device group 8106, monitors overcharge and overdischarge, monitors overcurrent, controls a cell balancer, manages the deterioration condition of a battery, calculates the remaining battery level (the state of charge (SOC)), controls a cooling fan of a driving power storage device, or controls detection of failure, for example. Note that the power storage devices 8105 may have some of or all the functions, or the power storage device groups may have the functions. The BMU 8107 is electrically connected to the PCS 8108.

Here, as an electronic circuit included in the BMU 8107, an electronic circuit including the above-described transistor including an oxide semiconductor is preferably provided. In this case, power consumption of the BMU 8107 can be significantly reduced.

The PCS 8108 is electrically connected to the system power supply 8103, which is an AC power source and performs DC-AC conversion. For example, the PCS 8108 includes an inverter, a system interconnection protective device that detects irregularity of the system power supply 8103 and terminates its operation, and the like. In charging the power storage system 8100, for example, AC power from the system power supply 8103 is converted into DC power and transmitted to the BMU 8107. In discharging the power storage system 8100, electric power stored in the power storage device group 8106 is converted into AC power and supplied to an indoor load, for example. Note that the electric power may be supplied from the power storage system 8100 to the load through the panelboard 8104 as illustrated in FIG. 22A or may be directly supplied from the power storage system 8100 through wired or wireless transmission.

Note that a power supply for charging the power storage system 8100 is not limited to the system power supply 8103 described above; for example, power may be supplied from a solar power generating system installed outside or a power storage system mounted on an electric vehicle.

Example 1

In this example, a power storage device was fabricated using lithium iron phosphate (LiFePO$_4$) as an active material that exhibits two-phase reaction, and charge-discharge characteristics of the device were evaluated.

(Formation of Lithium Iron Phosphate)

LiFePO$_4$ whose surface is covered with a carbon layer was used for this power storage device. LiFePO$_4$ was formed by a solid-phase method. To prepare LiFePO$_4$ whose surface is covered with a carbon layer, raw materials Li$_2$CO$_3$, FeC$_2$O$_4$·2H$_2$O, and NH$_4$H$_2$PO$_4$ were weighed in a dry room (with a dew point of higher than or equal to −70° C. and lower than or equal to −55° C.) so as to satisfy a molar ratio of 2:1:1.

Next, the raw materials were mixed and crushed with a ball mill. Here, a planetary ball mill was used. With the use of a 500 ml zirconia pot and 300 g of zirconia balls with a diameter of 3 mm, the raw materials with a total weight of 150 g were subjected to ball milling at a rotation speed of 300 rpm for 2 hours. In the mixing and crushing, 250 ml acetone containing 0.0068% water (produced by KANTO CHEMICAL CO., INC.) was used as a solvent.

Next, drying was performed with a hot plate at 50° C. in a dry room for a period of longer than or equal to 1 hour and shorter than or equal to 2 hours. Then, with the use of a vacuum dryer, drying was performed in a vacuum of 0.1 MPa at 80° C. for 2 hours in the dry room.

Next, with the use of a muffle furnace, baking was performed at 350° C. for 10 hours. Here, the $N_2$ flow rate was 5 l/min.

Next, for the purpose of forming the carbon layer, glucose was weighed so as to be 10 wt % with respect to the baked sample, and the baked sample and the glucose were mixed and crushed with a ball mill. The apparatus and method used here were the same as those for the above mixing and crushing.

Next, drying was performed with a hot plate at 50° C. in the dry room for a period of longer than or equal to 1 hour and shorter than or equal to 2 hours. Then, with the use of a vacuum dryer, drying was performed in a vacuum of 0.1 MPa at 80° C. for 2 hours in the dry room.

Next, with the use of a muffle furnace, baking was performed at 600° C. for 10 hours.

Then, aggregates of particles of the active material were cracked with the ball mill in the dry room. This cracking step was performed in the same condition as the mixing and crushing of the raw materials except that the rotation speed was 200 rpm and treatment time was 30 minutes.

Next, drying was performed with a hot plate at 50° C. in the dry room for a period of longer than or equal to 1 hour and shorter than or equal to 2 hours.

Then, with the use of a vacuum dryer, drying was performed in a vacuum of 0.1 MPa at 175° C. for 2 hours in the dry room.

Through the above steps, $LiFePO_4$ whose surface is covered with a carbon layer was obtained. The diameter of a primary particle of the obtained $LiFePO_4$ was greater than or equal to 50 nm and less than or equal to 300 nm, and the diameter of a secondary particle thereof was 2 μm or less.

(Formation of Positive Electrode)

To form a positive electrode, first, $LiFePO_4$ whose surface is covered with a carbon layer and N-methylpyrrolidone (NMP) were stirred and mixed in a mixer at 2000 rpm for 3 minutes. Then, ultrasonic vibration was applied for 3 minutes and the mixture was stirred and mixed in a mixer at 2000 rpm for 1 minute. This step of ultrasonic vibration and stirring/mixing was repeated 5 times.

Next, graphene oxide was added to the mixture and stirring and mixing of the mixture in a mixer at 2000 rpm for 2 minutes were performed 8 times. After that, PVDF (produced by KUREHA CORPORATION) was added as a binder and the mixture was stirred and mixed in a mixer at 2000 rpm for 2 minutes once. Moreover, NMP was added, and the mixture was stirred and mixed at 2000 rpm for 2 minutes. This step was repeated until the viscosity of the sample became suitable for application.

Note that the compounding ratio of $LiFePO_4$ covered with a carbon layer to graphene oxide and PVDF was 91.4:0.6:8 (wt %).

Here, graphene oxide was formed by a Hummers method. Graphite was mixed with $KMO_4$ and a sulfuric acid to be oxidized. The obtained graphite oxide was cleaned with a hydrochloric acid and then dispersed in water, and part of the graphite oxide was separated with an ultrasonic cleaning machine. Then, a hydrochloric acid was removed, and moisture was removed with an evaporator and ethanol under a reduced pressure. Moreover, the obtained sample was crushed with a dancing mill and dried. Through these steps, graphene oxide was formed.

Through the above steps, slurry was formed. Then, the slurry was applied over a 20-μm-thick aluminum foil with an applicator. Here, the distance between an applicator member of the applicator and a surface where the slurry was applied was 230 μm and the application rate was 10 mm/sec.

The above sample was dried in hot air at 80° C. for 40 minutes, and then pressed with a roller press machine. Moreover, the sample was heated at 170° C. in a reduced pressure atmosphere for 10 hours and pressed again. The obtained electrode was stamped out, whereby the positive electrode was formed.

Note that the temperature of the roller of the press machine was 120° C., and pressing was performed under conditions such that the thickness of the positive electrode was reduced by 20%. In the positive electrode, the thickness of an active material layer was 58 μm, the electrode density was 1.82 g/cm$^3$, the $LiFePO_4$ content was about 9.7 mg/cm$^2$, and the single-electrode theoretical capacity was about 1.6 mAh/cm$^2$.

(Formation of Negative Electrode)

A negative electrode was formed as follows. MCMB particles whose surfaces are covered with silicon oxide layers, NMP, and PVDF (produced by KUREHA CORPORATION) were stirred and mixed in a mixer at 2000 rpm for 5 minutes. Note that the weight ratio of PVDF to MCMB was 10 wt % (weight percent).

Moreover, NMP was added and the mixture was stirred and mixed at 2000 rpm for 5 minutes. This step was repeated until the viscosity of the sample became suitable for application.

Through the above steps, slurry was formed. Then, the slurry was applied over a 18-μm-thick copper foil with an applicator. Here, the distance between an applicator member of the applicator and a surface where the slurry was applied was 230 μm and the application rate was 10 mm/sec.

This sample was dried in hot air at 70° C. for 40 minutes, and then pressed with a roller press machine. Moreover, the sample was heated at 170° C. in a reduced pressure atmosphere for 10 hours and pressed again. The obtained electrode was stamped out, whereby the negative electrode was formed. Note that the temperature of the roller of the press machine was 120° C., and pressing was performed under conditions such that the thickness of the positive electrode was reduced by 20%. In the negative electrode, the thickness of an active material layer was 89 μm, the electrode density was 1.42 g/cm$^3$, the MCMB content was about 11.4 mg/cm$^2$, and the single-electrode theoretical capacity was about 4.2 mAh/cm$^2$.

The MCMB covered with a silicon oxide layer was formed by a sol-gel method in the following manner. Silicon ethoxide, a hydrochloric acid, and toluene were mixed and stirred to give a $Si(OEt)_4$ toluene solution. At this time, the amount of silicon ethoxide was determined so that silicon oxide formed later was 1 wt % (weight percent) with respect to MCMB. The compounding ratio of this solution was as follows: $Si(OEt)_4$ was 3.14×10$^{-4}$ mol; the IN hydrochloric acid, 2.91×10$^{-4}$ mol; and toluene, 2 ml.

Next, MCMB with an average grain size of 9 μm was added to the $Si(OEt)_4$ toluene solution and the mixture was stirred in the dry room. After that, the obtained solution was kept at 70° C. for 3 hours in a humid environment.

Next, baking was performed with a muffle furnace at 500° C. in a nitrogen atmosphere for 3 hours. Then, aggregates of particles of the active material were cracked with a mortar, whereby the MCMB covered with a silicon oxide layer was formed.

(Cell for Evaluation)

A CR2032 coin-type cell (with a diameter of 20 mm and a height of 3.2 mm) was fabricated with the use of the positive electrode and negative electrode formed in the above-described manner. Here, 25-μm-thick polypropylene was used as a separator. An electrolyte solution formed in such a manner that lithium hexafluorophosphate ($LiPF_6$) was dissolved at a concentration of 1 mol/L in a solution in which ethylene carbonate (EC) and diethyl carbonate (DEC) were mixed at a volume ratio of 3:7 was used as an electrolyte solution.

For the evaluation of the charge-discharge capacity of the fabricated coin-type cell, a charge-discharge test was performed with a galvanostatic charge and discharge apparatus (TOSCAT-3100 manufactured by TOYO SYSTEM CO., LTD) under the following conditions: environmental temperature of 25° C., charge-discharge rate of 0.2 C (34 mA/g), the upper limit voltage of 4.0 V, and the lower limit voltage of 2.0 V.

The results of the charge-discharge test are shown in FIG. 23, where the horizontal axis represents capacity (mAh/g) and the vertical axis represents voltage (V). The charge capacity and the discharge capacity were both over 120 mAh/g. Further, as is apparent from the charge-discharge results of FIG. 23, a power storage device using lithium iron phosphate as a positive electrode active material exhibits charge characteristics having a flat region (plateau region) in its charge curve and an abrupt voltage change at the end of charging.

Example 2

In this example, variations in the current value when applying high voltage to a power storage device using lithium iron phosphate ($LiFePO_4$) that exhibits two-phase reaction as a positive electrode active material were measured.

A CR2032 coin-type cell (with a diameter of 20 mm and a height of 3.2 mm) was fabricated and used for measurement. A positive electrode with a compounding ratio (wt %) of lithium iron phosphate covered with a carbon layer to acetylene black and PVDF of 85:8:7 was used. The thickness of an active material layer was 75 m, the $LiFePO_4$ content was 9.8 mg/cm², and the single-electrode theoretical capacity was 1.67 mAh/cm². A negative electrode with a compounding ratio (wt %) of graphite to acetylene black and PVDF of 93:2:5 was used. The thickness of an active material layer was 120 μm, the graphite content was 12 mg/cm², and the single-electrode theoretical capacity was 4.46 mAh/cm².

As a separator, 25-μm-thick polypropylene was used. An electrolyte solution formed in such a manner that lithium hexafluorophosphate ($LiPF_6$) was dissolved at a concentration of 1 mol/L in a solution in which ethylene carbonate (EC) and diethyl carbonate (DEC) were mixed at a volume ratio of 1:1 was used as an electrolyte solution. Measurement was performed at 60° C.

Figure 24A:
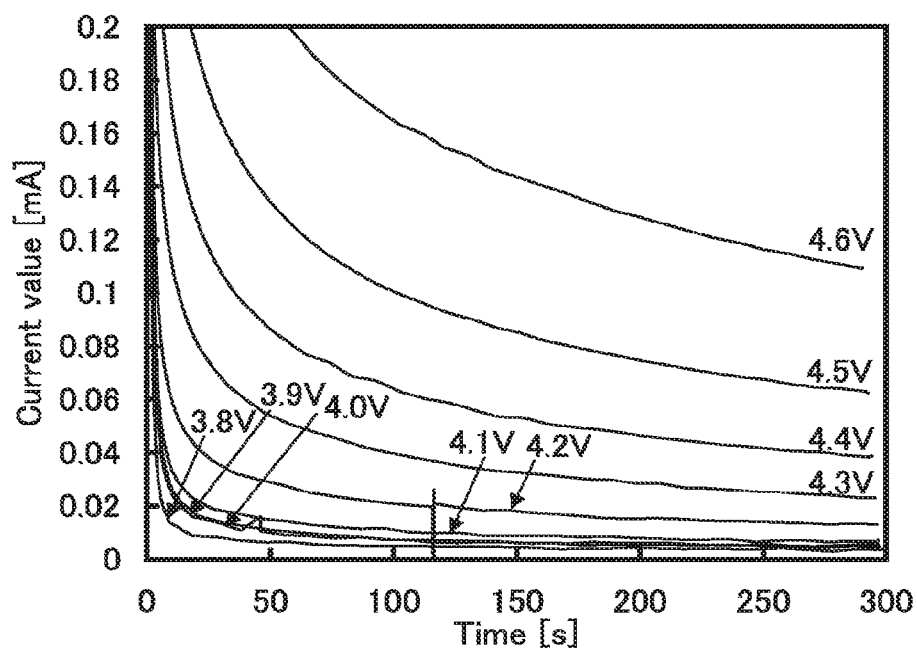
FIGS. 24A and 24B show variations in the current value by application of high voltages.

The above-described sample and measurement conditions were employed for the evaluation. The voltage dependence of the current value in constant voltage (CV) charging after constant current (CC) charging is shown in FIG. 24A, where the horizontal axis represents time (sec) and the vertical axis represents current value (mA).

At relatively low voltages of 3.8 V, 3.9 V, and 4.0 V in CV charging, the value of current flowing at the time of CV charging is lower than 0.01 mA. In contrast, at relatively high constant voltages of 4.1 V or higher, the current value is increased. At 4.6 V, the current value is as high as about 0.12 mA. Thus, the tendency for the current value to increase in accordance with a voltage increase is observed.

Figure 24B:
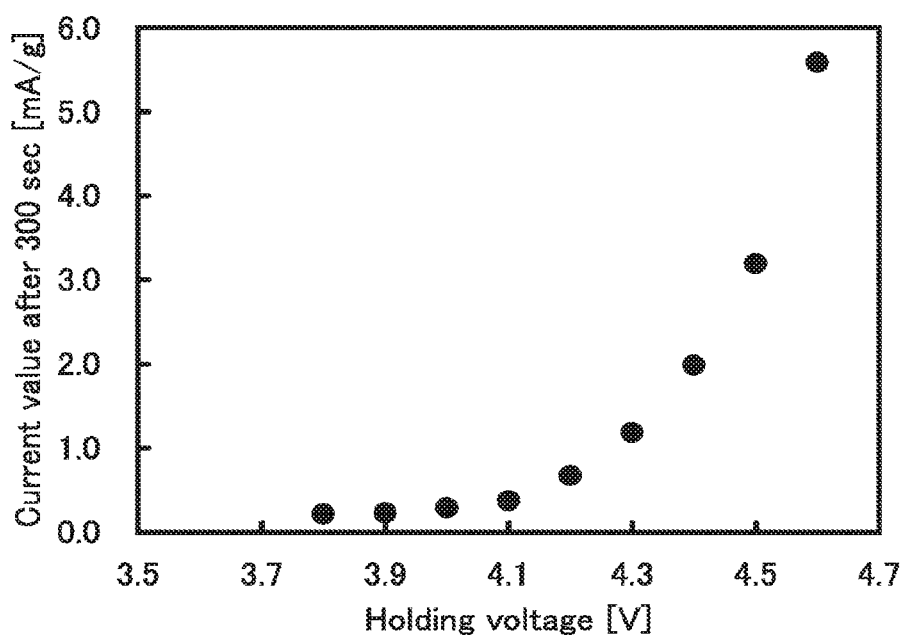

FIG. 24B shows the relation between the holding voltage (constant voltage) and the current value (mA/g) after 300 sec when the current value becomes almost stable. At voltages below about 4.0 V, the current flowing through the cell is small, and when the voltage is raised, the value of current flowing through the cell increases exponentially. From the fact that the current value has voltage dependence, the increase in the current value is presumably owing to the electrochemical reaction in the cell.

The above results show that application of high constant voltage to a battery after normal CCCV charging allows current flow to the battery for additional charging. For example, in the case of using lithium iron phosphate as a positive electrode active material, a constant voltage of 4.0 V or lower is enough for normal CCCV charging, but by performing additional charging at a high voltage of 4.6 V, for example, further charging is possible.

This application is based on Japanese Patent Application serial no. 2012-288565 filed with Japan Patent Office on Dec. 28, 2012, the entire contents of which are hereby incorporated by reference.

What is claimed is:

1. A charging method of a power storage unit, comprising the steps of:
    performing first charging with a first voltage;
        measuring a capacity of the power storage unit after the step of performing the first charging;
        comparing the capacity with a value stored in a memory; and
    performing second charging with a second voltage after the step of comparing the capacity with the value,
        wherein the second voltage is higher than the first voltage, and
        wherein the second charging is performed until a resistance of the power storage unit reaches a predetermined resistance.

2. The charging method according to claim 1, wherein the value is a value of a capacity before shipping of the power storage unit.

3. The charging method according to claim 1, wherein the second charging causes decomposition of an electrolyte solution in the power storage unit.

4. The charging method according to claim 1,
    wherein the first charging does not cause decomposition of an electrolyte solution in the power storage unit, and
    wherein the second charging causes decomposition of the electrolyte solution in the power storage unit.

5. The charging method according to claim 1, wherein the power storage unit comprises an active material that exhibits two-phase reaction.

6. The charging method according to claim 1, further comprising a step of performing constant current charging before the step of performing the first charging.

7. The charging method according to claim 1, wherein a positive electrode in the power storage unit comprises graphene.

8. The charging method according to claim 7, wherein the graphene is multilayer graphene with an interlayer distance of greater than or equal to 0.34 nm and less than or equal to 0.5 nm.

9. The charging method according to claim 1, wherein the memory comprises a transistor comprising an oxide semiconductor film in a channel formation region.

* * * * *